United States Patent
Baer et al.

(10) Patent No.: US 10,684,551 B2
(45) Date of Patent: Jun. 16, 2020

(54) EUV EXPOSURE APPARATUS WITH REFLECTIVE ELEMENTS HAVING REDUCED INFLUENCE OF TEMPERATURE VARIATION

(71) Applicants: Carl Zeiss SMT GmbH, Oberkochen (DE); ASML Netherlands B.V., Veldhoven (NL)

(72) Inventors: Norman Baer, Aalen (DE); Ulrich Loering, Schwaebisch Gmuend (DE); Oliver Natt, Aalen (DE); Gero Wittich, Aalen (DE); Timo Laufer, Stuttgart (DE); Peter Kuerz, Aalen (DE); Guido Limbach, Aalen (DE); Stefan Hembacher, Bobingen (DE); Holger Walter, Abtsgmuend (DE); Yim-Bun-Patrick Kwan, Aalen (DE); Markus Hauf, Ulm (DE); Franz-Josef Stickel, Aalen (DE); Jan Van Schoot, Eindhoven (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/392,220

(22) Filed: Apr. 23, 2019

(65) Prior Publication Data

US 2019/0310555 A1 Oct. 10, 2019

Related U.S. Application Data

(63) Continuation of application No. 16/013,687, filed on Jun. 20, 2018, now Pat. No. 10,317,802, which is a (Continued)

(51) Int. Cl.
*G03F 7/20* (2006.01)
*G02B 5/08* (2006.01)
(Continued)

(52) U.S. Cl.
CPC ............ *G03F 7/7015* (2013.01); *B82Y 10/00* (2013.01); *G02B 5/00* (2013.01); *G02B 5/0816* (2013.01);
(Continued)

(58) Field of Classification Search
None
See application file for complete search history.

(56) References Cited

U.S. PATENT DOCUMENTS 6,964,485 B2 11/2005 Singer et al.
6,994,444 B2 2/2006 del Puerto
(Continued)

FOREIGN PATENT DOCUMENTS

DE 221 563 A1 4/1985
DE 103 17 662 A1 11/2004
(Continued)

OTHER PUBLICATIONS

International Search Report dated Nov. 10, 2011 of international application PCT/EP2011/062996 on which this application is based.
(Continued)

*Primary Examiner* — Michelle M Iacoletti
(74) *Attorney, Agent, or Firm* — Walter Ottesen, P.A.

(57) ABSTRACT

A projection lens of an EUV-lithographic projection exposure system with at least two reflective optical elements each comprising a body and a reflective surface for projecting an object field on a reticle onto an image field on a substrate if the projection lens is exposed with an exposure power of EUV light, wherein the bodies of at least two reflective optical elements comprise a material with a temperature
(Continued)

dependent coefficient of thermal expansion which is zero at respective zero cross temperatures, and wherein the absolute value of the difference between the zero cross temperatures is more than 6K.

9 Claims, 19 Drawing Sheets

Related U.S. Application Data continuation of application No. 15/650,533, filed on Jul. 14, 2017, now Pat. No. 10,031,423, which is a continuation of application No. 15/070,872, filed on Mar. 15, 2016, now Pat. No. 9,746,778, which is a continuation of application No. 13/754,720, filed on Jan. 30, 2013, now Pat. No. 9,316,929, which is a continuation of application No. PCT/EP2011/062995, filed on Jul. 28, 2011, and a continuation of application No. PCT/EP2011/062996, filed on Jul. 28, 2011, and a continuation of application No. PCT/EP2011/062997, filed on Jul. 28, 2011, and a continuation of application No. PCT/EP2011/063002, filed on Jul. 28, 2011.

(60) Provisional application No. 61/369,142, filed on Jul. 30, 2010.

(51) Int. Cl.
    G02B 7/18        (2006.01)
    G02B 27/00       (2006.01)
    G03B 27/54       (2006.01)
    G02B 5/00        (2006.01)
    B82Y 10/00       (2011.01)
    G02B 17/06       (2006.01)
    G21K 1/06        (2006.01)
    G02B 3/00        (2006.01)

(52) U.S. Cl.
    CPC ......... *G02B 5/0891* (2013.01); *G02B 7/1815* (2013.01); *G02B 17/0647* (2013.01); *G02B 27/0043* (2013.01); *G03B 27/542* (2013.01); *G03F 7/702* (2013.01); *G03F 7/70233* (2013.01); *G03F 7/70316* (2013.01); *G03F 7/70825* (2013.01); *G03F 7/70891* (2013.01); *G03F 7/70958* (2013.01); *G21K 1/062* (2013.01); *G02B 3/00* (2013.01); *G02B 5/08* (2013.01); *G21K 2201/061* (2013.01); *G21K 2201/064* (2013.01)

(56) References Cited

U.S. PATENT DOCUMENTS

| | | | |
|---|---|---|---|
| 7,015,489 B2 | 3/2006 | Singer et al. | |
| 7,106,413 B2* | 9/2006 | Hara | G03B 27/52 355/30 |
| 7,116,399 B2 | 10/2006 | Box et al. | |
| 7,163,301 B2 | 1/2007 | del Puerto | |
| 7,244,954 B2 | 7/2007 | Singer et al. | |
| 7,295,284 B2 | 11/2007 | Suzuki | |
| 7,460,212 B2 | 12/2008 | Singer et al. | |
| 8,179,621 B2 | 5/2012 | Muehlbeyer et al. | |
| 8,325,322 B2 | 12/2012 | Hauf et al. | |
| 9,316,929 B2 | 4/2016 | Baer et al. | |
| 2001/0019403 A1 | 9/2001 | Schuster et al. | |
| 2003/0125184 A1 | 7/2003 | Mitra | |
| 2004/0130809 A1 | 7/2004 | Antoni et al. | |
| 2004/0165161 A1 | 8/2004 | Hara | |
| 2004/0179192 A1 | 9/2004 | Mizuno et al. | |
| 2004/0218160 A1 | 11/2004 | Hara | |
| 2005/0074552 A1 | 4/2005 | Ge et al. | |
| 2005/0190347 A1 | 9/2005 | Suzuki | |
| 2005/0207001 A1 | 9/2005 | Laufer et al. | |
| 2006/0033898 A1 | 2/2006 | Cadee et al. | |
| 2006/0092533 A1 | 5/2006 | Sogard | |
| 2007/0035814 A1 | 2/2007 | Dinger et al. | |
| 2007/0052301 A1 | 3/2007 | Muehlbeyer et al. | |
| 2009/0050776 A1 | 2/2009 | Muehlbeyer et al. | |
| 2009/0122428 A1 | 5/2009 | Phillips et al. | |
| 2009/0143213 A1 | 6/2009 | Hrdina et al. | |
| 2009/0159808 A1 | 6/2009 | Bowering et al. | |
| 2010/0055623 A1 | 3/2010 | Namba | |
| 2010/0304283 A1 | 12/2010 | Hayashi et al. | |
| 2011/0170078 A1 | 7/2011 | Loopstra et al. | |
| 2011/0181850 A1 | 7/2011 | Bach et al. | |
| 2013/0120863 A1 | 5/2013 | Kaller et al. | |

FOREIGN PATENT DOCUMENTS

| | | |
|---|---|---|
| EP | 0532236 A1 | 3/1993 |
| EP | 1477 855 A1 | 11/2004 |
| EP | 1 533 832 A1 | 5/2005 |
| JP | 2005-64391 A | 3/2005 |
| JP | 2005244012 A | 9/2005 |
| WO | 2004/015477 A1 | 2/2004 |
| WO | 2004/034447 A1 | 4/2004 |
| WO | 2010/028748 A1 | 3/2010 |

OTHER PUBLICATIONS

International Search Report dated Nov. 30, 2011 of international application PCT/EP2011/063002 on which this application is based.
International Search Report dated Nov. 10, 2011 of international application PCT/EP2011/062997 on which this application is based.
International Search Report dated Nov. 10, 2011 of international application PCT/EP2011/062995 on which this application is based.
Hrdina, K.E. et al, "Measuring and tailoring CTE within ULE glass", http://proceedings.spiedigitallibrary.org/article.aspx?articleid=758951, printed Dec. 18, 2012, abstract pp. 1 and 2.
Jacobs, S.F., "Variable invariables—dimensional instability with time and temperature", Critical Review vol. CR43, Optomechanical Design, ed. P.R. Yoder, Jr. (Jul. 1992), copyright SPIE, pp. 181 to 204.
Mitra, I. et al, "Improved materials meeting the demands for EUV substrates", from Conference vol. 5037, Emerging Lithographic Technologies VII, Feb. 23, 2003, http://proceedings.spiedigitallibrary.org/proceeding.aspx? articleid=1316805, printed Dec. 18, 2012, abstract pp. 1 and 2.
Wong, A.K., "Resolution Enhancement Techniques in Optical Lithography", http://ebooks.spiedigitallibrary.org/book.aspx?bookid=173, published 2001, printed Dec. 18, 2012, abstract.
English translation of the first Office action and search report of the Chinese Patent Office dated Nov. 21, 2014 in corresponding Chinese patent application CN201180037433.9.
English translation of the Office action of the Taiwanese Patent Office dated Dec. 12, 2014 in corresponding Taiwanese patent application TW100126927.
English translation of the first Office action of the Japanese Patent Office dated May 26, 2015 in corresponding Japanese patent application 2013-521147.
English translation and Office action of the Korean Patent Office dated Dec. 18, 2017 in corresponding Korean patent application 10-2013-7002566.
English translation of the Office action of the Korean Patent Office action dated Nov. 27, 2018 in corresponding Korean application 10-2018-7024647.

* cited by examiner

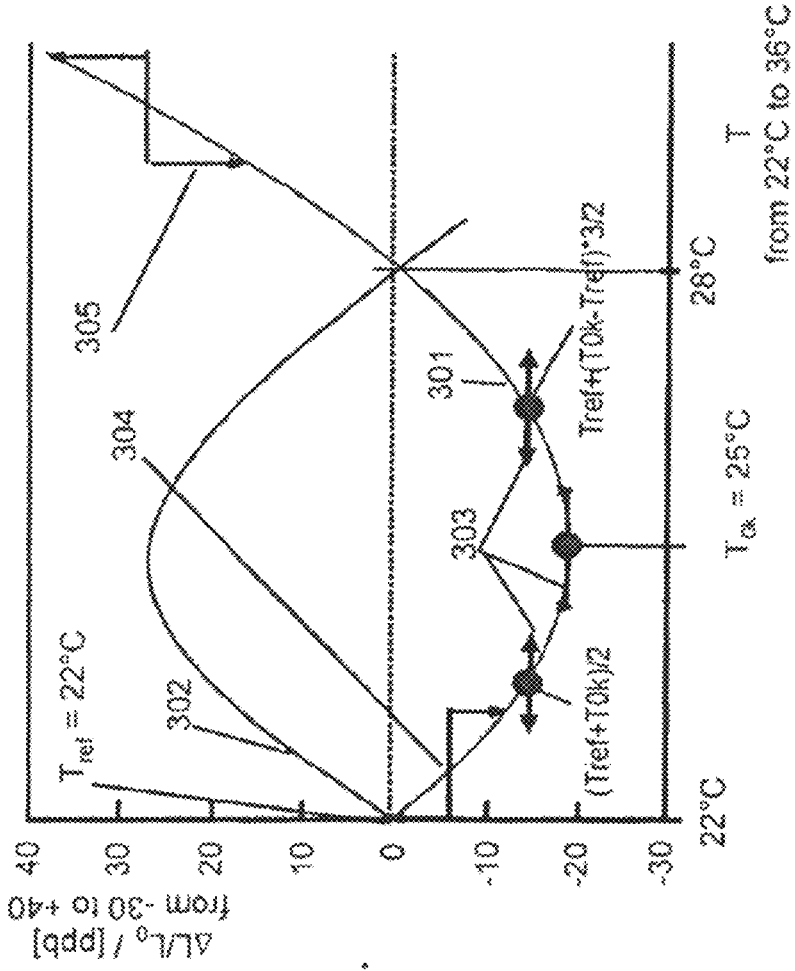
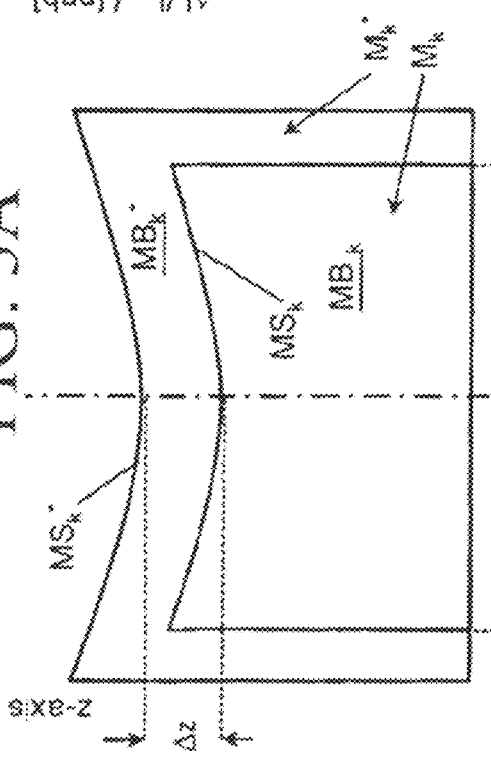
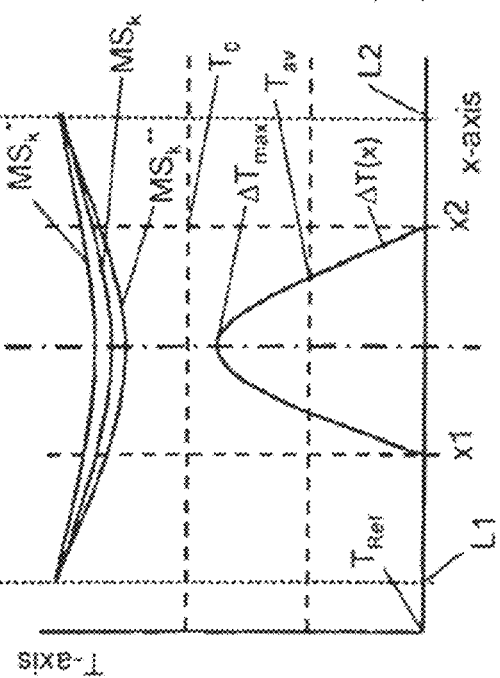
FIG. 3A
FIG. 3B
FIG. 3C

EUV EXPOSURE APPARATUS WITH REFLECTIVE ELEMENTS HAVING REDUCED INFLUENCE OF TEMPERATURE VARIATION

CROSS REFERENCE TO RELATED APPLICATIONS

This application is a continuation application of application Ser. No. 16/013,687, filed Jun. 20, 2018, which, in turn, is a continuation application of application Ser. No. 15/650,533, filed Jul. 14, 2017, now U.S. Pat. No. 10,031,423, issued Jul. 24, 2018, which, in turn, is a continuation application of application Ser. No. 15/070,872, filed Mar. 15, 2016, now U.S. Pat. No. 9,746,778, issued Aug. 29, 2017, which, in turn, is a continuation application of application Ser. No. 13/754,720, filed on Jan. 30, 2013, now U.S. Pat. 9,316,929, issued Apr. 19, 2016, which, in turn, is a continuation application of international patent applications PCT/EP2011/062996, PCT/EP2011/063002, PCT/EP2011/062997 and PCT/EP2011/062995, all filed Jul. 28, 2011, designating the United States and claiming priority from U.S. provisional application Ser. No. 61/369,142, filed Jul. 30, 2010, and the entire content of the above applications is incorporated herein by reference.

FIELD OF THE INVENTION

The present invention relates to a reflective optical element for reflecting light in a wavelength range less than 50 nm in an EUV-lithographic projection exposure system. Further, it relates to an EUV projection lens of an EUV-lithographic projection exposure system and to a method to configure an EUV projection lens.

BACKGROUND OF THE INVENTION

To reduce the size of micro-structured devices like semiconductor circuits (e.g. integrated, analogue, digital or memory circuits, thin-film magnetic heads) with the technique of optical lithography the optical resolution limit of optical microlithographic projection exposure systems must be further improved. Due to diffraction, the resolution limit in a first order approximation is inverse proportional to the numerical aperture of the projection lens of the microlithographic projection exposure system, with which structures are projected from a mask onto a substrate by a projection beam, to form the micro-structured devices there, e.g., by exposure of a light sensitive resist (which covers the substrate) with at least parts of the projection beam. For this reason, one focus is to increase the numerical aperture of the projection lens. Another focus is to reduce the used wavelength for the projection process, since the optical resolution limit is also proportional to this wavelength. For this reason the historical development of optical lithography systems was such that the wavelength of the used light in the projection process was reduced from visible light to ultraviolet light and now to Very Deep Ultra Violet light (VUV light, like 193 nm which is produced e.g. by an advanced ArF excimer laser). Now VUV lithography is broadly used in mass production of semiconductor circuits. Today, mass production of high integrated circuits is mostly done on microlithographic projection exposure systems with a projection light of the mentioned wavelength of 193 nm, whereas the numerical aperture NA of the projection system which projects the structures on a mask (or structured object) onto a substrate, is much more than 1.0, even more than 1.3. Such high numerical apertures only can be achieved by the use of immersion systems. The principles of such systems are already described e.g. in DD 221563 A1 or in US 2006092533 A1.

For an onward reduction of the size of the micro-structured devices, a further reduction of the wavelength of the projection light is necessary. Since in the very deep ultraviolet wavelength range almost all optical materials become opaque, there are no suitable materials for optical lenses for wavelength below about 157 nm. Using even shorter wavelengths for the projection light, the projection lenses can only work with reflective optical elements like mirrors or like diffractive optical elements. During the last years, enormous efforts were done to develop optical microlithographic projection exposure systems, which use for the projection process wavelengths less than 50 nm. Systems working with a projection wavelength between 10 nm and 14 nm are described e.g. in EP 1533832 A1 or in US 20040179192 A1. Depending on the light sources which are available for the projection light of such short wavelengths, the wavelengths for the projection light may be even 5 nm or less. At such short wavelengths of less than 50 nm or even much shorter, the projection lenses of the optical microlithographic projection exposure systems comprise only reflective optical elements like mirrors and/or diffractive structures like reflective diffractive structures. Projection systems which are working at a wavelength of less than about 50 nm are known as EUV (Extreme Ultra Violet) lithographic projection exposure systems.

A simplified EUV lithographic projection exposure system 100 is schematically shown in FIG. 1. The system comprises an EUV light source 1, producing EUV light with a significant energy density in the extreme ultraviolet or EUV spectral region, especially in the wavelength range less than 50 nm, preferably in a range between 5 nm and 15 nm. Discharged-produced or laser-produced plasma light sources are used as EUV light sources, making use of e.g. xenon, tin or lithium plasma which generates the extreme ultraviolet light. Such sources irradiate unpolarized light under about 4 nm solid angle. Other sources generate a spatially more directed and a more polarized beam of extreme ultraviolet light like e.g. synchrotron radiation sources. Dependent on the EUV light source 1, especially if an EUV plasma light source is used, a collector mirror 2 may be used to collect the EUV light of the light source 1 to increase the energy density or irradiance of the EUV radiation and form an illumination beam 3. The illumination beam 3 illuminates via an illumination system 10 a structured object M. The structured object M is e.g. a reflective mask, comprising reflective and non-reflective or at least minor reflective regions to form at least one structure on it. Alternatively or additionally, the structured object comprises or consists of a plurality of mirrors which are arranged about side by side in at least one dimension to form a mirror arrangement like a mirror array. Advantageously the mirrors of the mirror array are adjustable around at least one axis to adjust the incidence angle of the illumination beam 3 which is irradiated on the respective mirror.

It shall be understood that the terms reflective, minor reflective and non-reflective relates to the reflectivity of EUV light of the illumination beam 3. Due to the very short wavelength of the EUV light, the reflective surfaces are usually coated if the angle of incidence for the EUV light is less than about 45°. The coatings preferably comprise a multilayer of predetermined layer materials with predetermined layer thicknesses. Such mirrors are usually used for incidence angles less or far less than 45° down to about 0°.

For such mirrors a reflectivity of more than 60% can be achieved due to a constructive interference of the reflected EUV light which is partially reflected at the various material boundaries of the individual layers of the multilayer. A further advantage of such multilayer-coated reflective mirrors or surfaces is their property to work as a spectral filter, to make e.g. an illumination and/or projection beam of the EUV lithographic projection system more monochromatic. In an EUV lithographic projection exposure system coated mirrors are sometimes also designated as normal incidence mirrors.

For larger incidence angles than about 45°, especially for much larger incidence angles like angles of about 70° and even more, it is sufficient if the reflective surface comprises a metal or a metal layer like Ruthenium, or if the reflective surface consists of a metal or a metal layer, comprising e.g. Ruthenium. At such high incidence angles, the reflectivity can be increased up to 60% and more without the necessity of a multilayer as mentioned above. As a general rule the reflectivity increases with increasing angle of incidence, which is why these mirrors are also called grazing incidence mirrors. EUV lithographic projection exposure systems often use plasma light sources. In this case, the collector mirror 2 can be a grazing incidence mirror as described e.g. in U.S. Pat. Nos. 7,460,212, 7,244,954, 7,015,489, 6,964,485 or US 2004/0130809 A1.

The structured object M reflects parts of the illumination beam 3 into a light path which forms a projection beam 4. The structured object M structures the illumination beam 3 after being reflected on it, depending on the structure on the mask M. This projection beam 4 is carrying the information of the structure of the structured object and is irradiated into a projection lens 20 such that at least two diffraction orders of the structure or the structures of the structured object M pass the projection lens 20 and form a kind of an image of the structure or the structures of the structured object M on a substrate W. The substrate W, e.g. a wafer, comprising a semiconductor material like silicon, is arranged on a substrate stage WS which is also called wafer stage.

In addition to the information about the structure of the structured object M, the projection beam also comprises information about the illumination condition of how the structured object M is illuminated regarding angular, polarization and intensity (or radiation power per unit area) in an object point OP of the structured object M, and of how these parameters are distributed over the illuminated surface of the structured object M. The kind of illumination is expressed by the term "setting". This means a predefined angular and/or polarization and/or intensity distribution with which an object point OP on the structured object M is illuminated, and how these distributions depend on the spatial position on the structured object M. The setting also influences the optical resolution of the projection process which is done by the projection lens 20. In general, the optical resolution can be increased if the setting is adapted to the shape of the structure on the structured object M. Advanced illumination techniques which use adapted settings for the illumination of a structured object are described e.g. in "Resolution Enhancement Techniques in Optical Lithography" by Wong, Alfred Kwok-Kit; ISBN 0-8194-3995-9". The kind of illumination, the setting, can be adjusted with the illumination system 10 (see FIG. 1), which comprises a plurality of mirrors 12, 13, 14, 15, 16.

In FIG. 1, as an example, the projection lens 20 schematically shows four mirrors 21, 22, 23 and 24 as reflective optical elements to form a kind of an image of the structure of the structured object M on the wafer W. Such EUV projection lenses 20 typically comprise 4 to 8 mirrors. However, projection lenses with only two mirrors may also be used. These mirrors are made with highest precision regarding surface figure (or regarding their geometrical form) and surface roughness. Each deviation from the desired specification results in a degradation of the image quality on the substrate or wafer W. Usually the specification is such that a deviation from the surface figure (the required or specified dimensions of the shape of the surface) of less than one tenth of the used projection wavelength is required. Depending on the used wavelength the surface figures of the mirrors 21, 22, 23 and 24 must be made with a precision of even better than 1 nm, for some mirrors the precision requirements are even a factor of 5 to 20 higher, ending up at precision ranges of much smaller than one atom layer, which means better than 0.1 nm. To project structures from a mask to a substrate with the EUV lithographic projection technique in such a way that the image on the substrate comprises structures down to about 10 nm of lateral dimension or even structures with smaller lateral dimensions the optical aberration of the projection lens 20 must be smaller than 1 nm, even smaller than 0.1 nm or smaller than 50 pm (picometer) of RMS value. This means that the root-mean-square (RMS) value of the deviation of the real wavefront from the ideal wavefront is smaller than the mentioned values. This very high precision regarding the surface shape (surface figure or geometrical form) must be kept over a mirror dimension of more than 10 cm. Modern EUV projections lenses comprise mirrors of a diameter of 30 cm or even more with such a high requirement regarding the surface figure. This very high mechanical precision is necessary to form an image point IP on the substrate W from an illuminated object point OP on the structured object M by illuminating the object point OP with a well configured illumination beam according to a predetermined setting. Further, to project the illuminated object point OP with the projection lens 20 with at least parts of the projection beam 4 onto the substrate W, the projection beam 4 is generated by the illumination beam 3 and the diffracting properties of the structured object M. One necessary condition to form an image on the substrate W is that the diffracted wave fronts, which are coming from an object point OP, interfere in the image point IP on the substrate or wafer W. To get a good image quality the interfering wave fronts must have a relative phase shift of far less than one wavelength of the projection beam light. Due to the various illumination settings, of how the structured object M can be illuminated by the illumination beam 3, the light path of the light passing one object point OP on the structured object M can vary within the projection lens 20 in such a way that light bundles of the projection beam 4 are reflected by the mirrors 21, 22, 23, 24 of the projection lens 20 at different surface areas with different sizes. This variation depends on the illumination settings and the position of the mirrors 21, 22, 23, 24 within the projection lens 20. To make sure that the image quality is achieved under all illumination settings it is necessary that the above-mentioned surface figure is achieved with the mentioned high mechanical precision.

Apart from the high mechanical precision of the surface figure of the mirrors 21, 22, 23, 24 in the projection lens 20, also the position and orientation of these mirrors 21, 22, 23, 24 relative to each other, relative to the structured object M and relative to the substrate W must be in the same range of accuracy. This means that position and orientation of these objects (mirrors 21, 22, 23, 24, structured object M and substrate W) must be adjusted also in the nanometer range or even below. In addition, a metrology is necessary to allow the manufacturing of such precise mirror surfaces, the assembling of the projection lens of the EUV lithographic projection system, the integration of the assembled projection lens into the projection system, and to allow any in-situ monitoring and control of the system during the operation of the system.

To achieve the above mentioned mechanical precisions, one further problem is the absorption of the projection beam 4 by the mirrors 21, 22, 23, 24. This absorption which could be in a range of up to 30% heats the mirrors. Depending on the absorbed heat each mirror may be deformed due to thermal expansion of the mirror. One method to reduce such thermal effects during the projection step, when a certain amount of the projection beam 4 is absorbed, is to use a temperature control system to keep the very high mechanical precision data as mentioned above, especially for the surface figure of the mirrors. Another or an additional method is to use as a mirror material or as a support structure for the mirror a low thermal expansion material with such a small coefficient of thermal expansion (CTE) like 5 ppb/K (or less) to reduce deformations of the mirror, if the temperature changes e.g. due to partial absorption of the projection beam 4. This method and the selection of appropriate materials with the respective small CTE and the control of the mirror temperature is described e.g. in U.S. Pat. No. 7,295,284 B2.

EUV lithographic projection exposure systems like shown in FIG. 1 are usually operated under vacuum conditions. The projection lens 20 and/or the illumination system 10 are operated under reduced pressure or vacuum. Usually the pressure conditions in the illumination system and the projection lens are different. The reduced pressure or vacuum conditions significantly reduce the technical solutions for the above mentioned problems regarding the deformation of mirrors and their active or passive position control. Especially temperature control systems for controlling a temperature of components inside the EUV lithographic projection exposure system are quite often limited to certain technical solutions which are not essentially based on thermal convection principles.

SUMMARY OF THE INVENTION

The present invention is directed to an improved EUV-projection lens to further reduce the influence of any temperature variation to deformations and/or position variations of the reflective optical elements or mirrors inside such a projection lens.

A projection lens of an EUV lithographic projection exposure system in accordance with this invention comprises mirrors and a supports structure to support or suspend the mirrors. In the vicinity of a mirror the support structure is at a reference temperature. Preferably the reference temperature is the same for all support structure parts which are close to the mirrors, and the mirrors are also at this reference temperature if they are not subjected to any radiation like EUV light. Further, the projection lens includes a heater and temperature control system to control the temperature of at least one heatable mirror. Without heating the heater the mirrors warm up from the reference temperature by an average temperature if the projection lens is exposed with the exposure power of the EUV light which is used to project an object field onto an image field. More precisely, during such an exposure a temperature distribution is formed out on the mirror which differs from the constant temperature of the reference temperature. This temperature distribution is characterized for example, by the average temperature or by a maximum temperature. Further, in the projection lens of this invention the at least one heatable mirror includes a body which includes a material with a temperature dependent coefficient of thermal expansion which is zero at a temperature $T_{0k}$ (called zero cross temperature). The zero cross temperature is selected such that it is higher than the reference temperature. According to this invention, the heatable mirror is heated and controlled to a temperature selected from a group of determined temperatures before the formation of the temperature distribution which is caused by the exposure power of the EUV light. This has the advantage that the warm up time (if the mirror is exposed with the exposure power of the EUV light) of the heatable mirror is significantly reduced. Further, the determined temperatures are selected such that the average temperature of the mirror after the warm up is close to or at the zero cross temperature. This means the in a steady state condition the at least one heatable mirror has a temperature at or close to the zero cross temperature. Preferably more than one mirror of the projection lens is heatable.

A further projection lens, called first projection lens, of this invention comprises at least two mirrors with mirror bodies wherein each body comprise a material with a temperature dependent coefficient of thermal expansion which is zero at respective zero cross temperatures $T_{0m}, T_{0n}$. The absolute value of the difference between these zero cross temperatures $T_{0m}, T_{0n}$ is more than 6K and the lens is designed to be exposed with an exposure power of more than 8 W of EUV light with a wavelength in a wavelength range of less than 50 nm. The selection of materials which widely differ regarding their respective zero cross temperatures advantageously offer the possibility to make projection lenses for higher exposure powers without the drawback that the thermal induced aberration of the mirrors is increasing. This offers the possibility to manufacture EUV projection lenses with minimal aberration and high exposure power.

In a further projection lens, called second projection lens according to this invention, the materials of the mirror bodies or substrates are selected according to a rule which is also part of this invention. At least one material is selected in such a way that its zero cross temperature is above the largest temperature value which the mirror can get under operation. With an additional heater the mirror is warmed up to the zero cross temperature or close to it which results in minimal thermal aberration. The advantage of the second projection lens is that the lens is very insensitive regarding the selected exposure power, any manufacturing tolerances of the zero cross temperature, any selected illumination settings and any mask patterns.

In a further projection lens, called third projection lens, according to this invention for at least two mirrors one material for the mirror bodies is selected. This material has a temperature dependent coefficient of thermal expansion which is zero at least two zero cross temperatures $T^1_{0mn}$ and $T^2_{0mn}$. The projection lens is designed such that one of the two mirrors is operated at or close to the first zero cross temperature $T^1_{0mn}$ and the other mirror is operated at or close to the second zero cross temperature $T^2_{0mn}$, if the projection lens is subjected to the EUV exposure power which is necessary for the projection process in mass production. The advantage of the third projection lens is that the lens needs fewer different substrate materials for its mirrors.

Further, the present invention relates to a method to configure a EUV projection lens. Especially the method focuses on the selection of suitable materials for the mirror bodies such that the thermal aberration of the lens can be minimized.

Further aspects of the invention are to provide various heating means or tempering means with which the mirrors in an EUV projection lens can be heated or cooled. These means also comprise mirror bodies with characteristic features like coatings or shapes which improve the temperature control of the respective mirror during its operation in the projection lens.

In general the above mentioned mirrors of the EUV projection lens shall also comprise any reflective elements like reflective diffractive structures, since the teachings of the present invention are not limited to mirrors.

Further features and advantages of the present invention and further improvements will become apparent from the following detailed description of exemplary embodiments with reference to the following figures in which like reference characters designate the same or similar parts. However, the following description of the invention by exemplary embodiments is merely illustrative and in no way intended to limit the invention and its applications. As shown in this description, features of different embodiments can be exchanged and/or combined to get additional embodiments of the present invention.

BRIEF DESCRIPTION OF THE DRAWINGS

The invention will now be described with reference to the drawings wherein:

FIG. 3A schematically shows a side view of a reflective optical element like a mirror at two different temperatures.

FIG. 3B schematically shows a deformation of a mirror surface due to temperature variations along the x-axis of the mirror.

FIG. 3C schematically shows a relative change of a length $\Delta L/L_0$ of a body with a length $L_0$ as a function of temperature in units of ppb for Zerodur® and ULE®.

DESCRIPTION OF THE PREFERRED EMBODIMENTS OF THE INVENTION

Figure 1:
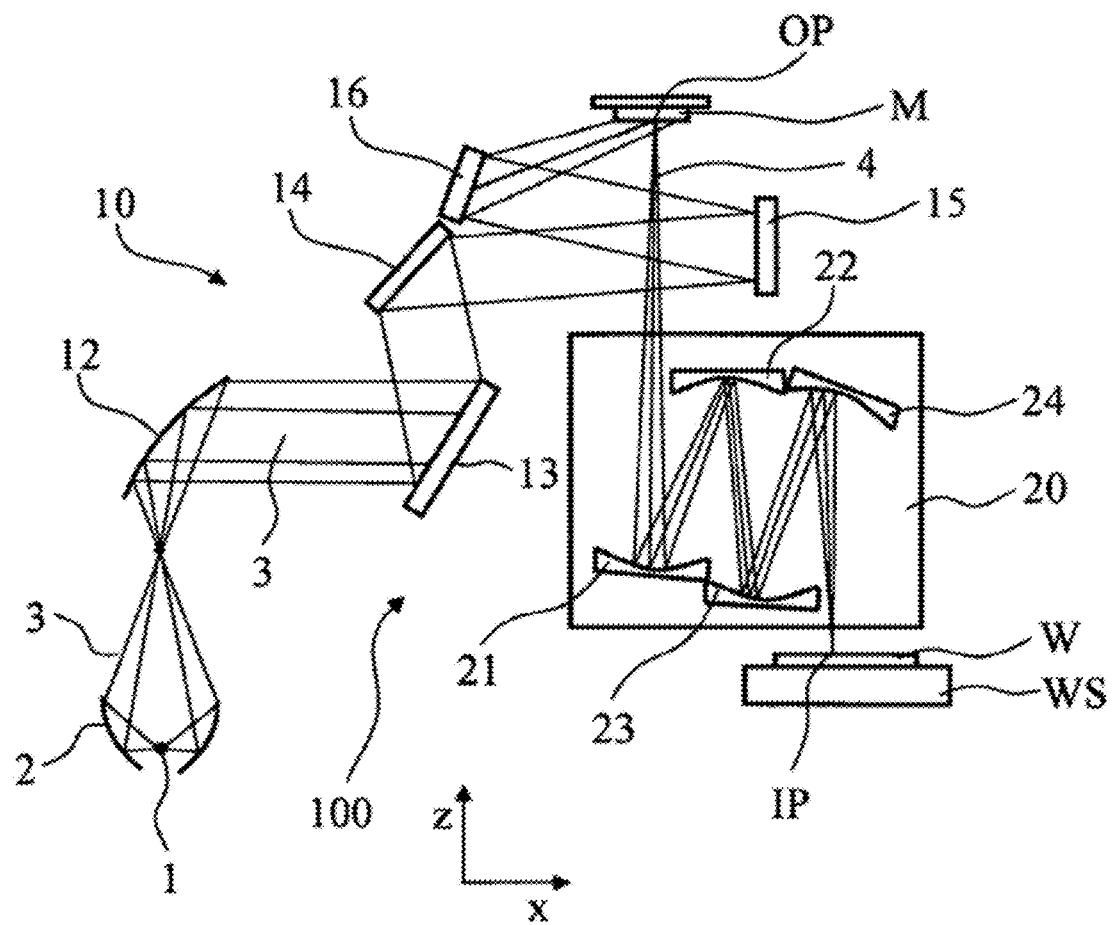
FIG. 1 schematically shows a simplified EUV lithographic projection exposure system with an illumination system and an EUV projection lens which comprises four mirrors.

To reduce deformation or position variation of the mirrors or the reflective optical elements inside a projection lens 20 (see FIG. 1 as described above) and to achieve the surface figure accuracy and position accuracy in the range of 0.1 nm or even better, any thermal expansion must be minimized. This means that the actual surface data regarding the surface shape of a mirror and its actual position data must be within the specified range relative to a required or specified dimension of the shape of the surface of the mirror and relative to its required or specified position. With such optical elements in a projection lens image structures down to about 10 nm of lateral dimension or even structures with smaller lateral dimensions can be generated. Further, for such optical elements (mirrors) or for the projection lens the optical aberration is smaller than 1 nm, even smaller than 0.1 nm or smaller than 50 pm (picometer) of RMS value. This means that the root-mean-square (RMS) value of the deviation of the real wavefront from the ideal wavefront is smaller than the mentioned values. To minimize thermal expansion of the optical element which result in a reduction of the thermal induced optical aberration, the body $MB_k$ of at least one mirror or reflective optical element k of the plurality of reflective optical elements $M_t$ of the projection lens is made of a material or comprises a material with a temperature dependent coefficient of thermal expansion (CTE) which is zero at a temperature $T_{0k}$. This temperature $T_{0k}$ is called zero cross temperature. Examples of such materials are shown in FIGS. 2A and 2B. The application of such materials in EUV lithographic projection exposure systems is e.g. described in WO 2004/015477 A1. Depending on the operation temperature of the lithographic projection exposure system 100, or the operation temperature of the reflective optical elements of such a system, there are different materials available which have at least one zero cross temperature $T_0$. Since the usual operation temperature of the reflective optical elements is in the range of about 0° C. up to about 100° C., preferably in the range of about 10° C. to about 60° C., better in a range of about 20° C. to about 40° C., the number of available materials is very restricted.

According to FIG. 2A Superinvar (an alloy of Fe—Ni—Co) or ULE® (a registered trademark of Corning Inc.) are suitable materials, or according to FIG. 2B a material made of a Zerodur® (a registered trademark of Schott AG) type may be chosen which is made of a glass ceramic. ULE® is a Titania silicate glass, which is a vitreous mixture of $SiO_2$ and $TiO_2$. In a first order approximation the CTE-value of ULE® and Zerodur® near by the respective zero cross temperatures can be approximated by the equation $CTE(T)=a1 (T-T_0)$, see e.g. FIG. 2A and FIG. 2B. For ULE® the constant or lope a1 is positive. This means that the material shrinks with increasing temperature if the temperature T of the material (made of ULE®) is below $T_0$, and the material expands if its temperature T is above $T_0$. For Zerodur® the constant or slope a1 is negative in the range of room temperature, as it is shown in FIG. 2B. This means that the material expands with increasing temperature if the temperature T is below $T_0$, and the material shrinks if the temperature is above $T_0$. At higher temperatures there is a second zero cross temperature $T^2_0$ with a positive constant or slope a2 in the approximation $CTE(T)=a2(T-T^2_0)$. This means that the material behaves similar like ULE® regarding thermal shrinkage and thermal expansion. In a certain temperature range around the zero cross temperature ULE® and Zerodur® have a CTE-value in the range of ppb/K ($10^{-9}$/K) down to zero. This means that a body of e.g. about 100 mm thickness which is made of a material with a CTE-value of about 1 ppb/K expands or shrinks of about 0.1 nm if the temperature changes by one Kelvin (1K). For Superinvar the temperature range around the zero cross temperature must be much smaller to achieve an effective CTE-value of 1 ppb/K. This result in extra efforts regarding the temperature control system which is one aspect why Superinvar is less preferred than ULE® and/or Zerodur® to use it as a substrate material for reflective optical elements in EUV lithography, especially in a projection lens 20 of an EUV lithography exposure system 100.

In general, thermal or temperature variations influence the aberration or image defects of an optical imaging system. However, an overall change or homogenous change in temperature, e.g. by a temperature offset $\Delta T$ of the spatial temperature distribution which changes the temperature from $T(x,y,z)$ to $T(x,y,z)+\Delta T$ (x, y and z designate the spatial coordinates), has only a small impact to refractive lens elements, which are used in VUV lithography. This is because the refractive power changes overall in the lens element and the changes of the surface figures of the refractive lens is negligible due to the almost constant coefficient of thermal expansion (CTE) of the refractive material.

In an EUV-lithographic projection system in which reflective optical elements like mirrors are made of materials, as e.g. shown in FIG. 2A and FIG. 2B, which comprise a coefficient of thermal expansion CTE(T) which strongly depends on the temperature T, even a homogeneous change in temperature as mentioned has a strong influence onto the aberration values of the optical system. This is schematically explained in more detail with FIG. 3A and FIG. 3B on the basis of the inventors' analyses.

FIG. 3A schematically shows a side view of a reflective optical element like a mirror $M_k$ with a body $MB_k$ and a reflective surface $MS_k$. The mirror $M_k$ has a spatial temperature distribution $T(x,y,z)$. If the mirror body $MB_k$ comprises material with a zero cross temperature then usually the temperature distribution $T(x,y,z)$ is different from the zero cross temperature. If the temperature distribution is changed by a constant value $\Delta T$, then, if e.g. the temperature is raised closer to the zero cross temperature, the mirror will expand to the mirror $M_k^*$ with body $MB_k^*$, if e.g. Zerodur® is used in a temperature regime in which the slope a2 (in the approximation $CTE(T)=a2 (T-T^2_0)$) is negative. However, despite the expansion in a first approximation the surface figure of the surface $MS_k$ does not change its shape, but the surface $MS_k^*$ of the expanded mirror $M_k^*$ changes its position. It is shifted e.g. into the z-direction by a value $\Delta z$ as shown. This change in position of the reflective surface can be easily corrected by a translational movement of the heated mirror $M_k^*$. In this case the image defects or the optical aberration is almost unchanged.

FIG. 3B schematically shows the situation of the mirror $M_k$ with a temperature distribution $T(x,y,z)=T_{Ref}$ (which is called reference temperature). Further, as an example, the mirror is locally heated in a surface area from x1 to x2 along the x-dimension of the mirror body $MB_k$, as shown by the temperature profile or temperature distribution $\Delta T(x)$ which is added to the reference temperature $T_{Ref}$, having a maximum temperature $\Delta T_{max}$. In this case the reference temperature $T_{Ref}$ means that at this temperature the mirror has reference shapes, also its reflective surface $MS_k$ has a reference surface figure. Any deviation due to thermal expansion is related to these reference shapes and the surface figure. It is further assumed that the interval [x1, x2] is small compared to the dimension of the mirror body in the x-direction. If the mirror body is heated up from the reference temperature $T_{Ref}$ by the temperature profile $\Delta T(x)$, and if it is made of a material with a temperature dependent coefficient of thermal expansion which is zero at a temperature $T_0$, like Zerodur® or ULE® as shown in FIG. 2A and FIG. 2B, and if the maximum temperature of the mirror body, given as $T_{Ref}+\Delta T_{max}$, as an example is below the zero cross temperature $T_0$ and above the reference temperature $T_{Ref}$ due to the heating, then the reflective surface of the mirror between the coordinates x1 and x2 will shrink compared with the surface at the reference temperature. This is the case if e.g. ULE® is used. In FIG. 3B the change in surface figure is schematically shown by $MS_k^*$ which can be compared with the reference surface figure $MS_k$ at the reference temperature $T_{Ref}$. L1 and L2 designate the coordinates of the body at the reference temperature $T(x,y,z)$ $=T_{Ref}$ which result in a length of the body $L_0(T_{Ref})=(L2-L1)$ in the x-direction. To explain this deformation in more detail reference is made to FIG. 3C.

FIG. 3C schematically shows the relative change of a length of the body $MB_k$ $\Delta L/L_0$ with a length $L_0$ (like the one mentioned in connection with FIG. 3B) as a function of temperature in units of ppb (parts per billion, meaning in values of $10^{-9}$). As a reference temperature $T_{Ref}=22°$ C. is chosen. This means that the length $L_0$ is the length at 22° C. The zero cross temperature $T_{0k}$ is, as an example, set to 25° C. which is 3K higher that the reference temperature. Curve 301 schematically shows the relative length changes for ULE®, and curve 302 schematically shows the situation for a Zerodur® material, selected such to also have a zero cross temperature $T_0$ at about 25° C. and to have a negative slope a1 for the CTE approximation $CTE(T)=a1*(T-T_0)$. If e.g. the mirror body $MB_k$ is made of ULE® and the temperature of the mirror body is selected within the temperature interval $T_{Ref}$ and $(2T_{0k}-T_{Ref})$ then the mirror body will shrink relative to the mirror body at the reference temperature. In the case that the mirror body is made of Zerodur®, see curve 302, then the mirror body will expand relative to the body at the reference temperature, as can be seen from FIG. 3C. If the mirror surface has a temperature profile similar like shown in FIG. 3B then (in a first approximation) the mirror surface regions between L1 and x1 are not changed due to thermal expansion. Also the region between x2 and L2, since there the temperature is at the reference temperature or close to it. In the region between x1 and x2 the mirror body will expand or shrink because the temperature is different from the reference temperature. Whether expansion or shrinkage occurs in this region depends on the material and on the relative position of the absolute temperature profile $\Delta T(x)+T_{Ref}$ and the zero cross temperature $T_{0k}$ to each other. The average temperature $\Delta T_{av}$ of the temperature profile is given as $\Delta T_{av}=(\int \Delta T(x)dx|^{x2}_{x1})/(x2-x1)$ with the integration limits x1 and x2. Is the absolute temperature profile $\Delta T(x)+T_{Ref}$ about equal to the zero cross temperature $T_{0k}$ then there is no expansion or shrinkage of the interval [x1, x2]. However, within this interval there is still surface deformation (not shown in FIG. 3B) possible on a scale lower than this interval, if there are local temperature variation of the temperature profile $\Delta T(x)$. In the case $T_{av}+T_{Ref}=T_{0k}$ the surface figure deformation is minimized and on the scale of the interval [x1, x2] it can be neglected. In this case the aberration or image defects are minimized. In the other case if the average temperature is not the zero cross temperature and if the mirror body $MB_k$ shrinks within the interval [x1, x2] then the surface figure of the reflective surface changes as schematically shown in FIG. 3B, designated as $MS_k^*$. In the case of expansion the reflective surface changes to $MS_k^{**}$ which also results in a change of surface figure. In both cases aberration and imaging defects will increase. In FIG. 3B, as an example, the absolute average temperature is below the zero cross temperature but within the reference temperature $T_{Ref}$ and a temperature given by $2T_0-T_{Ref}$, resulting in a surface deformation $MS_k^*$ for ULE® and a surface deformation $MS_k^{**}$ for Zerodur® for the mirror body $MB_k$ of FIG. 3A. It shall be mentioned that if the mirror is homogenously headed to about the temperature $T=(2T_0-T_{Ref})$ then the mirror has the same dimensions and surface figures as at the reference temperature $T_{Ref}$ which results in no additional aberration or image errors caused by the heating. In the above simplified explanation of the influence of the thermal expansion to aberrations there are various simplifications like the special temperature profile, the assumption that there is only a temperature variation in x-direction and the other dimensions remain at the reference temperature $T_{Ref}$, and that the mirror body is made of a material which has no variations in the zero cross temperature which means that the zero cross temperature does not vary in the x-, y- and z-direction of the mirror. For practical designs more complex simulation calculations or finite element calculations are necessary to optimize a reflective surface and other mirror parameters like the zero cross temperature or the operation temperature of the mirror which is operated under a given thermal load. According to the present invention the operation temperature of the mirror and the zero cross temperature shall be selected such that the absolute temperature profile $\Delta T(x,y,z)+T_{Ref}$ which differs from the reference temperature $T_{Ref}(x,y,z)$ of the mirror or reflective optical element should be symmetric about the zero cross temperature $T_0$. For one dimension, e.g. in x-direction, this means as $\Delta T_{av}+T_{Ref}=(\int \Delta T(x) dx|^{x2}_{x1})/(x2-x1)+T_{Ref}=T_0$.

If the temperature profile $\Delta T$ varies in more than one dimension, e.g. if $\Delta T=\Delta T(x,y,z)$, then the integration is done in each dimension to get the average temperature, meaning $T_{av}=(\iiint \Delta T(x,y,z) dxdydz|^{x2}_{x1}|^{y2}_{y1}|^{z2}_{z1})/(x2-x1)/(y2-y1)/(z2-z1)$ in which y1, y2 and z1, z2 are the respective mirror edges in the y- and z-direction. Alternative, an average temperature for each dimension is separately calculated. In this case the optimization to the zero cross temperature can be done to an individual average temperature or to two individual average temperatures, which are related to the dimension or to the dimensions which are most relevant for the aberration.

Further, in accordance with the invention the optimization of the zero cross temperature may be adapted to the expected absolute average temperatures $\Delta T_{av}+T_{Ref}=T_0$ for each mirror of the EUV projection lens which has a zero cross temperature. Alternative, the expected absolute average temperatures are homogenously raised to the zero cross temperature of the mirror material by e.g. homogenously heating the mirror body in at least one dimension with a heating means. Since the last method offers more flexibility it will be discussed below, this method is preferred.

Figure 2A:
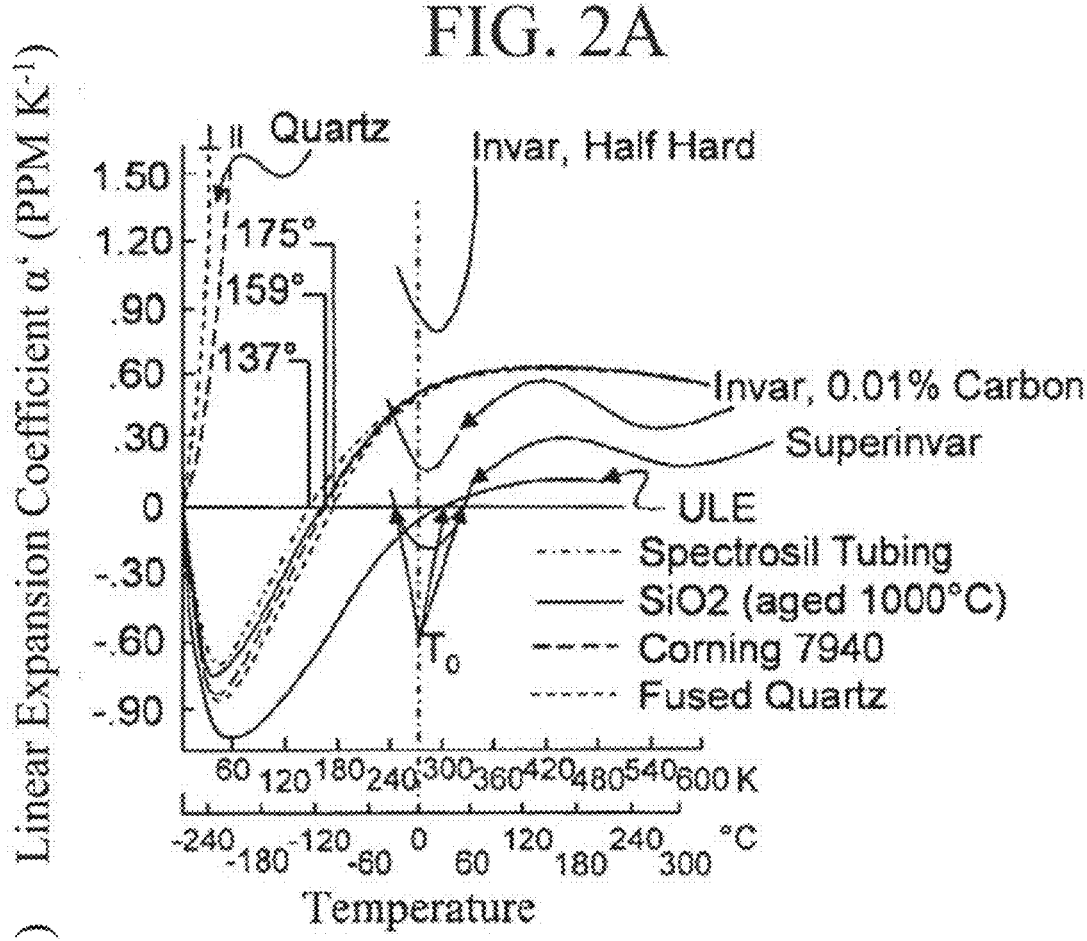
FIG. 2A linear expansion coefficient (CTE) for various materials as a function of temperature. The materials have a zero cross temperature for which this coefficient is zero. (from Critical Reviews of Optical Science and Technology, Vol. CR43, p 183, article from S. F. Jacobs "Variable invariables—dimensional instability with time and temperature"; ISBN 0-8194-0953-7; 1992)
Figure 2B:
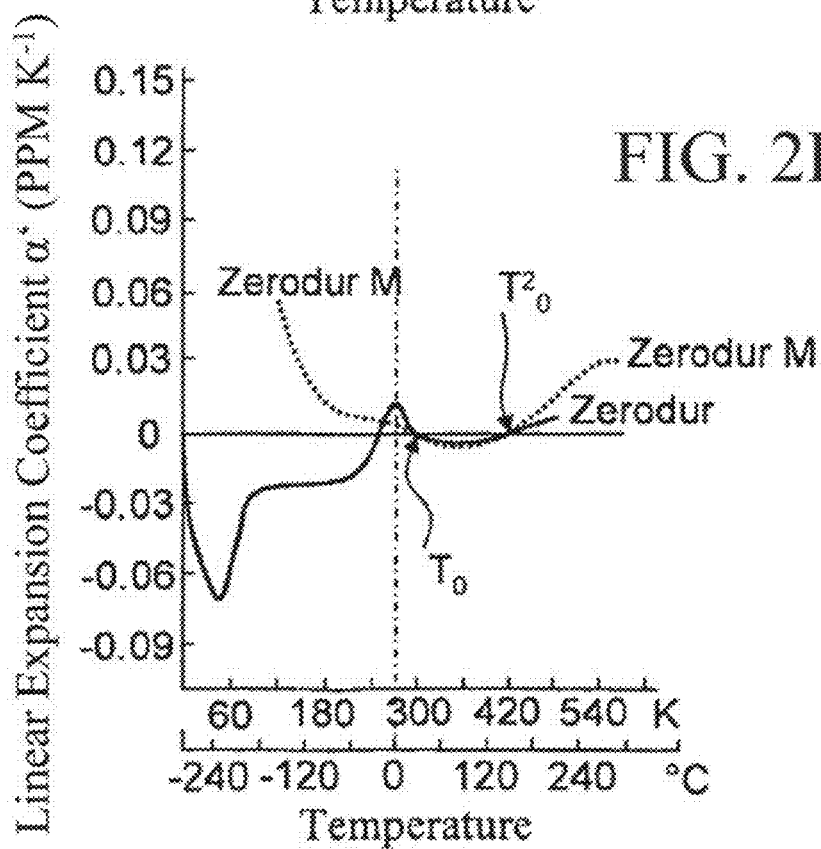
FIG. 2B Linear expansion coefficient for various Zerodur® materials as a function of temperature with various zero cross temperatures where this coefficient is zero. (from Critical Reviews of Optical Science and Technology, Vol. CR43, p 186, article from S. F. Jacobs "Variable invariables—dimensional instability with time and temperature"; ISBN 0-8194-0953-7; 1992)
Figure 3D:
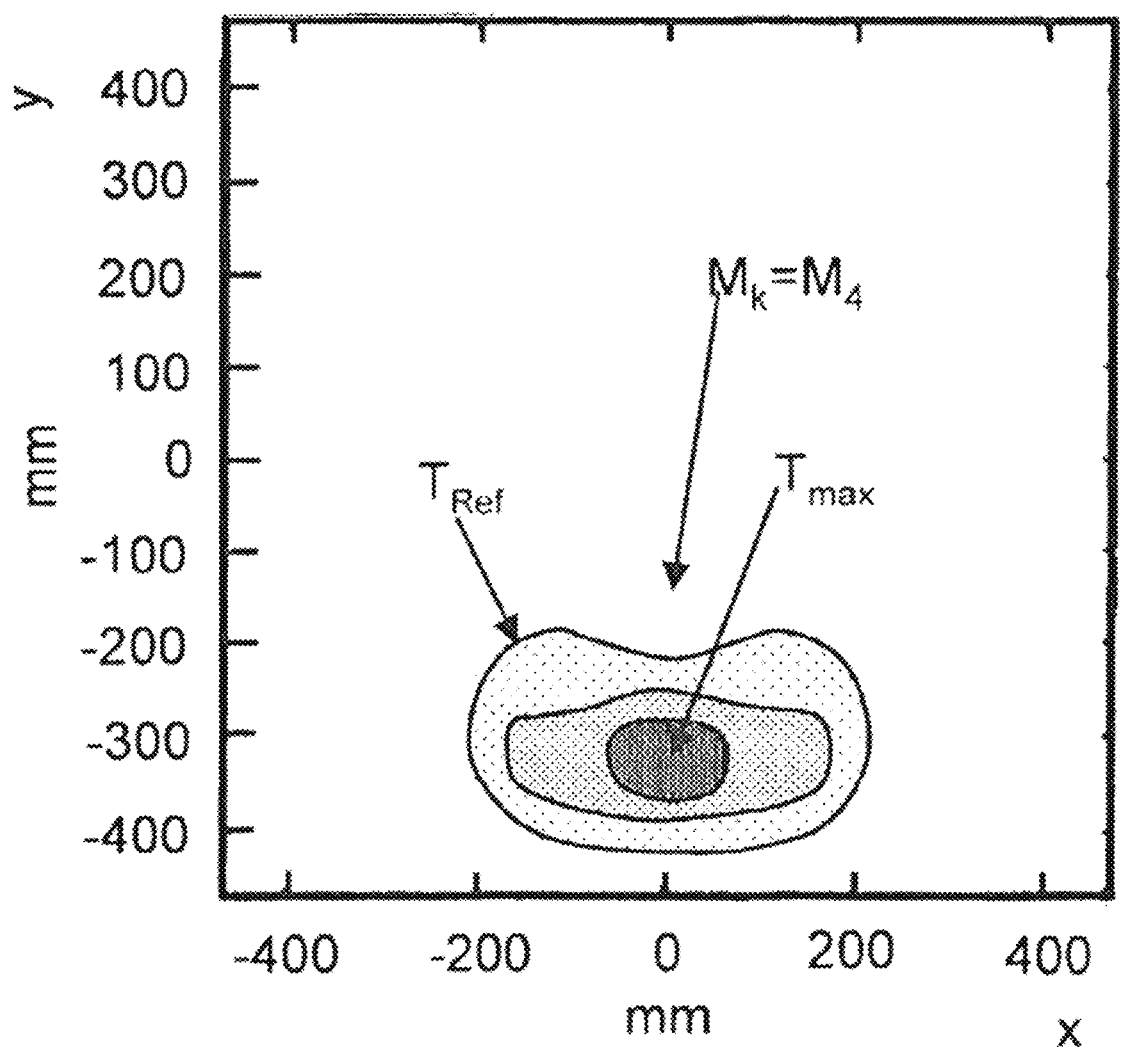
FIG. 3D show a temperature distribution on the $4^{th}$ mirror of the EUV projection lens of FIG. 6 together with the mirror size.
Figure 3E:
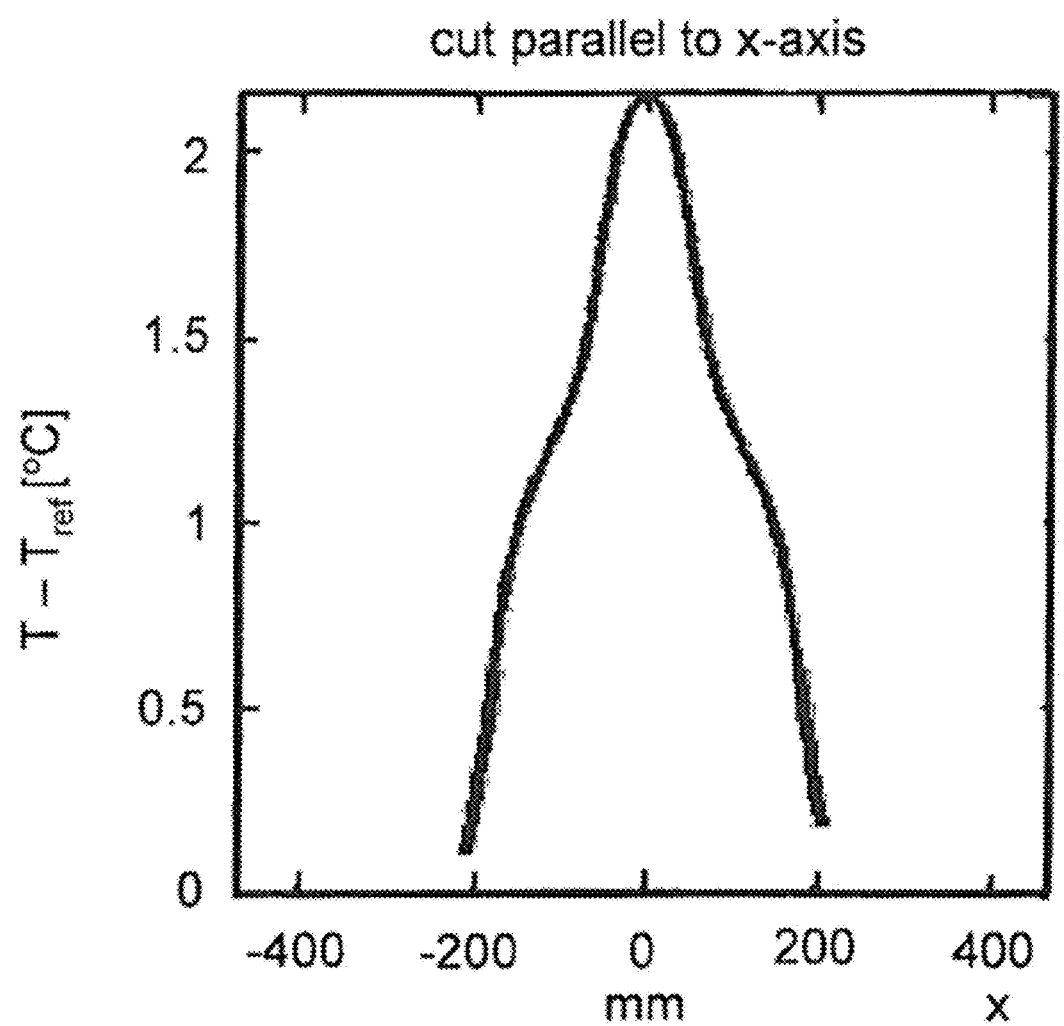
FIG. 3E shows the temperature profile of the mirror of FIG. 3D along the x-direction trough the temperature maximum. The temperature difference to the reference temperature is given.
Figure 3F:
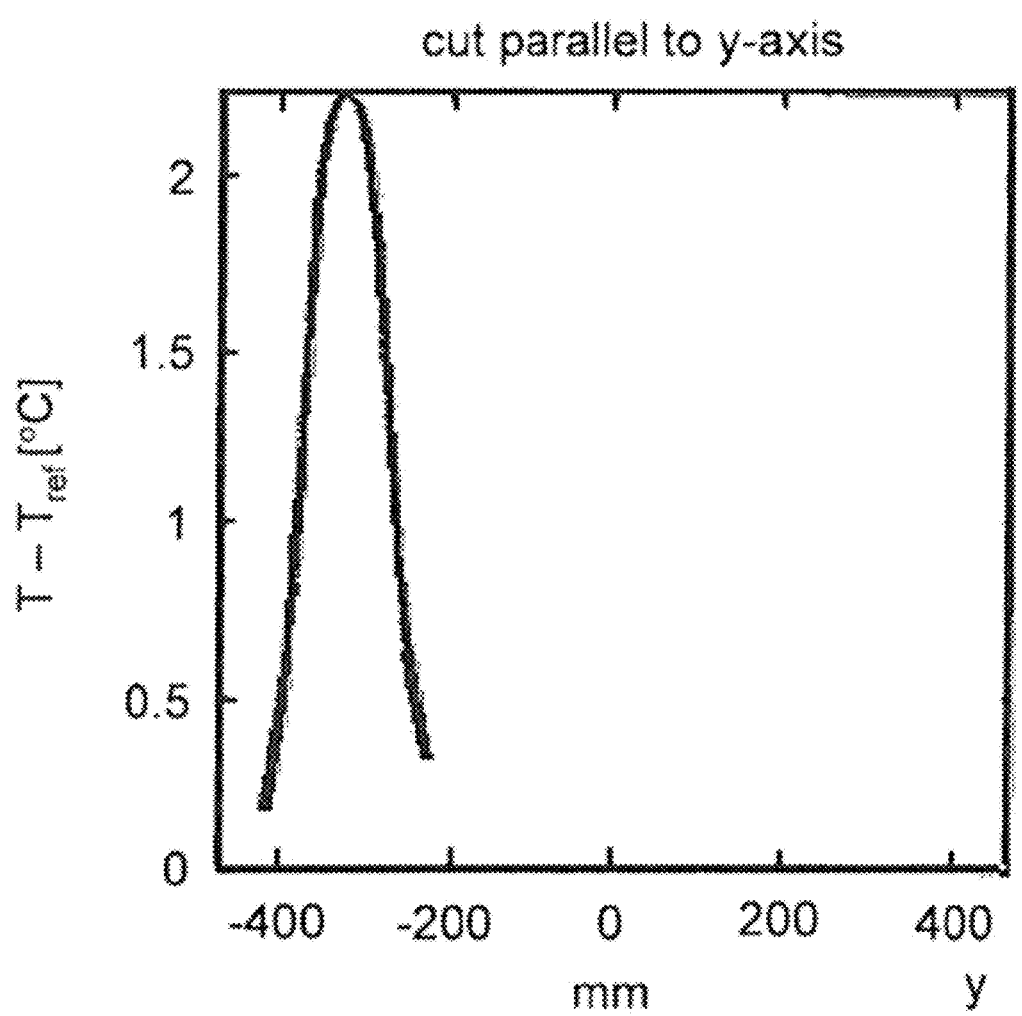
FIG. 3F shows the temperature profile of the mirror of FIG. 3D along the y-direction trough the temperature maximum. The temperature difference to the reference temperature is given.
Figure 3G:
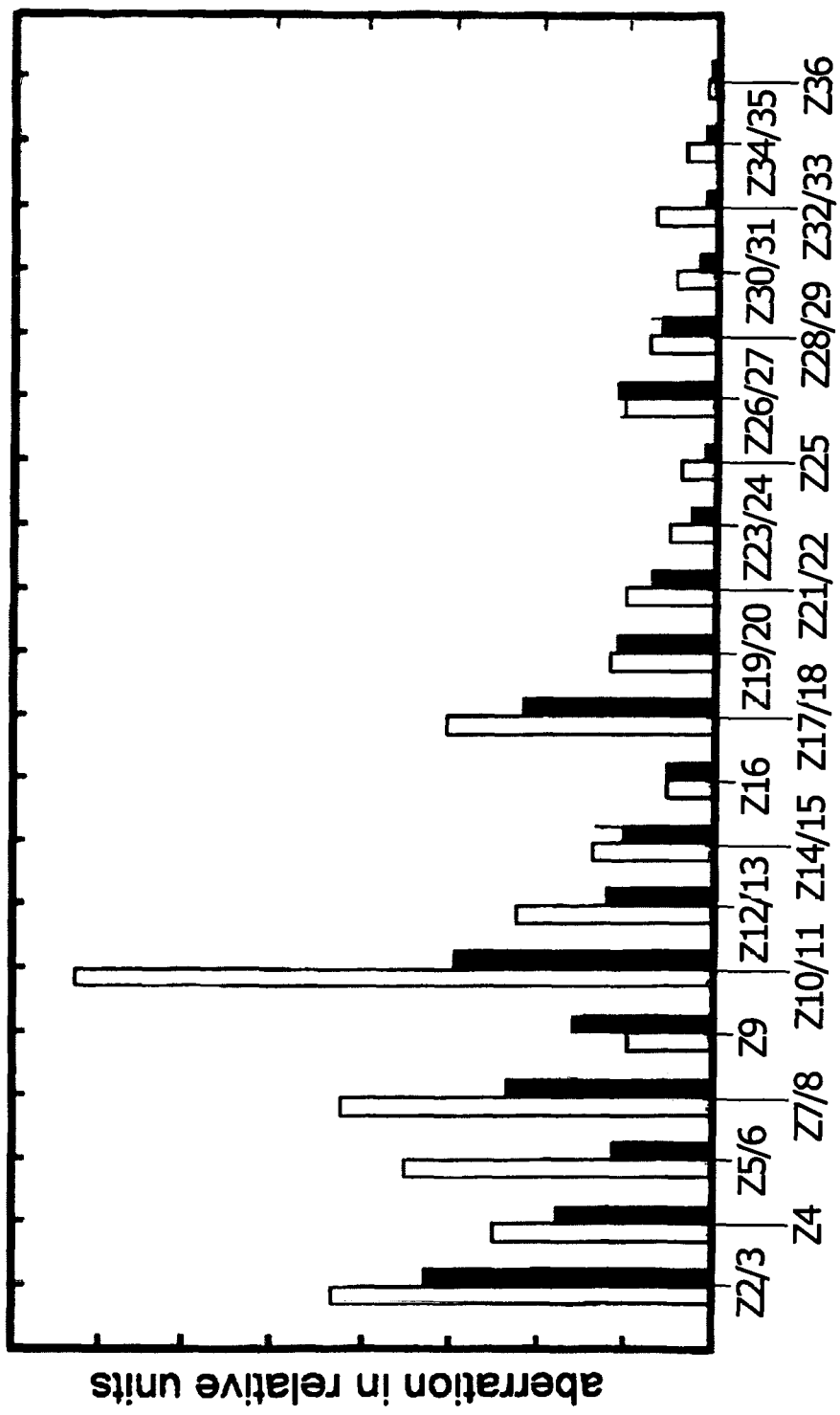
FIG. 3G shows values of the Zernike-coefficients for the mirror $M_4$ of FIG. 3D to FIG. 3F in relative units.
Figure 6:
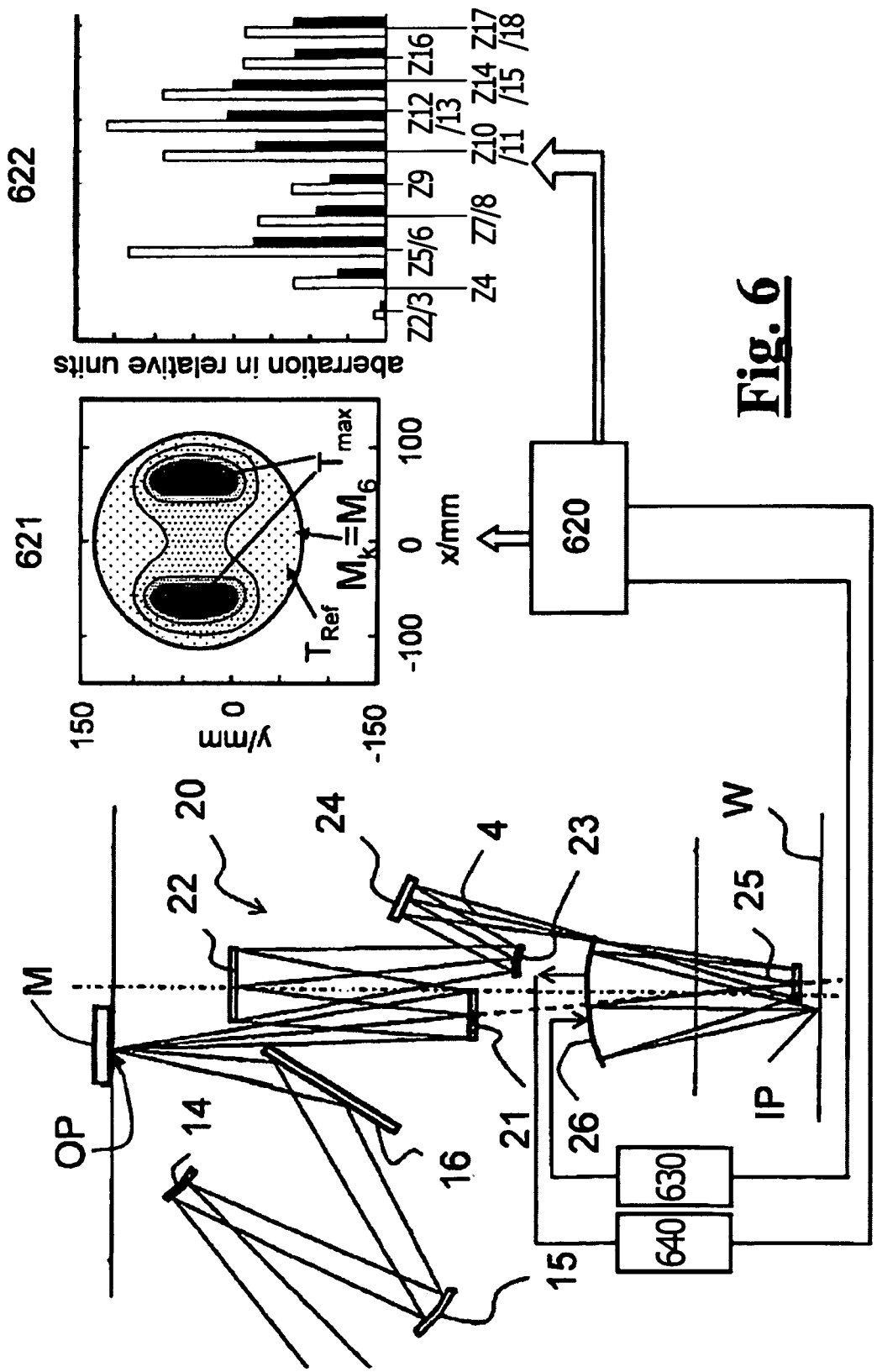
FIG. 6 schematically shows an EUV projection lens which comprises 6 mirrors, a heater and a temperature or aberration control system for the sixth mirror.

FIGS. 3D to 3F show a more realistic temperature distribution of an EUV mirror as used in the projection lens 20 (FIG. 1). In FIG. 3D a mirror $M_k$ with its dimensions is shown from the top. For the simulation of the temperature distribution of this mirror and also the respective aberration a EUV-projection lens with 6 mirrors (k=1 to 6) was used, as it is shown in FIG. 6. The results for mirror 24 (see FIG. 6) or $M_4$ are shown in FIGS. 3D to 3F which is the fourth mirror after the reticle, counted in the direction of the projection beam. The EUV-lens with the 6 mirrors is shown and explained below. In FIG. 3D the temperature distribution is shown with a grey shading pattern. The temperature increases from the mirror periphery from 22° C. which is the reference temperature $T_{Ref}$, up to about $T_{Ref}+\Delta T_{max}(x)=24°$ C. in the middle black spot. FIG. 3E shows the temperature difference to the reference temperature as a temperature profile $\Delta T(x)$ of the mirror along the x-direction trough the temperature maximum $\Delta T_{max}$. FIG. 3F shows the temperature difference to the reference temperature as a temperature profile $\Delta T(y)$ of the mirror along the y-direction through the maximum temperature $\Delta T_{max}$. The inhomogeneous temperature profile of the mirror results in deformations of the mirror surface as explained above. These deformations result in aberrations which cause image errors or defects. This is shown in FIG. 3G in which the values of the Zernike-coefficients for the mirror $M_4$ are given. These coefficients are a quantity or measure for the deviation of an ideal spherical wavefront in the image plane which generate an image point IP (see FIG. 1).

To get the Zernike-coefficients a wavefront is expanded in a series of Zernike functions. An ideal spherical wave has just a first Zernike coefficient and all other coefficients are zero. So the values of the Zernike-coefficients higher than 2 are a measure for various imaging errors, and the lager these coefficients are the larger is the optical aberration of the optical imaging system.

In FIG. 3G for each Zernike coefficient two values are given. The left value (bar) is the value without additional heating of the mirror. The right value, given by the right bar, is the value with an additional homogenous heating of the mirror. This is now explained in more detail. The mirror $M_4$ in this example has a mirror body made of ULE® with a zero cross temperature of 25° C. The reference temperature is $T_{Ref}=22°$ C. This means that without EUV light the temperature of the mirror is at 22° C. Preferably the aberration is minimized at this temperature. If the EUV light is switched on to project an object point OP to an image point IP then the mirror heats up and aberration occurs as shown by the respective left bars in FIG. 3G. If the mirror $M_4$ is additionally homogenously heated by 2° C. to be at 24° C. before the EUV light is switched on then the aberration after switching on the EUV light results in the right bars which are significantly lower than the left ones. This means that the aberration of the EUV lens can be significantly reduced by the homogenous heating of at least one lens mirror.

Figure 3H:
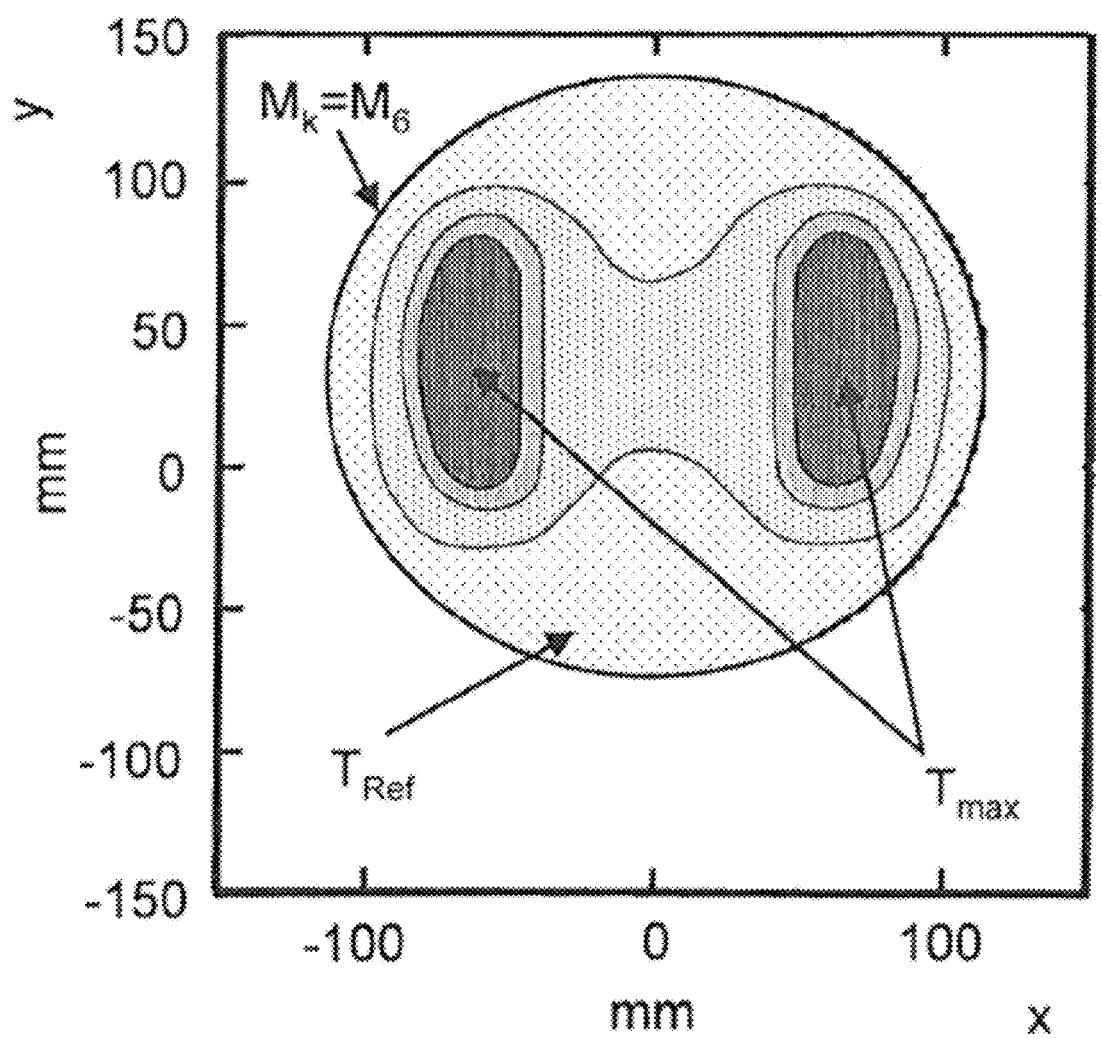
FIG. 3H show a temperature distribution on the $6^{th}$ mirror of the EUV projection lens of FIG. 6 together with the mirror size.
Figure 3I:
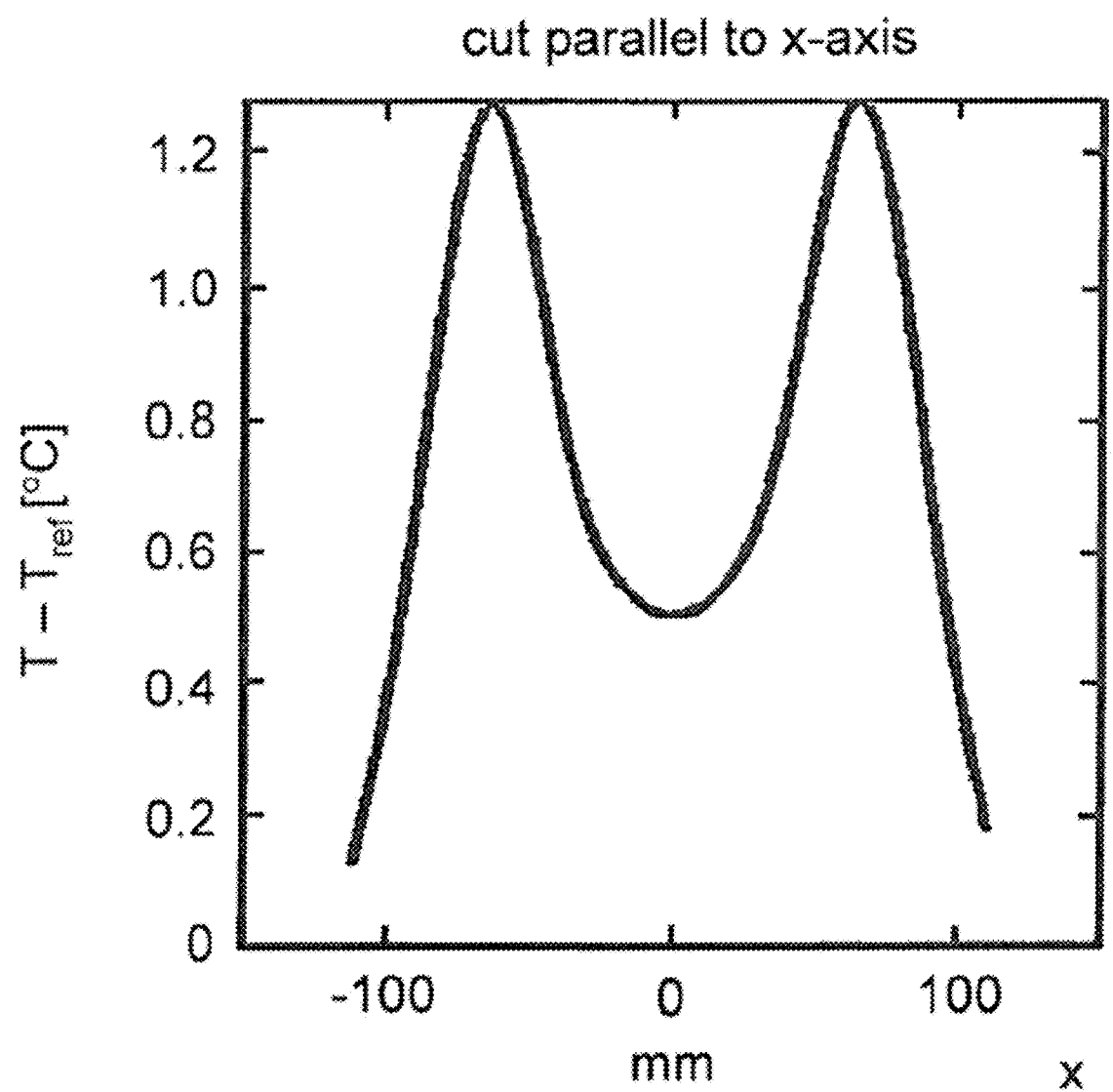
FIG. 3I shows the temperature profile of the mirror of FIG. 3H along the x-direction trough the temperature maxima. The temperature difference to the reference temperature is given.
Figure 3K:
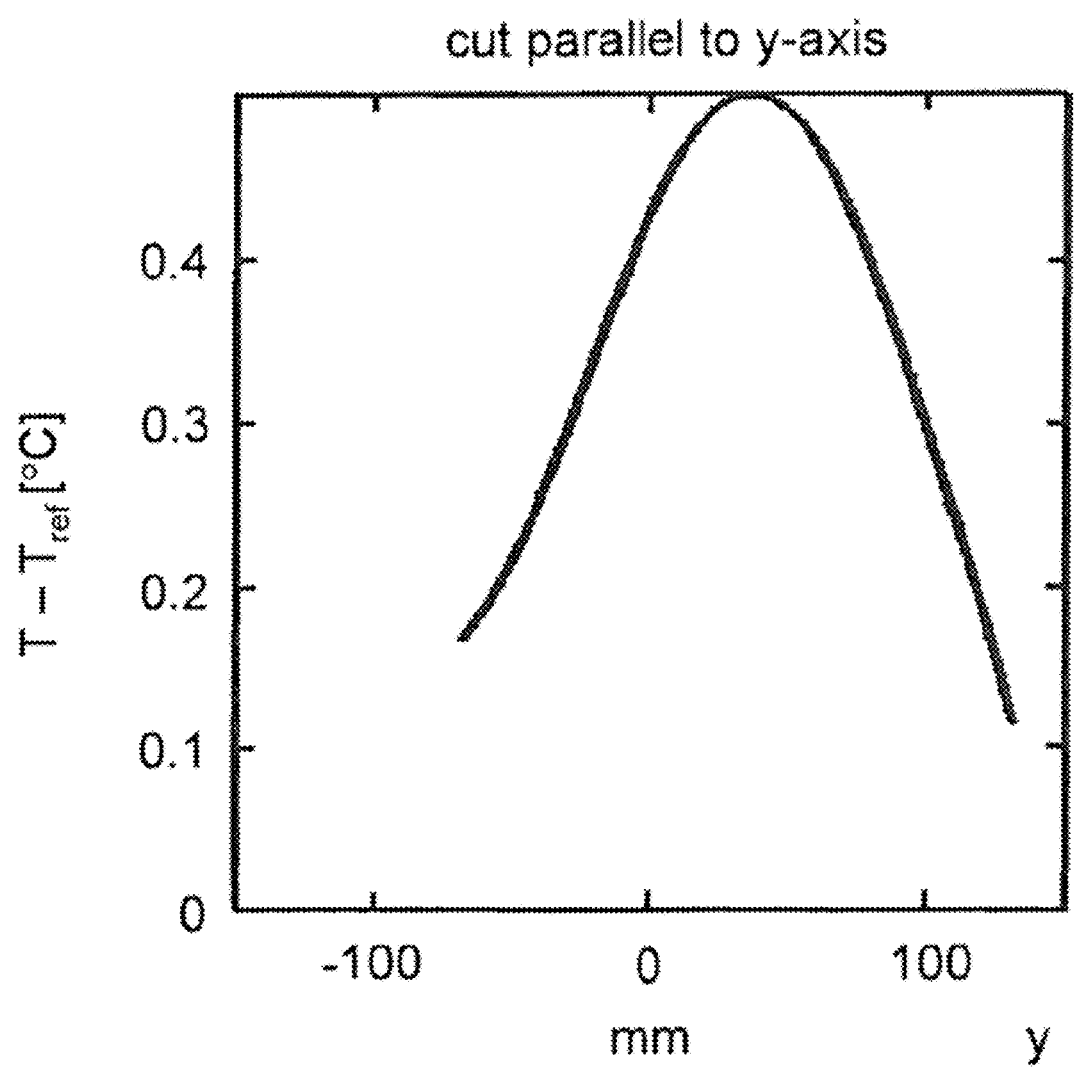
FIG. 3K shows the temperature profile of the mirror of FIG. 3H along the y-direction trough the minimum temperature between the maxima in the x-direction. The temperature difference to the reference temperature is given.

FIGS. 3H to 3L show a further realistic temperature distribution of an EUV mirror as used in the projection lens 20 (FIG. 1). In FIG. 3H the mirror $M_6$ of the EUV projection lens of FIG. 6 is shown similar to FIG. 3D. For the simulation of the temperature distribution of this mirror and also the respective aberration the EUV-projection lens with the 6 mirrors was used as for FIGS. 3D to 3G and as shown in FIG. 6. The results are shown in FIGS. 3H to 3L for mirror 26 (see FIG. 6) or $M_6$, meaning the sixth mirror after the reticle, counted in the direction of the projection beam. The temperature increases from the mirror periphery from 22° C., which is the reference temperature $T_{Ref}$, up to about 1.2° C. in the middle of the left and right black spots. FIG. 3I shows the temperature profile along the x-direction of the mirror trough the temperature maximums where the temperature difference $\Delta T(x)=T(x)-T_{Ref}$ to the reference temperature is given. FIG. 3K shows the temperature difference to the reference temperature $\Delta T(y)=T(y)-T_{Ref}$ in the y-direction through the minimum temperature between the maxima in x-direction. The inhomogeneous temperature profile of the mirror results again in deformations of the mirror surface. The values for the Zernike-coefficients for this mirror are given in FIG. 3L. The left value (bar) again is the value without additional heating of the mirror. The right value is the value with an additional heating of the mirror. The mirror $M_6$ also has a mirror body made of ULE® with a zero cross temperature of 25° C. The reference temperature is also $T_{Ref}=22°$ C. This means again that without EUV light the temperature of the mirror is at 22° C. Preferably the aberration is minimized at this temperature. If the EUV light is switched on to e.g. project an object point OP to an image point IP then the mirror heats up and aberration occurs as shown by the respective left bars in FIG. 3L. If the mirror $M_6$ is additionally homogenously heated up by 3.8° C. from the reference temperature $T_{Ref}$ to be at 25.8° C. before the EUV light is switched on, then the aberration, after switching on the EUV light, results in the right bars which are significantly lower than the left ones. This means again that the aberration of the EUV lens can be significantly reduced by the homogenous heating of at least one lens mirror of the projection lens.

Figure 4:
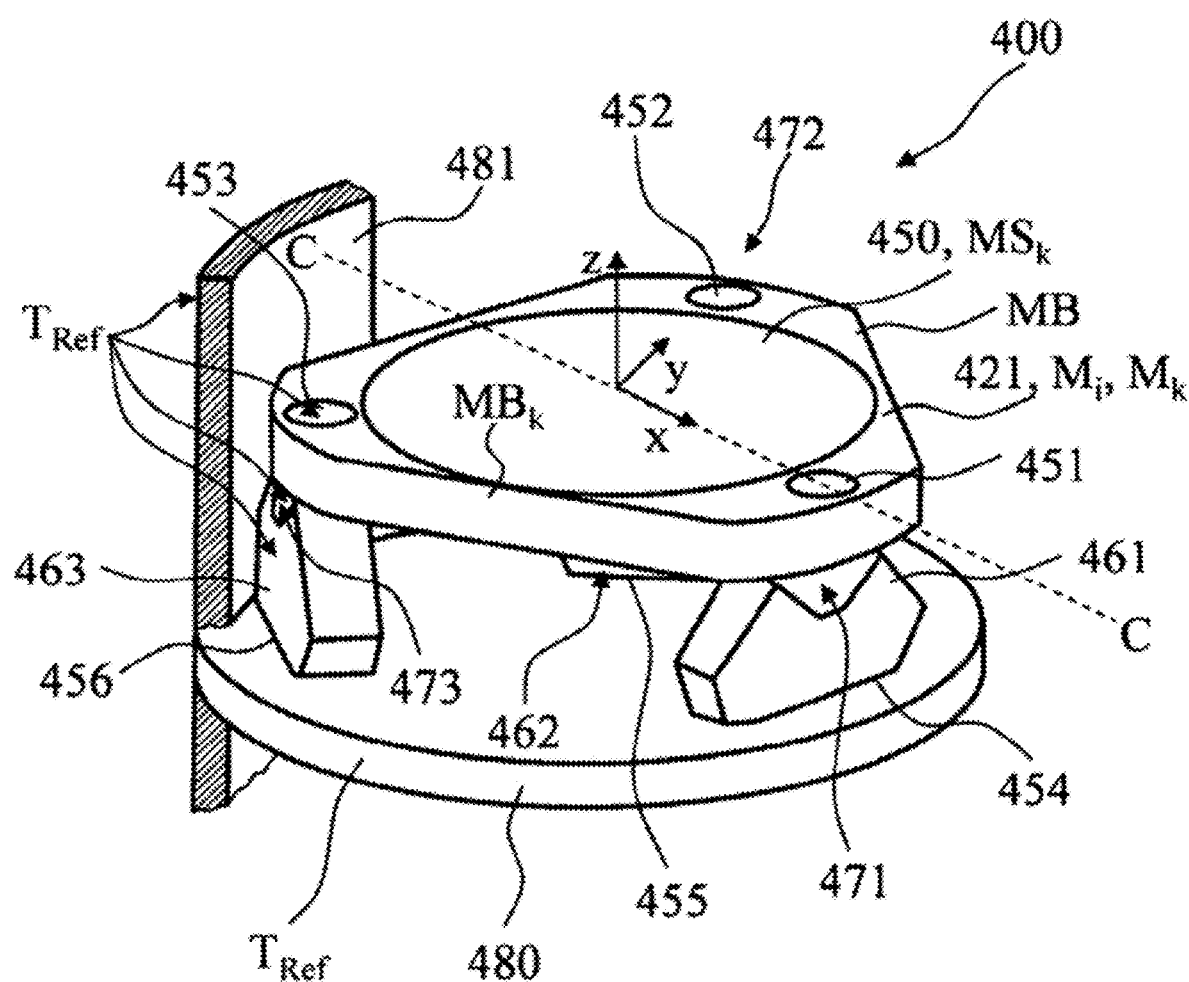
FIG. 4 schematically shows a mirror mounting assembly with a mirror as used in a projection lens of an EUV-lithographic projection exposure system as described in e.g. in U.S. Pat. No. 8,179,621, US 2007/0052301 and US 2009/0050776.

With reference to FIG. 4 a more detailed description of the mirror with the mirror mounting and the meaning of the reference temperature $T_{Ref}$ is given. The projection lens 20 as described above with reference to FIG. 1 or FIG. 6 comprises mirrors 21, 22, 23, 24 (25, 26) or in general a plurality of reflective optical elements $M_i$, each comprising a body $MB_i$ and a reflective surface $MS_i$ to project at least one object point OP of an object field on a reticle or on a structured object M onto an image point IP in an image field on a substrate or wafer W if the projection lens 20 is exposed with an exposure power of EUV light with a wavelength in a wavelength range less than 50 nm. Preferably a wavelength of about 13 nm is used. The EUV light is reflected from the reticle M after its illumination by an illumination system 10 of an EUV-lithographic projection exposure system 100. Further, the projection lens 20 comprises a support structure for passively or actively supporting the reflective optical elements $M_i$ (e.g. mirrors 21, 22, 23, 24). The temperature of the support structure or of at least a part of the support structure is at a reference temperature $T_{Ref}$. This is shown in more detail in FIG. 4 which schematically shows a mirror mounting assembly 400 for the mirror 421, representing one reflective optical element $M_k$ from the plurality of the reflective optical elements $M_i$ which are used in an EUV-lithographic projection exposure system 100 (FIG. 1), and as described e.g. in U.S. Pat. No. 8,179,621, US 2007/0052301 and US 2009/0050776. The mirror 421 comprises a mirror body $MB_k$ made of Zerodur® or ULE®, or made of a material comprising e.g. one of the materials Zerodur® or ULE®, or made of a material having at least one zero cross temperature. The mirror 421 also comprises a reflective surface 450 with an optional multilayer of predetermined layer materials with predetermined layer thicknesses to improve the reflectivity of the projection beam 4 (FIG. 1) of EUV light. The mirror body $MB_k$ is supported by a support element 480. As an example, the mirror 421 is supported or suspended by three mounting or linking points 451, 452, 453. At each of these mounting points the mirror body $MB_k$ is connected with linking elements 471, 472, 473 with a bipod structure 461, 462, 463 to achieve a kinematic mount which holds the mirror 421 such that almost no parasitic forces and/or moments are transferred from the support element 480 to the mirror. Usually but not necessarily at least one of these bipod structures may comprise an actuation device. The support element 480 is fixed at a housing structure 481 of the projection lens 20. The housing structure is sometimes also called projection optical box or POB. In accordance with the present invention, as a support structure with a defined or controlled reference temperature $T_{Ref}$ one of the following elements is preferably selected: The linking points 451, 452, 453, the linking elements 471, 472, 473, the bipod structures 461, 462, 463, the support element 480 or the housing structure 481. The selected support structure depends among other things also on the temperature control system which is used in the EUV lithographic exposure system. For this reason in FIG. 4 all these elements are designated with $T_{Ref}$ which does not necessarily mean that all these elements have the same temperature during the operation of the projection system 100.

According to the present invention the reference temperature $T_{Ref}$ is the temperature of the selected support element which supports the reflective optical element 421 in an operation mode of the EUV lithographic exposure system in which the EUV light is switched off, or in an operation mode in which the power of the EUV light is less than about 10% of the exposure power which is usually used for the projection of the object field on a reticle onto an the image field on the substrate in an mass production operation mode of the EUV lithographic exposure system. This reference temperature $T_{Ref}$ is usually selected close to the room temperature of the clean room in which the projection lens 20 is operated, meaning that the reference temperature is in the range of about 20° C. to 24° C., preferably 22° C. In most EUV lithographic projection exposure systems an additional temperature control system controls the reference temperature $T_{Ref}$ such that this temperature is constant also during the operation of the projection lens 20. Usually this is the temperature of the housing structure 481 and/or the support element 480 (FIG. 4), being e.g. at 22° C. as it was chosen in FIGS. 3A to 3L. According to this invention, preferably the temperatures are selected such that the zero cross temperature $T_{0k}$ is higher than the reference temperature. This has the advantage that the mirrors or reflective optical elements have not to be cooled to a temperature below the reference temperature $T_{Ref}$ to operate the mirror nearby the zero cross temperature. To avoid the cooling of the mirrors in an EUV projection lens is an advantage because the lens is operated in vacuum in which a cooling of the mirrors is technically difficult or expensive.

Figure 5:
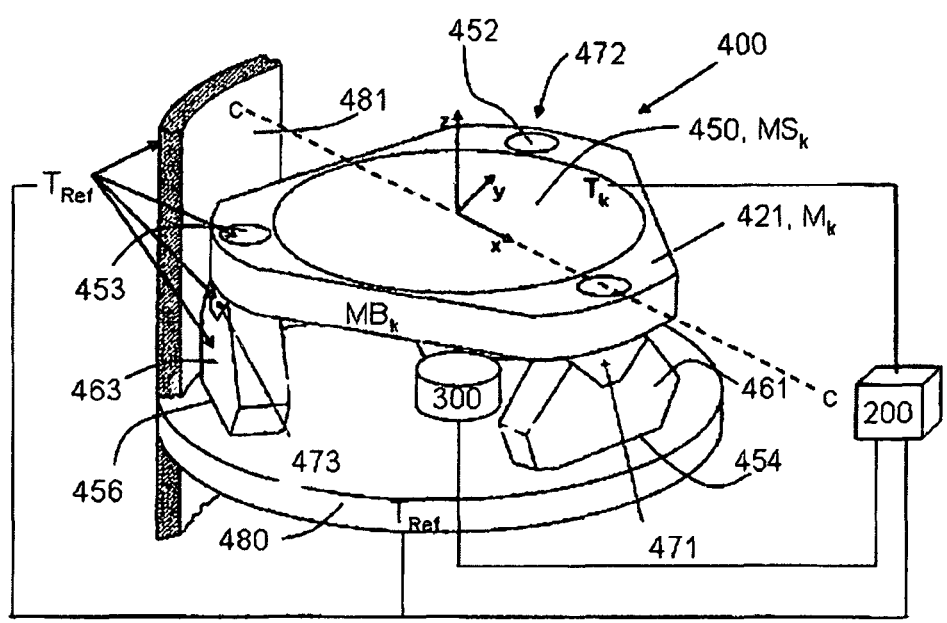
FIG. 5 schematically shows the mirror mounting assembly of FIG. 4 with a heater for heating the mirror and a temperature control system for controlling the temperature of the mirror.

Further, in accordance with the present invention the projection lens 20 comprises a heater 300 to heat at least one optical element $M_k$, and it comprises a temperature control system 200 to control the temperature of the at least one optical element $M_k$ to a temperature $T_k$ as shown in FIG. 5 in which like references designate the same or similar parts as in FIG. 4. On the heatable optical element $M_k$ a spatial temperature distribution $\Delta T(x,y,z)=(T(x,y,z)-T_{Ref})$ relative to the reference temperature is formed out when the projection lens is exposed with the exposure power and if the heater 300 is not activated or heated. This distribution has an average temperature $\Delta T_{av}$ as defined above.

The at last one heated optical element $M_k$ may be connected to a support structure in the same way as shown in FIG. 4. In addition the mirror body $MB_k$ of the at least one heated reflective optical element $M_k$ comprises a material with a temperature dependent coefficient of thermal expansion which is zero at a temperature $T_{0k}$ (this temperature is also called zero cross temperature) which is higher than the reference temperature $T_{Ref}$. Due to the preferred reference temperature of $T_{Ref}=22°$ C. the preferred zero cross temperature $T_{0k}$ is between 22° C. and about 70° C. As already mentioned such materials are e.g. Zerodur® or ULE®. The relation of the temperature $T_k$ of the at least one temperature controlled or heatable optical element $M_k$ to the zero cross temperature $T_{0k}$ and to the reference temperature $T_{Ref}$ is such that $T_k$ is selected from the group consisting of $T_k=T_{0k}-\Delta T_{av}$; $T_k=2*T_{0k}-T_{Ref}-\Delta T_{av}$; $T_k=T_{Ref}+3*(T_{0k}-T_{Ref})/2-\Delta_{av}$; $T_k=T_{0k}-\Delta T_{max}$; $T_k=2*T_{0k}-T_{Ref}-\Delta T_{max}$; $T_k=T_{Ref}+3*(T_{0k}-T_{Ref})/2-\Delta T_{max}$. This temperature $T_k$ preferably is achieved before the formation of the temperature distribution $\Delta T(x,y,z)$ on the optical element $M_k$, whereas the temperature distribution results from the heating when the optical element is subjected to the EUV light during the operation mode of the projection system. This has the advantage that the reflective element $M_k$ is such close to the zero cross temperature that the EUV light of the projection beam which is absorbed by the mirror or reflective element $M_k$ will heat it up to about the zero cross temperature. The advantage of the invention is that the zero cross temperature can be selected quite free, since the application of the heater 300 allows that the mirror can be operated at the favorable zero cross temperature during the projection process. As an alternative, if $\Delta T_{av}$ is small like about 1K than $T_k$ can also be the zero cross temperature $T_0$.

This means that the temperature $T_k$ is controlled by the temperature control system 200 to such a temperature with the heater 300 (see FIG. 5). Preferably the heater heats the mirror $M_k$ homogenously to such a constant temperature value. The temperature $T_k$ is the operation temperature of the mirror $M_k$ in an operation mode of the EUV lithographic exposure system in which the power of the EUV light off. Switching the power of the EUV light to an exposure power which is usually used for the projection of the object field on a reticle onto an the image field on the substrate in an mass production operation mode of the lithographic exposure system then the temperature of the reflective optical element or mirror $M_k$ is increasing by the average temperature $\Delta T_{av}$ to or close to the zero cross temperature $T_0$. As mentioned, preferably the temperature $T_k$ is already controlled to its value before the EUV light is switched on. In a preferred embodiment the heater is controlled such that the thermal energy to which the mirror $M_k$ is subjected is constant. This means that if e.g. the mirror absorbs some other energy, e.g. some EUV light, then the heater reduces its heating power such that the total input of thermal energy onto the mirror is constant in time. This results in that the average temperature of the mirror is also constant or almost constant in time. A more detailed description of the various preferred values of $T_k$ will be given below.

Figure 3L:
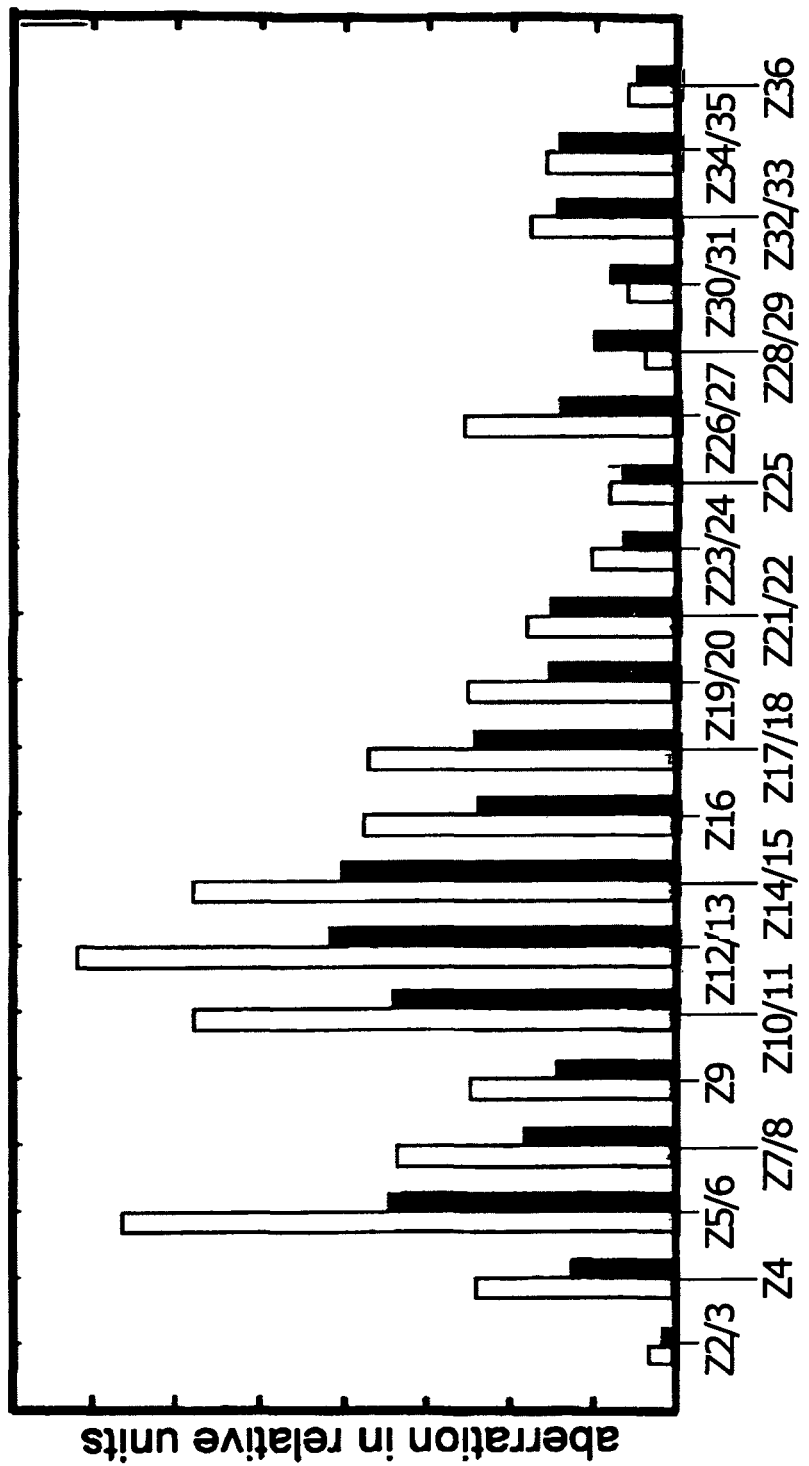
FIG. 3L shows values of the Zernike-coefficients for the mirror $M_6$ of FIG. 3H to FIG. 3K in relative units.

The temperature $T_k$ may be controlled at the reflective surface $MS_k$ or at the mirror body $MB_k$. The above given relations between the temperatures $T_{0k}$ (the zero cross temperature), the operation temperature $T_k$ of mirror $M_K$ (or in general the reflective optical element) and the reference temperature $T_{Ref}$ of the support structure as well as the average temperature $\Delta T_{av}$ result in very small length variations or surface figure variations of the reflective optical element $M_k$ for most practical cases, and the aberration or image errors are significantly reduced, as shown in FIGS. 3G and 3L, in which the temperature $T_k$ is controlled to about $T_k=T_{0k}-\Delta T_{av}$ and $T_k=T_{Ref}+3*(T_{0k}-T_{Ref})/2-\Delta T_{av}$.

The equation $T_k=T_{Ref}+3*(T_{0k}-T_{Ref})/2-\Delta T_{av}$ is also considering that there is also a temperature distribution in the thickness- or z-direction of the mirror and not only on the surface of the mirror. If it is assumed that on the side of the reflective surface there is the temperature $T_k$, e.g. at the periphery of the mirror, and if at the backside of the mirror there is the reference temperature $T_{Ref}$ due to any thermal conduction e.g. of the support structure which is at this temperature, then a good temperature for $T_k$ is given by $T_k=2*T_{0k}-T_{Ref}-\Delta T_{av}$. However, the accuracy of the temperature control system or the accuracy with which the temperature $T_k$ is controllable will also influence the aberration or imaging errors. If the accuracy of the temperature of the body $MB_k$ of the reflective optical element $M_k$ is within $\Delta\pm1K$ due to the temperature control and other system variations then the relative change of the length is normally less than about 10 ppb as it can be schematically seen by reference numeral 303 in FIG. 3C. However, this assumes that the operation temperature can be chosen between about $T_{Ref}+(T_{0k}-T_{Ref})/2$ and $T_{Ref}+3*(T_{0k}-T_{Ref})/2$. As it can be seen from FIG. 3C, if the operation temperature is too close to the reference temperature $T_{Ref}$, or in general too far from the zero cross temperature $T_{0k}$, then the relative change of the length is much more than 10 ppb as shown by the reference numerals 304 and 305. In such cases there is significant risk of mirror deformation due to deformation of the body $MB_k$, resulting in a deterioration of the optical performance of the system. For these reason the operation temperatures $T_k=T_{0k}-\Delta T_{av}$ and $T_k=T_{Ref}+3*(T_{0k}-T_{Ref})/2-\Delta T_{av}$ are preferred, especially if they are within the interval $[T_{Ref}+T_0)/2; T_{Ref}+3*(T_{0k}-T_{Ref})/2]$.

Further it is advantageous to select a material such that the zero cross temperature of the material for the mirror body $MB_k$ is higher than according to any design calculations or simulations which are used for the design of the projection lens. In these calculations any fluctuations of the surrounding temperature, variations in design assumptions for the lens design, the EUV light source and also the variations of reticle reflections may be considered which results in the calculation of the maximum or average temperature of the mirror $M_k$ when the EUV projection lens is designed. If the zero cross temperature is selected several Kelvin higher than the calculated values then the EUV lens can be operated under all conditions at the preferred temperature close to the zero cross temperature at which the aberration is minimized. This operation temperature of the mirror may be achieved by a homogenous and controlled heating with the heater 300 and the controller 200. For the heater 300 various embodiments can be used. Examples are heating elements formed out as metal plates and arranged closed to the mirror, preferably close to the backside of the mirror. Such plates are electrically heated. Alternative or in addition electrical heating elements are in direct contact with the mirror body. A further alternative or additional heater comprises an infrared source with which the mirror or reflective element is illuminated.

Further, the temperature control system 200 may comprise a sensor which directly measures the mirror temperature $T_k$ at one or several positions. In further embodiments of the invention the temperature $T_k$ of the at least one optical element $M_k$ which is controlled by the temperature control system can be a temperature $T_{MSk}$ of the reflective surface $MS_k$ (FIG. 5) of the optical element $M_k$ or a temperature $T_{MBk}$ of the body $MB_k$ of the optical element $M_k$. Alternative $T_k$ can be a temperature given by a function of the temperature $T_{MBk}$ of the body $MB_k$ and/or the temperature of the reflective surface $MS_k$. Further, the temperature of the reflective surface $T_{MSk}$ can be an average surface temperature. Such averaging can e.g. be done by measuring the surface temperature with an infrared camera or by a space-resolving pyrometer. Also the temperature of the body $T_{MBk}$ can be an average temperature of a plurality of temperatures measured at a plurality of spatial positions at the body $MB_k$.

Preferably the spatial positions or a subset of the spatial positions at which the temperature of the mirror body is measured is arranged close to the reflective surface. By the controller 200 a temperature value or control parameter can be calculated from the measurements of the temperature or the temperatures of the reflective surface and/or the body. As a further alternative, as mentioned above, the temperature $T_k$ for the control system is selected from a spatial temperature distribution of the body $MB_k$ or the reflective surface $T_{MSk}$. Depending on whether the temperature of the optical element $M_k$ is measured at one or several locations and whether the temperature control system comprises one or more input channels for the temperature signals, one of the mentioned temperature control option is selected. As an alternative or in addition, the optical aberration can be determined and the temperature controller 200 controls the mirror temperature such that the aberration becomes a minimum. For the temperature control or the control of the aberration the temperature $T_k$ not necessarily explicitly has to be determined. Also a model based controller can be used the control the temperature of the mirror or the heat of the heater which is transferred to the mirror. The model may consider parameters like the power of EUV light to which the lens is exposed, illumination settings with which a reticle is illuminated, the structures on the reticle and the optical aberration of the lens.

In a further embodiment the EUV light of the illuminated reticle comprises a spatial distribution of angular, polarization and intensity in accordance with an illumination setting. This usually results in a spatial temperature distribution $\Delta T(x,y,z)=(T(x,y,z)-T_{Ref})$ relative to the reference temperature $T_{Ref}$. This temperature distribution usually has an average temperature $\Delta T_{kav}$ and a maximum temperature $\Delta T_{kmax}=(T_{Ref}+\Delta T_{kmax})$. It should be mentioned that this temperature distribution is formed out on the reflective surface $MS_k$ of the heatable optical element $M_k$ when the projection lens is exposed with the exposure power without heating the heater.

As an alternative to the above described selections of the temperature $T_k$, the temperature $T_k$ is selected as $T_k=(T_{0k}+T_{Ref}+\Delta T_{kmax})/2$ after the determination of the temperature distribution. Depending on $\Delta T_{kmax}$ this selection has the advantage that the heated optical element is heated closer to the zero cross temperature in cases if the zero cross temperature is higher than the maximum temperature $T_{kmax}=T_{Ref}+\Delta T_{kmax}$ As mentioned above $T_k$ may be the temperature $T_{MBk}$ of the body $MB_k$ of the optical element $M_k$, the temperature given by a function of the temperature $T_{MBk}$ of the body $MB_k$ and the temperature $T_{MSk}$ of the reflective surface $MS_k$ or the temperature selected from a spatial temperature distribution of the body $MB_k$ or the reflective surface $T_{MSk}$, before the power of the EUV light of the projection beam 4 is switched on.

In a further embodiment of the projection lens in accordance with this invention the temperature $T_k$ of the optical element $M_k$ is controlled to its value by heating the heater with a first heating power at a time before the projection lens is subjected to the exposure power of the EUV light. This has the advantage that the operation temperature of the optical element $T_k$ before the exposure with EUV light is very close to the operation temperature during the exposure. This results in that the changes of aberration errors as a function of exposure time can be significantly reduced and the projection system is much quicker in a steady state working condition in which the imaging quality will almost not change. Preferably during exposure (during the time subjecting the projection lens to the exposure power of the EUV light) the heating power of the heater is less than the first heating power. This is to prevent a warming up of the optical element $M_k$.

In a further embodiment of the projection lens according to this invention a second heater for the heating of a second optical element $M_{2k}$ to a temperature $T_{2k}$ is used, wherein the body $MB_{2k}$ of the second optical element $M_{2k}$ also comprises a material with a temperature dependent coefficient of thermal expansion which is zero at a temperature $T_{02k}$ higher than the reference temperature. On the second optical element a second spatial temperature distribution $\Delta T_2(x,y,z) = (T_2(x,y,z) - T_{Ref})$ relative to the reference temperature $T_{Ref}$ is formed out when the projection lens is exposed with the exposure power without heating the second heater, having an average temperature $\Delta T_{2av}$ and a maximum temperature $\Delta T_{2max}$. Analogous to the embodiment described above, also in connection with FIG. 3C, the temperature $T_{2k}$ of the second optical element $M_{2k}$ is selected according to the same relations as described above for the operation temperature $T_k$ of the first heated mirror $M_k$. This means that the operation temperature $T_{2k}$ of the second optical element $M_{2k}$ is preferably selected from the group consisting of: $T_{2k} = T_{02k} - \Delta T_{2av}$; $T_{2k} = 2*T_{02k} - T_{Ref} - \Delta T_{2av}$; $T_{2k} = T_{Ref} + 3*(T_{02k} - T_{Ref})/2 - \Delta T_{2av}$; $T_{2k} = T_{02k} - \Delta T_{2max}$; $T_{2k} = 2*T_{02k} - T_{Ref} - \Delta T_{2max}$; $T_{2k} = T_{Ref} + 3*(T_{02k} - T_{Ref})/2 - \Delta T_{2max}$. Then the optical element or mirror $M_{2k}$ is, or preferably is heated to such a temperature $T_{2k}$ before the power of the EUV light of the projection beam 4 is switched on. In this embodiment the material of the body $MB_{2k}$ may be the same or different from the material of the body $MB_k$ of the first optical element. In the first case of the same material, preferably the material has a different zero cross temperature than for the first reflective element $M_k$ may be selected such that the CTE (T)-function (see e.g. FIG. 2B) has different algebraic signs for the slopes at the respective zero cross temperatures. This requires that the material comprises at least two zero cross temperatures $T_0$ and $T_{02}$, as shown in FIG. 2B for a Zerodur® material. An example for different materials is the usage of ULE® for one optical element and Zerodur® for the other. Also in this case preferably the algebraic signs for the slopes at the respective zero cross temperatures are different. This advantageously can be used as a further measure to reduce aberration, as is described e.g. in US 2005/0074552.

Figure 7:
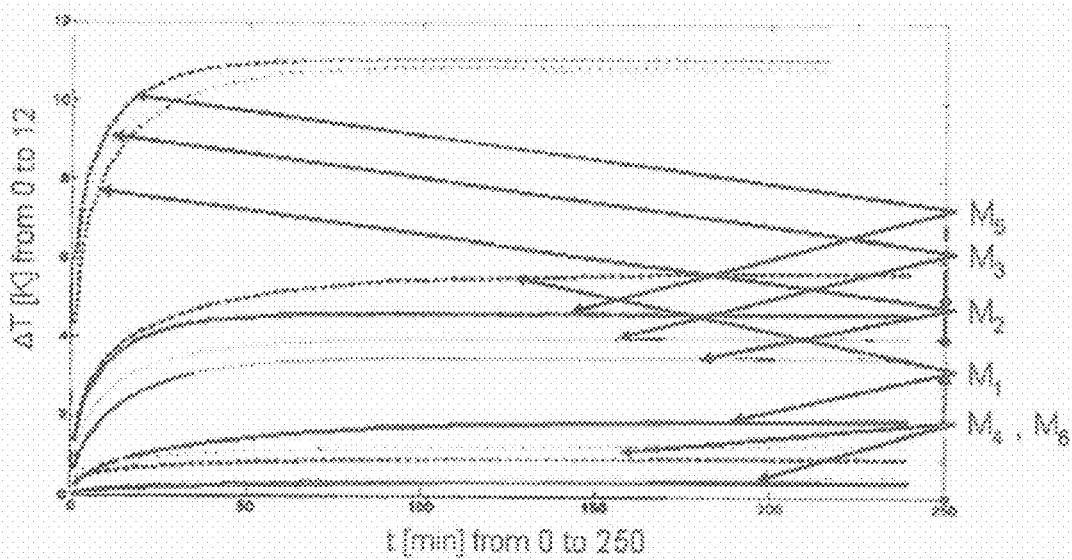
FIG. 7 shows an example for a warming-up of the six mirrors of the projection lens shown in FIG. 6, if such a lens is exposed with an EUV projection beam which has a power of 16 W after the reticle M.

FIG. 6 shows an additional schematic arrangement of an EUV-projection lens which comprise 6 mirrors as reflective optical elements $M_1$ to $M_6$ which are respectively designated with reference numerals 21, 22, 23, 24, 25 and 26. In FIG. 6 like references designate the same or similar parts as in FIG. 1. Further, the mirrors are numbered as they are arranged in the downstream direction of the projection beam 4 which goes from the reticle M to the wafer W. If such a EUV projection lens 20 as shown e.g. in FIG. 1 or FIG. 6 is exposed with EUV light to project an object point OP to an image point IP on the wafer W then the individual mirrors are warmed up. Preferably, before the EUV light is switched on, these mirrors are at the reference temperature $T_{Ref}$ of e.g. 22° C. FIG. 7 shows an example for a warming of the six mirror of the projection lens 20 of FIG. 6, if such a lens is exposed with a projection beam 4 which has a power of 16 W after the reticle M. For the generation of this power a light source power of more than 1 kW is necessary for the light source 1 (see FIG. 1). The shown diagram is a simulation calculation in which the reticle is illuminated with a dipole illumination setting which gives a temperature distribution on the last mirror $M_6$ similar as shown in FIG. 3H. The dipole can be seen on the mirror, since this mirror is arranged nearby or at a pupil plane of the projection lens 20.

In FIG. 7 for each of the 6 mirrors the average temperature $\Delta T_{av}$, which is the respective lower curve, is shown as a function of time. The average temperatures are calculated as defined above. Also for each mirror the maximum temperature $\Delta T_{max}$ of the temperature distribution $\Delta T(x,y,z)$ is shown as a function of time which is represented by the respective upper curve for each mirror. It can be seen that the thermal load for the mirrors $M_5$, $M_3$ and $M_2$ is such that these mirrors warm up of about 4.5K, 4.0K and 3.5K respectively. $M_1$ warms up of about 2K and $M_4$, $M_6$ warm up of about 0.5K. Further, it can be seen that the mirrors need about 150 minutes or more to reach an almost constant steady state temperature. During this time the effective position of the reflective surfaces and the surface figures of these surfaces will change, as explained with FIGS. 3A to 3C. This results in optical aberration as described above, since the average temperatures are changing in time relative to the respective zero cross temperatures. However, the lens 20 may be optimized for the steady state condition. This means that the zero cross temperature for the mirrors is selected such that it is the steady state temperature or almost the steady state temperature, meaning $T_{0i} = (T_{avi} + T_{Ref})$ for the i-th mirror (i=1 to 6). In this case the aberration is minimized as described in connection with FIGS. 3A to 3C. If the mirror is fabricated regarding its surface figure at a temperature of about 22° C. (or in general at or close to a reference temperature) then this surface figure remains almost the same even if the mirror is homogenously heated to the such selected zero cross temperature as it was explained in connection with FIG. 3A. Further, if the mirror has a spatial temperature distribution $T(x,y,z)$ due to the absorbed power of the projection beam 4 then the aberration generated by this absorption is also minimized as explained in FIGS. 3B and 3C. Practically the suggested optimization (by material selection) of the zero cross temperatures has the following drawbacks:

1. The steady state temperature depends on the power of the light source, on the illuminated reticle and the used illumination setting with which the reticle is illuminated.

2. The manufacturing of the mirror material with a specified zero cross temperature is very expensive. In addition, there are manufacturing tolerances such that the specified zero cross temperature only can be achieved by selecting out the required material from a larger set of materials, having the manufacturing tolerances. This would be extremely expensive. In US 2003/0125184 A1 the difficulties of the production of Zerodur® with certain predefined zero cross temperatures are described. Further, also the difficulties concerning the determination of the zero cross temperature is shown.

3. There will be unacceptable aberration during the warm up phase within the about first 2 to 3 hours in which the EUV-lens could not be used for mass production of microstructured objects.

Figure 8:
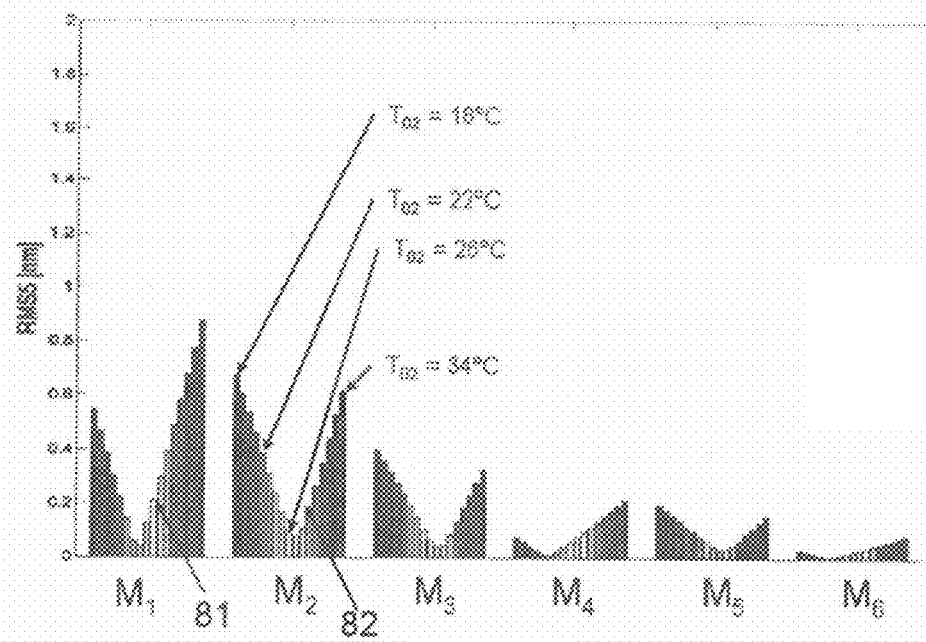
FIG. 8 shows the aberration for each mirror of the projection lens of FIG. 6 expressed by the Zernike-coefficient Z5. Z5 is given by its RMS (root mean square) value as a function of the zero cross temperature when each mirror of the projection lens is in the steady state as described in FIG. 7.

The influence of the above drawbacks on aberration can be seen in FIG. 8. FIG. 8 shows the aberration in form of the Zernike-coefficient Z5. For Z5 its RMS (root mean square) value is given for each of the 6 mirrors of the lens which is shown in FIG. 6. Z5 is shown as a function of the zero cross temperature if each mirror of the projection lens is in the steady state as described in FIG. 7. The bars for each mirror show how the aberration increases if the zero cross temperature is selected higher or lower. The calculations were done in 1K steps for zero cross temperatures from 18° C. (left most bar) to 34° C. (right most bar). For $M_2$, which has a steady state temperature of about 25.5° C. ($T_{av\,2}$=3.5K with $T_{Ref}$=22° C.), the aberration values for various zero cross temperatures are shown e.g. by the shown arrows with the respective zero cross temperature data. The best zero cross temperature in accordance to FIG. 8 should be between 26° C. and 27° C. which is in good agreement that lowest aberration should be achieved if the steady state temperature (25.5° C.) corresponds to the zero cross temperature. FIG. 8 clearly shows that if the steady state temperature of a mirror doses not match with the zero cross temperature within about ±1K then the aberration will increase. Since the steady state temperature $T_{Ref}$+$\Delta T_{av}$ depends on the power of the EUV light source, on the used illumination setting, the used reticle and some other aspects, it seems impossible to construct an EUV-lens such that under all the mentioned working conditions the aberration can be brought to a minimum, since if the mirror materials are selected then the zero cross temperatures are fixed.

Also in FIG. 8 the influence of the manufacturing tolerances regarding the zero cross temperatures $T_{0k}$ can be seen. If e.g. for mirror $M_2$ a zero cross temperature of 27° C. would minimize aberration, and if the produced material has a zero cross temperature $T_{02}$=29° C. this will almost double the aberration. For mirror $M_1$ a deviation of 2K from the best zero cross temperature will result in even higher aberrations, as shown with the arrows 81 and 82.

Figure 9:
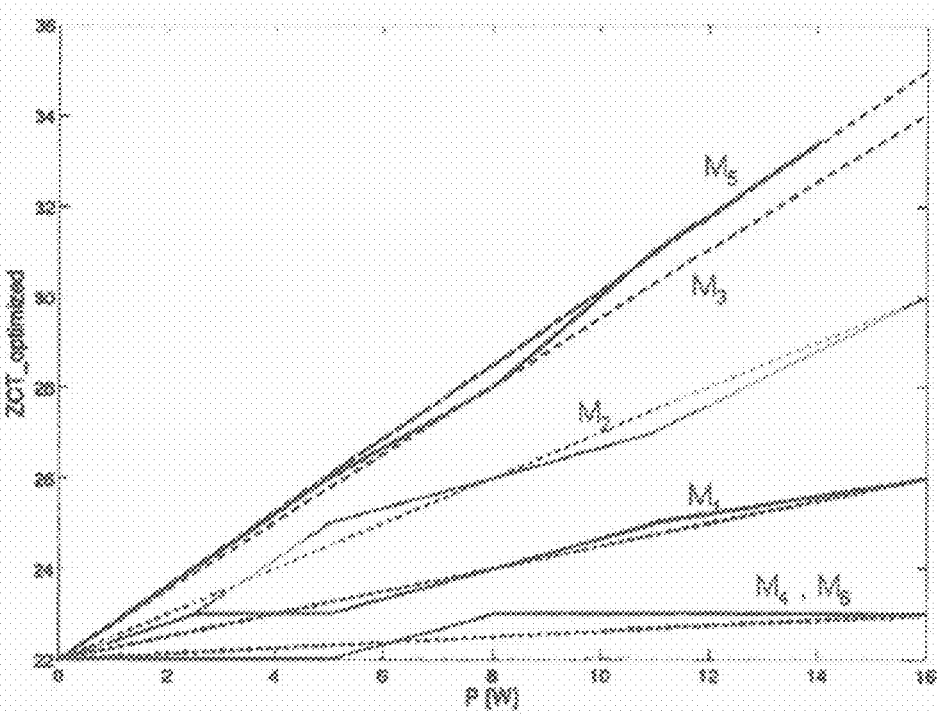
FIG. 9 shows the optimized zero cross temperature as a function of the EUV light power P after the reticle M to which the EUV lens of FIG. 6 is subjected during a projection process.

FIG. 9 shows the optimized zero cross temperature as a function of the EUV light power P after the reticle M to which the EUV lens 20 is subjected during projection. The calculation is done for settings which produce the largest aberrations. It can be seen that the optimized zero cross temperature $T_{0i}$ for all mirrors increase in good approximation linearly with power P. The calculation was done up to 16 W and ULE® was chosen as mirror material for all 6 mirrors as for the calculations of FIG. 7 and FIG. 8. Further, it can be seen that the variation of the zero cross temperatures within one EUV lens also increases with power, if the manufactured lens 20 shall be optimized regarding optical aberration. This means that different materials have to be used for the production of the mirrors, having different zero cross temperatures with a broad variation. This makes the manufacturing also very expensive. Further, the inventors realize for the first time that for higher exposure powers the zero cross temperatures within a projection lens must differ more than 6K, even more than 8K, if the EUV lens is optimized to the EUV light power and aberration. For this reason preferably in a further embodiment of the above described embodiments of the inventive projection lens the absolute value of the difference between the zero cross temperatures $T_{0k}$, $T_{02k}$ of the heatable optical element and the second heatable optical element is selected such that it is more than 6K, expresses as abs($T_{0k}$−$T_{02k}$)>6K. With such a projection lens advantageously the optical aberration (caused by thermal effects due to absorption of EUV light at the optical elements) can be reduced even at higher EUV light powers. In a further embodiment of the above described inventive projection lenses the zero cross temperature $T_{0k}$ of the at least one heatable optical element $M_k$ is higher than the maximum of the highest reference temperature $T_{Ref}$ and the average or maximum temperature $\Delta T_{av}$+$T_{Ref}$ or $\Delta T_{max}$+$T_{Ref}$ based on the respective spatial temperature distribution $\Delta T(x,y,z)$, expressed as $T_{0k}$>max($T_{Ref}$, $\Delta T_{av}$+$T_{Ref}$) or $T_{0k}$>max($T_{Ref}$, $\Delta T_{max}$+$T_{Ref}$). This has the advantage that with the heater 300 the at least one heatable optical element can be heated up to the zero cross temperature independently of the EUV light power (and the reference temperature) used during the projection process.

Such the optical aberration can be minimized for all operation conditions of the projection lens 20. The teaching of the inventive embodiments described above is independent of the number of mirrors. It can be applied e.g. to a projection lens 20 as shown in FIG. 1, having 4 mirrors 21, 22, 23 and 24, or to a projection lens 20 as shown in FIG. 6, comprising 6 mirrors 21, 22, 23, 24, 25 and 26.

Figure 13:
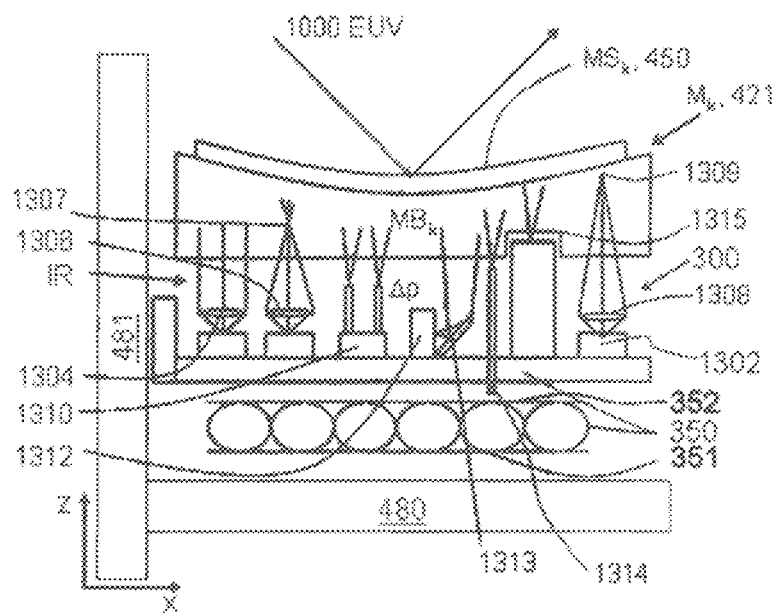
FIG. 13 schematically shows several embodiments of heaters or tempering means 300 in relation with a reflective element or mirror $M_k$, 421.

Further, to minimize the optical aberration especially in projection lenses 20 in which at least one mirror or optical element $M_k$ is heated by a heater 300, it is advantageous to connect the at least one heated optical element $M_k$ to an actuator for its translational movement. This allows to shift the mirror $M_k$ to compensate a homogeneous heating of the mirror $M_k$ as it was described in connection with FIG. 3A. Further, the heater 300 for heating the mirror or optical element $M_k$ advantageously comprises heating elements selected from the group consisting of IR light emitting diodes, Peltier elements, optical fibers, light guide rods and IR lasers, as will be described in more detail below with the description of FIG. 13. Further, such heating elements are optionally arranged in one dimension or in two dimensions at predefined spatial coordinates, forming a grid structure. Advantageously in the embodiments in which the heating elements are emitting or guiding IR radiation, these embodiments comprise an optical arrangement to configure the IR radiation, the optical arrangement comprises arrangement elements selected from the group consisting of collimator, focusing lens, adjustable lens, mirror and diffractive optical element, wherein the arrangement elements may be tiltable around at least on axis. Examples of such optical arrangements are shown in FIG. 13.

Further, in an alternative embodiment of the above described projection lenses the at least one optical element $M_k$ comprises a modification in or on the mirror body $MB_k$. The modification is selected from the group consisting of recess, blind hole, defined surface roughness, diffractive structure, spherical protrusion, spherical recess and surface curvature. The modification, which is described in more detail below in connection with FIG. 13, advantageously is used to guide e.g. IR radiation to heat the optical element locally.

Due to the above finding that for higher exposure powers the zero cross temperatures of the mirrors within a projection lens must differ by 6K or more, the present invention also relates to a further, projection lens, in the following called first projection lens, which is designed to be exposed with an exposure power of more than 8 W of EUV light with a wavelength in a wavelength range of less than 50 nm, preferably with a wavelength of 13 nm. The calculations for FIG. 7, FIG. 8 and FIG. 9 were done with 13 nm and for a lens 20 with 6 mirrors, as shown in FIG. 6. Generally such a lens comprises at least two reflective optical elements $M_i$ like mirrors. Each mirror or reflective optical element comprises a body $MB_i$ and a reflective surface $MS_i$ to project an object field on a reticle onto an image field on a substrate if the projection lens is exposed with the exposure power of the EUV light. This light is reflected from the reticle after the reticle is illuminated by an illumination system of an EUV-lithographic projection exposure system. Further, the bodies $MB_m$, $MB_n$ of at least two reflective optical elements comprise a material with a temperature dependent coefficient of thermal expansion which is zero at respective zero cross temperatures $T_{0m}$, $T_{0n}$, wherein the absolute value of the difference between the zero cross temperatures $T_{0m}$, $T_{0n}$ in this first projection lens is more than 6K, expresses as abs($T_{0m}$−$T_{0n}$)>6K. This is e.g. the case for mirror $M_5$ and mirrors $M_4$ or $M_6$ if the lens is subjected an exposure power of 8 W or more, as can be seen from FIG. 8.

As a further second embodiment of such a first projection lens the lens can comprise four or six reflective optical elements $M_i$ or mirrors (as e.g. shown in FIG. 1 and in FIG. 6) and preferably the projection lens is designed to be exposed with an exposure power of more than 10 W. In this case the absolute value of the difference between the zero cross temperatures $T_{0m}$, $T_{0n}$ is more than 8K, expresses as abs($T_{0m}-T_{0n}$)>8K. For the 6-mirror lens 20 of FIG. 6, FIG. 9 clearly shows this for the mirrors $M_5$ and $M_4$ or $M_6$. The zero cross temperatures of these mirrors differ by more than 8 K if the exposure power goes above 10 W.

The first projection lens and its previous embodiments in a third embodiment may comprise a support structure for passively or actively supporting the reflective optical elements $M_i$, as it was described in connection with FIG. 4 and FIG. 5. The temperature of at least a part of the support structure is at a reference temperature $T_{Ref}$, which is e.g. selected as 22° C. Further, the lens in accordance with an embodiment of the first lens comprises a heater 300 for heating at least one of the mirror bodies $MB_n$, $MB_m$ which comprise the materials with the different zero cross temperatures. A temperature control system 200 controls the temperature of the at least one heated mirror body $MB_n$, $MB_m$ to a temperature $T_k$.

Preferably the heater 300 is made such that the body can be homogenously heated. This means that the body $MB_n$, $MB_m$ is homogenously heated in at least one dimension of the body. Various types of heaters 300 will be described below in this description.

In an further fourth embodiment of the first lens (and its previous embodiments), there, without the operation of the just mentioned heater 300, the exposure of the reflective surfaces $MS_m$ and $MS_n$ of the bodies $MB_n$, $MB_m$ with EUV light, results in temperature distributions $\Delta T_n(x,y,z)=(T_n(x,y,z)-T_{Ref})$, $\Delta T_m(x,y,z)=(T_m(x,y,z)-T_{Ref})$ of the bodies $MB_n$, $MB_m$ relative to the reference temperature $T_{Ref}$ with respective average and maximum temperatures $\Delta T_{nav}$, $\Delta T_{mav}$ and $\Delta T_{nmax}$ and $\Delta T_{mmax}$. The EUV light with which the reflective surfaces $MS_m$ and $MS_n$ are exposed is reflected by the illuminated reticle and comprises a spatial distribution of angular, polarization and intensity parameters in accordance with an illumination setting. In this embodiment at least one zero cross temperatures $T_{0m}$, $T_{0n}$ is selected higher than the maximum of the highest reference temperature $T_{Ref}$ and the respective average or maximum temperature $\Delta T_{mav}+T_{ref}$ or $\Delta T_{mmax}+T_{ref}$, $\Delta T_{nav}+T_{ref}$ or $\Delta T_{nmax}+T_{ref}$, based on the respective spatial temperature distribution $\Delta T_m(x,y,z)$, $\Delta T_n(x,y,z)$, expressed as $T_{0m}>$max($T_{Ref}$, $\Delta T_{mav}+T_{ref}$), $T_{0m}>$max ($T_{Ref}$, $\Delta T_{mmax}+T_{ref}$) or $T_{0n}>$max($T_{Ref}$, $\Delta T_{nav}+T_{Ref}$), $T_{0n}>$max($T_{Ref}$, $\Delta T_{nmax}+T_{ref}$).

Usually the reference temperature is constant and is chosen as the temperature of the support element 480 or the housing structure 481 (see FIGS. 4 and 5). Often the backside of the mirror also has this temperature even if the lens is subjected to the exposure power of the EUV light. The advantage of this selection of the zero cross temperature is that with the usage of the heater 300 the respective mirror always can be brought to the zero cross temperature by heating. This is because usually, without the application of the heater 300, the mirror only heats to an average temperature as explained with FIG. 7. If the zero cross temperature is adapted to this temperature then the optical aberration becomes minimal, as it was described in connection with FIG. 3A and FIG. 3B. However, if the zero cross temperature is selected higher than the absolute average temperature $T_{Ref}+\Delta T_{mav}$ or $T_{Ref}+\Delta T_{nav}$ then by heating the mirror with the additional heater 300 it can be heated to or close to the selected zero cross temperature to minimize aberration.

In a further 5$^{th}$ embodiment of the first projection lens (and its previous embodiments) also the manufacturing tolerances of the zero cross temperature is taken into account. This means that if the materials of the first projection lens according to this invention, which comprises materials with the zero cross temperatures $T_{0m}$, $T_{0n}$, vary regarding their real values of the zero cross temperature due to the manufacturing process, resulting in manufacturing tolerances $\Delta T_{0m}$, $\Delta T_{0n}$, then the respective real values are within the temperature intervals $T_{0m}\pm\Delta T_{0m}$ and $T_{0n}\pm\Delta T_{0n}$. In this case advantageously at least one zero cross temperatures $T_{0m}$, $T_{0n}$ is selected higher than the maximum of the highest reference temperature $T_{Ref}$ and the respective absolute average or maximum temperature $\Delta T_{mav}+T_{Ref}$ or $\Delta T_{mmax}+T_{Ref}$, $\Delta_{nav}+T_{Ref}$ or $\Delta T_{nmax}+T_{Ref}$, based on the respective spatial temperature distribution $\Delta T_m(x,y,z)$, $\Delta T_n(x,y,z)$, but in addition, these values are increased by the absolute value of the respective manufacturing tolerances $\Delta T_{0m}$, $\Delta T_{0n}$, expressed as $T_{0m}>$max($T_{Ref}$, $\Delta T_{mav}+T_{Ref}$)+$|\Delta T_{0m}|$, $T_{0m}>$max($T_{Ref}$, $\Delta T_{mmax}+T_{Ref}$)+$|\Delta T_{0m}|$ or $T_{0n}>$max($T_{Ref}$, $\Delta T_{nav}+T_{Ref}$)+$|\Delta T_{0n}|$, $T_{0n}>$max($T_{Ref}$, $\Delta T_{nmax}+T_{Ref}$)+$|\Delta T_{0n}|$. Such a material selection regarding the zero cross material has the big advantage that the specification regarding the zero cross temperature can be relaxed, because the heater 300 guaranties that the respective heatable reflective optical element with the selected zero cross temperature can be heated to or close to the zero cross temperature by additional heating and such the aberration can be minimized. Preferably but not necessarily, the heating is done such that the mirror is homogenously heated. This simplification regarding the material selection results in enormous cost savings. If the maximum temperatures $\Delta T_{nmax}$ and $\Delta T_{mmax}$ instead of the average temperatures $\Delta T_{nav}$, $\Delta T_{mav}$ are chosen for the election of the zero cross temperature, then in the selection process the system is more robust, e.g. regarding changes in exposure powers to higher values.

In a further 6$^{th}$ preferred embodiment of the first lens (and its previous embodiments) the temperature of the heated mirror bodies or the heated mirror body $MB_n$, $MB_m$ is controlled to values of the temperature $T_k$ which are within an interval of ±5K, better ±2K centered around the respective zero cross temperature $T_{0m}$, $T_{0n}$ to minimize any thermal induced optical aberration.

The above mentioned item 3 of the drawbacks that the system cannot be used in the warm-up phase if the zero cross temperatures are optimized to the steady state, as e.g. shown in FIG. 7, can be solved by the 3$^{rd}$ to 6$^{th}$ embodiments of the first EUV lens of this invention, due to the usage of the heater 300. To also solve this drawback, in a 7$^{th}$ embodiment of the first lens in accordance to one of its 3rd to 6$^{th}$ embodiments the projection lens 20 is heated at a time before the projection lens is exposed with the exposure power of the EUV light. There the temperature $T_k$ of the at least one heated body $MB_n$, $MB_m$ of the reflective optical elements $M_n$, $M_m$ is controlled to its value by heating the heater 300 with a first heating power. Preferably the temperature $T_k$ is selected from the values of the above 3$^{rd}$ to 6$^{th}$ embodiment of the first projection lens. Depending on the values of the zero cross temperatures and the power of the exposure light to which the EUV lens is subjected, in a 8$^{th}$ embodiment of the first lens the heating power of the heater is selected lower than the first heating power, as mentioned in the 7$^{th}$ embodiment, during the time of exposure of the projection lens 20 with the exposure power of the EUV light.

In a preferred $9^{th}$ embodiment of the first lens the temperature control system 200 controls the temperature $T_k$ such that the heating power of the heater 300, which heats the at least one body $MB_n$, $MB_m$ of the reflective optical elements $M_n$, $M_m$, and the exposure power of the EUV light which is absorbed by the at least one heated body $MB_n$, $MB_m$ is constant or is almost constant in time. Advantageously this will result in minimal temperature fluctuations of the mirror body and such the thermal induced optical aberration is minimized too.

The first lens and it various embodiments essentially make use of materials for the reflective optical elements or mirrors which differ significantly regarding its zeros cross temperature. It shall be mentioned that the present invention of the first lens and its various embodiments are not limited to EUV projection lenses with 4 or 6 reflective optical elements in form of mirrors, as described in FIG. 4 and FIG. 6. It is assumed that the number of mirrors of an EUV projection lens of a lithographic projection exposure apparatus increases to more than 6 if the EUV power of the EUV exposure light also increases. The EUV light power will depend on the EUV light sources which will be available in future. Generally the number of mirrors may vary in accordance to the requirements, and the principles of the teaching in connection with the first projection lens may be applied to each mirror or to each reflective optical element, especially if used in an EUV lithographic projection exposure apparatus.

Further, to minimize the optical aberration especially in projection lenses 20 according to the first lens of this invention in which at least one mirror or optical element $M_k$ is heated by a heater 300, it is advantageous to connect the at least one heated optical element $M_k$ to an actuator for its translational movement. This allows to shift the mirror $M_k$ to compensate a homogeneous heating of the mirror $M_k$ as it was described in connection with FIG. 3A. Further, the heater 300 for heating the mirror or optical element $M_k$ advantageously comprises heating elements selected from the group consisting of IR light emitting diodes, Peltier elements, optical fibers, light guide rods and IR lasers, as will be described in more detail below with the description of FIG. 13. Further, such heating elements are optionally arranged in one dimension or in two dimensions at predefined spatial coordinates, forming a grid structure. Advantageously in the embodiments in which the heating elements are emitting or guiding IR radiation, these embodiments comprise an optical arrangement to configure the IR radiation, the optical arrangement comprises arrangement elements selected from the group consisting of collimator, focusing lens, adjustable lens, mirror and diffractive optical element, wherein the arrangement elements may be tiltable around at least on axis. Examples of such optical arrangements are shown in FIG. 13.

Further, in an alternative embodiment of the above described first projection lenses the at least one optical element $M_k$ comprises a modification in or on the mirror body $MB_k$. The modification is selected from the group consisting of recess, blind hole, defined surface roughness, diffractive structure, spherical protrusion, spherical recess and surface curvature. The modification, which is described in more detail below in connection with FIG. 13, advantageously is used to guide e.g. IR radiation to heat the optical element locally.

An alternative embodiment to the first lens is a second projection lens for an EUV lithographic exposure system which is described below. The inventors' realized that the usage of a heater 300 will have a significant influence to the lens design, especially to the material selection requirements for the mirror material.

A first embodiment of the second projection lens 20 in accordance with this invention comprises at least two reflective optical elements $M_i$ like mirrors as shown in FIG. 1 and FIG. 6, designated as 21, 22, 23, 24, 25 and 26. Each such element comprises a body $MB_i$ and a reflective surface $MS_i$ for projecting an object field OP on a reticle onto an image field IP on a substrate if the projection lens 20 is exposed with an exposure power of EUV light with a wavelength in a wavelength range of less than 50 nm. Preferably a wavelength of 13 nm is used. The EUV light is reflected from the reticle after illumination by an illumination system of an EUV-lithographic projection exposure system. The bodies $MB_m$, $MB_n$ of at least two reflective optical elements of the lens 20 comprise a material with a temperature dependent coefficient of thermal expansion which is zero at respective zero cross temperatures $T_{0m}$, $T_{0n}$, as e.g. shown in FIGS. 2A and 2B. As an example such materials are Zerodur® or ULE®, but also Superinvar. In addition the second lens comprises a support structure for passively or actively supporting the reflective optical elements $M_i$. Such a support structure was described in detail in connection with FIG. 4 and FIG. 5. The temperature of at least a part of the support structure is at a reference temperature $T_{Ref}$, for example at 22° C. as it is in the embodiments of FIGS. 3A to 3L and FIG. 6. This temperature is close to the temperature of the clean-room. Usually the mirrors or reflective optical elements of the EUV projection lens are specified regarding their surfaces and surface figures also at this reference temperature. Further, the second projection lens comprises a heater 300 for heating at least one of the bodies $MB_n$, $MB_m$ of the reflective optical elements with the zero cross temperatures. Also the second lens comprises a temperature control system 200 for controlling the temperature of the at least one heated body $MB_n$, $MB_m$ to a temperature $T_{km}$, $T_{kn}$. Further, if in the second lens the bodies $MB_n$, $MB_m$ are not heated with the heater, then the exposure of the reflective surfaces $MS_m$ and $MS_n$ with EUV light, which is reflected by the illuminated reticle, results in temperature distributions $\Delta T_n(x,y,z)=(T_n(x,y,z)-T_{Ref})$, $\Delta T_m(x,y,z)=(T_m(x,y,z)-T_{Ref})$ of the bodies $MB_n$, $MB_m$ relative to the reference temperature $T_{Ref}$ with respective average and maximum temperatures $\Delta T_{nav}$, $\Delta T_{mav}$ and $\Delta T_{nmax}$ and $\Delta T_{mmax}$. The EUV-light usually comprises a determined spatial distribution of intensity, angular and polarization parameters which is defined by an illumination setting.

Further, in the second lens at least one zero cross temperatures $T_{0m}$, $T_{0n}$ is selected higher than the maximum of the highest reference temperature $T_{Ref}$ and the respective absolute average or maximum temperature $\Delta T_{mav}+T_{Ref}$ or $\Delta T_{mmax}+T_{Ref}$, $\Delta T_{nav}+T_{Ref}$ or $\Delta T_{nmax}+T_{Ref}$ based on the respective spatial temperature distribution $\Delta T_m(x,y,z)$, $\Delta T_n(x,y,z)$, expressed as $T_{0m}>\max(T_{Ref}, \Delta T_{mav}+T_{ref})$, $T_{0m}>\max(T_{Ref}, \Delta T_{mmax}+T_{Ref})$ or $T_{0n}>\max(T_{Ref}, \Delta T_{nav}+T_{Ref})$, $T_{0n}>\max(T_{Ref}, \Delta T_{nmax}+T_{Ref})$. If the absolute maximum temperature instead of the absolute average temperature is considered in the selection process then the system is more robust, e.g. regarding changes in exposure powers to higher values. The second projection lens according to this invention selects the material for the mirrors or reflective optical elements on the basis of the average or maximum temperature which a mirror may achieve if it is illuminated by the projection beam. Due to the application of a heater, the zero cross temperature can be reached independent of whether the projection lens is operating with low or high EUV light power of the projection beam. Preferably the maximum or average temperatures on the heatable mirror bodies are determined for the maximum power to which the projection lens may be subjected. For the embodiments of the second projection lens according to this invention, for the reference temperature the same can be applied as described in connection with the first projection lens and the description in connection with FIG. 4 and FIG. 5.

To consider the manufacturing tolerance of the zero cross temperatures a $2^{nd}$ embodiment of the second projection lens considers that the materials with the zero cross temperatures $T_{0m}$, $T_{0n}$ may vary regarding the values of the zero cross temperatures due to manufacturing. Usually this results in manufacturing tolerances $\Delta T_{0m}$, $\Delta T_{0n}$ such that the respective real values of the zero cross temperatures are within the intervals $T_{0m} \pm \Delta T_{0m}$ and $T_{0n} \pm \Delta T_{0n}$. If so, it is advantageous to select at least one zero cross temperatures $T_{0m}$, $T_{0n}$ in the second lens higher than the maximum of the highest reference temperature $T_{Ref}$ and the respective average or maximum temperature increased by the reference temperature, resulting in $\Delta T_{mav} + T_{Ref}$ or $\Delta T_{mmax} + T_{Ref}$, $\Delta T_{nav} + T_{Ref}$ or $\Delta T_{nmax} + T_{Ref}$, based on the respective spatial temperature distribution $\Delta T_m(x,y,z)$, $\Delta T_n(x,y,z)$. This maximum is further increased by the absolute value of the respective manufacturing tolerances $\Delta T_{0m}$, $\Delta T_{0n}$, expressed as $T_{0m} > \max(T_{Ref}, \Delta T_{mav} + T_{Ref}) + |\Delta T_{0m}|$, $T_{0m} > \max(T_{Ref}, \Delta T_{mmax} + T_{Ref}) + |\Delta T_{0m}|$ or $T_{0n} > \max(T_{Ref}, \Delta T_{nav} + T_{Ref}) + |\Delta T_{0n}|$, $T_{0n} > \max(T_{Ref}, \Delta T_{nmax} + T_{Ref}) + |\Delta T_{0n}|$. Similar like in the first embodiment of the second lens, instead of the absolute maximum temperatures also the absolute average temperature may be sufficient, but in this case the second lens will be less robust against a raise of temperature of the mirrors which may result from higher exposure power.

In a $3^{rd}$ embodiment of the second projection lens the absolute value of the difference between the zero cross temperatures $T_{0m}$, $T_{0n}$ is more than 6K, expresses as abs $(T_{0n} - T_{0n}) > 6K$. Preferably in this case the second projection lens is designed to be exposed with an exposure power of more than 8 W of EUV light with a wavelength in a wavelength range of less than 50 nm. As already described in connection with the description of the first projection lens of this invention the same advantages are also valid. Preferably the wavelength is in a wavelength interval selected from the group consisting of [12 nm, 14 nm], [12.5 nm, 13.5 nm], [5 nm, 15 nm], [15 nm, 25 nm] and [25 nm, 50 nm]. Such a selection of the wavelength also could be done for the other embodiments of the lenses of the EUV lithographic projection exposure systems which are described in the present specification.

In a $4^{th}$ embodiment of the second projection lens at least four or six reflective optical elements $M_i$ are used. Further the projection lens is designed to be exposed with an exposure power of more than 10 W of EUV light with a wavelength in a wavelength range of less than 50 nm. With higher power of the EUV light usually also the number of mirrors increase. For a power of 16 W usually 6 mirrors are used as shown in FIG. 6. The absolute value of the difference between the zero cross temperatures $T_{0m}$, $T_{0n}$ is more than 8 K in this embodiment, expresses as abs$(T_{0m} - T_{0n}) > 8K$.

A $5^{th}$ embodiment of the second lens in accordance to this invention controls the temperature $T_k$ of the at least one heated body $MB_n$, $MB_m$ within an interval of ±5K, better ±2K centered around the respective zero cross temperature $T_{0m}$, $T_{0n}$ to minimize any thermal induced optical aberration.

In a $6^{th}$ embodiment of the second projection lens at a time before the projection lens is subjected to the exposure power of the EUV light the temperature $T_k$ of the at least one heated body $MB_n$, $MB_m$ is controlled to its value by heating the heater 300 with a first heating power. This is similar to the $7^{th}$ embodiment of the first projection lens and reduces the warm-up phase of the EUV-projection system. Further, in an $7^{th}$ embodiment of the second projection lens the heating power of the $6^{th}$ embodiment is less than the first heating power when the projection lens is exposed to the exposure power of the EUV light. In a more advanced $8^{th}$ embodiment of the second projection lens the temperature control system 200 controls the temperature $T_k$ such that the heating power of the heater 300, which heats the at least one body $MB_n$, $MB_m$, and the exposure power of the EUV light which is absorbed by the at least one heated body is constant in time. This is similar to the respective embodiment of the first projection lens. Constant in time in this context (and also for the other lens embodiments described herein) means that the total power of heat to which the mirror is subjected (e.g. the sum of the heating power of any heater and the absorbed light like EUV light) is only varying within an interval of the total power selected from the group consisting of [0%. 20%], [0%. 10%], [0%. 5%] and [0%. 2%]. This is the case if the EUV source provides EUV light continuously in time, like a synchrotron radiation source. For pulsed EUV sources like plasma EUV light sources, the total power as mentioned above is determined by an average over a number of pulses. The number of pulses is selected such that it is within an interval selected from the group of intervals consisting of [1, 5], [1, 10], [1, 20], [1, 50] and [1, 100] pulses.

In a $9^{th}$ embodiment of the second projection lens the bodies $MB_n$ and $MB_m$ with the respective zero cross temperatures $T_{0m}$, $T_{0n}$ are made of the same material. Further, in a $10^{th}$ embodiment of the second lens the lens comprises 4 or 6 reflective optical elements in form of mirrors. As already mentioned, the number of mirrors also of the second lens may vary in accordance to the requirements and the principles of the teaching in connection with the first and second projection lens may be applied to each mirror or each reflective optical element, especially if used in an EUV lithographic projection exposure apparatus.

Further, to minimize the optical aberration especially in projection lenses 20 according to the second lens of this invention in which at least one mirror or optical element $M_k$ is heated by a heater 300, it is advantageous to connect the at least one heated optical element $M_k$ to an actuator for its translational movement. This allows to shift the mirror $M_k$ to compensate a homogeneous heating of the mirror $M_k$ as it was described in connection with FIG. 3A. Further, the heater 300 for heating the mirror or optical element $M_k$ advantageously comprises heating elements selected from the group consisting of IR light emitting diodes, Peltier elements, optical fibers, light guide rods and IR lasers, as will be described in more detail below with the description of FIG. 13. Further, such heating elements are optionally arranged in one dimension or in two dimensions at predefined spatial coordinates, forming a grid structure. Advantageously in the embodiments in which the heating elements are emitting or guiding IR radiation, these embodiments comprise an optical arrangement to configure the IR radiation, the optical arrangement comprises arrangement elements selected from the group consisting of collimator, focusing lens, adjustable lens, mirror and diffractive optical element, wherein the arrangement elements may be tiltable around at least on axis. Examples of such optical arrangements are shown in FIG. 13.

Further, in an alternative embodiment of the above described second projection lenses the at least one optical element $M_k$ comprises a modification in or on the mirror body $MB_k$. The modification is selected from the group consisting of recess, blind hole, defined surface roughness, diffractive structure, spherical protrusion, spherical recess and surface curvature. The modification, which is described in more detail below in connection with FIG. 13, advantageously is used to guide e.g. IR radiation to heat the optical element locally.

In the following a third projection lens is described as a part of this invention. This third projection lens makes use of the knowledge form FIG. 9 which show that the zero cross temperatures of different mirrors become more different with increasing power of EUV light, if the lens is designed such that the optical aberration is reduced to a minimum. For the lens of FIG. 6, as an example, the mirrors $M_4$ and $M_6$ should have a zero cross temperature with at least about 1K above the reference temperature if the lens is subjected to about 16 W of EUV light. In contrary mirror $M_5$ should have a zero cross temperature $T_{O5}$ of about 34° C., or even higher, which is about 12K or more above the reference temperature of 22° C. According to embodiments of the first and the second projection lens in accordance with this invention it is preferred to have a zero cross temperature which is above the ones shown in FIG. 9. In such cases the heaters of these embodiments can heat the mirror, e.g. homogenously to the respective zero cross temperatures to minimize the optical aberration. So if the EUV light power will still increase, which is always aspired, then the difference in the zero cross temperatures will also increase and become more than the 11K as it is for the lens which is described in FIG. 6 with the values of FIG. 9. Probably this difference will even double, especially if higher EUV light power is used in future lenses, so that the difference for the coldest and the hottest mirror will be about 20K, or even more. In such cases advantageously a glass ceramic like Zerodur® may be used such that for the coldest and the hottest mirror the same material is used. The colder mirror of the both is used or operated at or close to a first zero cross temperature $T^1_0$. The hotter mirror is used or operated at or close to the second zero cross temperature $T^2_0$ which is higher than the first one. This means that e.g. mirror $M_m$ and mirror $M_n$ is made of the same material with the two mentioned zero cross temperatures, designated as $T^1_{0mn}$ and $T^2_{0mn}$. As shown in US 2003/0125184 A1 glass ceramic materials with two zero cross temperatures in a temperature range of about 0° C. to about 100° C. exist which have a difference in its zero cross temperatures $T^2_0-T^1_0$ of about 20K. The usage of only one material for two mirrors will also reduce the costs of the projection lens.

Due to the above advantages, the third projection lens according to this invention comprises again at least two reflective optical elements $M_i$, each with a body $MB_i$ and a reflective surface $MS_i$ for projecting an object field on a reticle onto an image field on a substrate if the projection lens is exposed with an exposure power of EUV light with a wavelength in a wavelength range of less than 50 nm. As described above the EUV light is reflected from the reticle when it is illuminated by an illumination system of an EUV-lithographic projection exposure system. The bodies $MB_m$, $MB_n$ of at least two reflective optical elements comprise a material with a temperature dependent coefficient of thermal expansion which is zero at at least two zero cross temperatures $T^1_{0mn}$ and $T^2_{0mn}$. The third lens additionally comprises a support structure for passively or actively supporting the reflective optical elements $M_i$, whereas the temperature of at least a part of the support structure is at a reference temperature $T_{Ref}$ as described above in connection with e.g. FIG. 4, FIG. 5 and FIGS. 3A to 3L. Further, the third lens comprises at least two tempering means, preferably heaters, for independently heating or cooling the at least two bodies $MB_n$, $MB_m$ of the two reflective optical elements. Further, the third projection lens comprises a temperature control system for independently controlling the temperature of the at least two heated or cooled bodies $MB_n$, $MB_m$ to respective temperatures $T_{kn}$ and a $T_{km}$. As an option at least one of the two zero cross temperatures $T^1_{0mn}$ and $T^2_{0mn}$ is higher than the reference temperature $T_{Ref}$, since the reference temperature is usually in the range of 22° C. This optional embodiment simplifies the material selection to get a suitable material with the two zero cross temperatures. Further, during the exposure of the lens with the exposure power of the EUV light the temperatures $T_{kn}$ of the body $MB_n$ preferably is within an interval of ±5K, better ±2K centered around the first zero cross temperatures $T^1_{0mn}$, and the temperatures $T_{km}$ of the body $MB_m$ preferably is within an interval of ±5K, better ±2K centered around the second zero cross temperatures $T^2_{0mn}$. In a further embodiment of the third lens the temperatures $T_{kn}$ and $T_{km}$ of the bodies of the reflective optical elements are controlled as close to the respective zero cross temperatures $T^1_{0mn}$ and $T^2_{0mn}$ as possible.

It is mentioned here that in general the reference temperature $T_{Ref}$ may be set individual for each mirror. This depends also on the used support structure which holds the mirror. In today's systems the reference temperature is the same for all mirrors. However, this may change in future. For this reason in accordance with the present invention the meaning of the reference temperature $T_{Ref}$ is such that always the reference temperature to the related mirror or reflective optical element is to be understood.

Further, the third projection lens according to this invention may also have a cooler for the cooling of the mirror with the lowest zero cross temperature $T^1_{0nm}$ and a heater for the heating of the mirror with the higher zero cross temperature $T^2_{0mn}$. This has the advantage that the lowest zero cross temperature not necessarily must be above the reference temperature of 22° C. By applying a cooler a material can be used in which $T^1_{0nm}$ is at about 15° C., which is used e.g. for mirror $M_4$ or $M_6$, if referred to FIG. 6, and in which $T^2_{0mn}$ is at about 35° C., which is used e.g. for the mirrors $M_3$ or $M_5$. This selection of the mirrors results essentially from FIG. 9. Such a material is e.g. disclosed in US 2003/0125184 A1. Of course, if a material can be manufactured in such a way that both zero cross temperatures are in a temperature range of about 22° C. to about 40° C., meaning above the reference temperature $T_{Ref}$ of the respective mirror or optical element, then the preferred embodiment of the third lens is that both mirrors $M_m$ and $M_n$ are heated with a heater.

In a $2^{nd}$ embodiment of the third lens the temperature of the bodies $MB_n$, $MB_m$, without a heating with the heaters, result in a temperature distributions $\Delta T_n(x,y,z)=(T_n(x,y,z)-T_{Ref})$, $\Delta T_m(x,y,z)=(T_m(x,y,z)-T_{Ref})$ of the bodies $MB_n$, $MB_m$ relative to the reference temperature $T_{Ref}$ with respective average and maximum temperatures $\Delta T_{nav}$, $\Delta T_{mav}$ and $\Delta T_{nmax}$ and $\Delta T_{mmax}$. This is caused by the exposure of the reflective surfaces $MS_m$ and $MS_n$ with the EUV light which is reflected by the illuminated reticle and which comprises a spatial distribution of angular, polarization and intensity parameters in accordance with an illumination setting. Further, at least one of the two zero cross temperatures $T^1_{0mn}$ and $T^2_{0mn}$ is higher than the maximum of the highest reference temperature $T_{Ref}$ and the respective absolute average or maximum temperature $\Delta T_{mav}+T_{Ref}$ or $\Delta T_{mmax}+T_{Ref}$, $\Delta T_{nav}+T_{Ref}$ or $\Delta T_{nmax}+T_{Ref}$, based on the respective spatial temperature distribution $\Delta T_m(x,y,z)$, $\Delta T_n(x,y,z)$, expressed as $T^1_{0mn} > \max(T_{Ref}, \Delta T_{mav} + T_{Ref})$, $T^1_{0mn} > \max(T_{Ref}, \Delta T_{mmax} + T_{Ref})$ or $T^2_{0mn} > \max(T_{Ref}, \Delta T_{nav} + T_{Ref})$, $T^2_{0mn} > \max(T_{Ref}, \Delta T_{nmax} + T_{Ref})$. Selecting the zero cross temperature in this way has similar advantages as already described in connection with the first and the second lens of this invention.

In a 3$^{rd}$ embodiment of the third projection lens comprising a material in which the zero cross temperatures $T^1_{0mn}$ and $T^2_{0mn}$ vary regarding their real values due to manufacturing which results in manufacturing tolerances $\Delta T^1_{0mn}$, $\Delta T^2_{0mn}$ such that the respective real values are within the intervals $T^1_{0mn} \pm \Delta T^1_{0mn}$ and $T^2_{0mn} \pm \Delta T^2_{0mn}$. Due to this tolerances advantageously at least one zero cross temperatures $T^1_{0mn}$ and $T^2_{0mn}$ is higher than the maximum of the highest reference temperature $T_{Ref}$ and the respective absolute average or maximum temperature $\Delta T_{mav} + T_{Ref}$ or $\Delta T_{mmax} + T_{Ref}$, $\Delta T_{nav} + T_{Ref}$ or $\Delta T_{nmax} + T_{Ref}$, based on the respective spatial temperature distribution $\Delta T_m(x,y,z)$, $\Delta T_n(x,y,z)$, which is additionally increased by the absolute value of the respective manufacturing tolerances $\Delta T^1_{0mn}$, $\Delta T^2_{0mn}$, expressed as $T^1_{0mn} > \max(T_{Ref}, \Delta T_{mav} + T_{Ref}) + |\Delta T^1_{0mn}|$ or $T^1_{0mn} > \max(T_{Ref}, \Delta T_{mmax} + T_{Ref}) + |\Delta T^1_{0mn}|$ or $T^2_{0mn} > \max(T_{Ref}, \Delta T_{nav} + T_{Ref}) + |\Delta T^2_{0mn}|$ or $T^2_{0mn} > \max(T_{Ref}, \Delta T_{nmax} + T_{Ref}) + |\Delta T^2_{0mn}|$.

As already mentioned above in the description of the second projection lens also for the third projection lens as an alternative the selection of the zero cross temperature can done by $T_{On} > \max(T_{Ref}, T_{av\ n} + T_{ref})$ or $T_{Om} > \max(T_{Ref}, T_{av\ m} + T_{ref})$, whereby $T_{av\ m}$ and $T_{av\ n}$ are the respective average temperatures of mirrors $M_m$ and $M_n$ as described above e.g. in connection with FIG. 7 or FIGS. 3A to 3L. However, if the maximum temperature instead of the average temperature is considered in the selection process also the third lens then is more also robust, e.g. regarding changes in exposure powers to higher values. Like the previous embodiments of the lenses in accordance with this invention, instead of the absolute maximum temperatures also the absolute average temperature may be sufficient, but in this case the third lens will be less robust against a raise of temperature of the mirrors which may result from higher exposure power.

Similar as the first and the second projection lens of this invention also the third projection lens in a 4$^{th}$ embodiment is controlled such that at a time before the projection lens is subjected to the exposure power of the EUV light the temperature $T_{kn}$ or $T_{km}$ of the at least one heated body $MB_n$, $MB_m$ is controlled to its value by heating the heater with a first heating power. In a 5$^{th}$ embodiment the control is such that during the time of the exposure of the third projection lens with the exposure power of the EUV light the heating power of the heater with the initial first heating power is less than the first heating power. Alternative to the 4$^{th}$ and the 5$^{th}$ embodiments of the third projection lens in a 6$^{th}$ embodiment of the third lens the temperature control system controls at least one of the temperatures $T_{km}$ and $T_{kn}$ such that the heating power of the respective heater and the exposure power of the EUV light absorbed by the at least one temperature controlled body $MB_m$ or $MB_n$ is constant in time. The advantages of the 4$^{th}$ to the 6$^{th}$ embodiments of the third lens are already mentioned in connection with the first and the second projection lens.

In a 7$^{th}$ embodiment of the third projection lens of this invention the lens is designed to be exposed with an exposure power of more than 8 W of EUV light with a wavelength in a wavelength range of less than 50 nm. Especially FIG. 9 shows that for higher EUV light power to which the lens is exposed, the third embodiment can be used due materials which is available today, as are already mentioned.

In an 8$^{th}$ embodiment of the third projection lens the absolute value of the difference between the zero cross temperatures $T^1_{0mn}$, $T^2_{0mn}$ is chosen more than 6K, expresses as $\text{abs}(T^1_{0mn} - T^2_{0mn}) > 6K$. In this case the projection lens is designed to be exposed with an exposure power of more than 8 W of EUV light with a wavelength in a wavelength range of less than 50 nm. FIG. 9 shows an example of such a lens. Further, in a 9$^{th}$ embodiment of the third projection lens 4 or 6 reflective optical elements are mirrors. Alternative or in addition the embodiments of the third projection lens, as described above, may be operated such that, e.g. at a time before the projection lens is subjected to the exposure power of the EUV light, at least one of the temperature controlled bodies $MB_n$, $MB_m$ is controlled to its value by cooling with the respective tempering means with a first cooling power. Further, the first cooling power can be increased by the tempering means at a time when the projection lens is subjected to the EUV exposure light. The cooling power describes the heat transfer per time from the temperature controlled body to the tempering means. Again the number of mirrors for the third projection lens may vary in accordance to the requirements. The principles used in third projection lens may be applied to each mirror or each reflective optical element, especially if used in an EUV lithographic projection exposure apparatus.

Further, to minimize the optical aberration especially in projection lenses 20 according to the third lens of this invention in which at least one mirror or optical element $M_k$ is heated or cooled by a heater 300 or tempering means, it is advantageous to connect the at least one heated and/or cooled optical element $M_k$ to an actuator for its translational movement. This allows to shift the mirror $M_k$ to compensate a homogeneous heating or cooling of the mirror $M_k$ as it was described in connection with FIG. 3A. Further, tempering means, as e.g. the heater 300 for heating the mirror or optical element $M_k$, advantageously comprises heating elements selected from the group consisting of IR light emitting diodes, Peltier elements, optical fibers, light guide rods and IR lasers, as will be described in more detail below with the description of FIG. 13. Further, such heating elements are optionally arranged in one dimension or in two dimensions at predefined spatial coordinates, forming a grid structure. Advantageously in the embodiments in which the heating elements are emitting or guiding IR radiation, these embodiments comprise an optical arrangement to configure the IR radiation, the optical arrangement comprises arrangement elements selected from the group consisting of collimator, focusing lens, adjustable lens, mirror and diffractive optical element, wherein the arrangement elements may be tiltable around at least on axis. Examples of such optical arrangements are shown in FIG. 13.

Further, in an alternative embodiment of the above described third projection lenses the at least one optical element $M_k$ comprises a modification in or on the mirror body $MB_k$. The modification is selected from the group consisting of recess, blind hole, defined surface roughness, diffractive structure, spherical protrusion, spherical recess and surface curvature. The modification, which is described in more detail below in connection with FIG. 13, advantageously is used to guide e.g. IR radiation to heat the optical element locally.

Further the present invention is also related to a method to configure a projection lens of an EUV lithographic projection exposure system. The following method is based on the teaching of the previous embodiments of the invention. The configuration method comprises the following steps:

In a first step the number of reflective optical elements $M_i$ of a EUV projection lens is determined. Some requirements are that the projection lens projects an object field of a give size which is on a reticle onto an image field of a given size on a substrate. For the projection an EUV projection light beam with a wavelength of less than 50 nm is used. The projection requirement is e.g. a predetermined spatial resolution with a predetermined quality.

In a second step the surface figure and surface shape of each reflective optical element $M_i$ is determined based on the geometric data of the object field and the image field and the predetermined spatial resolution.

In a third step the substrate material for each reflective optical element $M_i$ with its shape and size is selected, wherein the material is selected by consideration of thermal expansion.

In a fourth step at least on substrate material is selected from a group of materials which have a temperature dependent coefficient of thermal expansion which is zero at a zero cross temperature $T_{0m}$. This material is preferably used for mirrors with a high thermal load.

In a fifth step the maximum thermal load for each reflective optical element $M_i$ is determined which is expected during the projection of the object field onto the image field under various conditions of the EUV projection exposure system, like EUV light power, transmission or reflection of the reticle, various illuminations settings and various pattern structures on the reticle.

In a sixth step the spatial temperature $T(x,y,z)$ for each reflective optical element $M_i$ based on the $5^{th}$ step, considering its thermal load, is determined together with its maximum and its average temperature values $T_{i\ max}$ and $T_{i\ av}$, In a seventh step the at least one material with the zero cross temperature $T_{0m}$ is selected based on the zero cross temperature $T_{0m}$. The selection is done such that the maximum temperature or the average temperature $T_{m\ max}$ and $T_{m\ av}$ of the temperature $T(x,y,z)$ of the optical element $M_m$ related to the at least one substrate material is lower than the zero cross temperature $T_{0m}$, expressed as $T_{m\ max} < T_{0m}$ or $T_{m\ av} < T_{0m}$.

In the eighth step the mirrors and the lens are formed with the selected materials.

In a preferred method the configuration method comprises the additional steps in which the at least one material is selected such that the zero cross temperatures $T_{0m}$ is higher than the maximum temperature or the average temperature $T_{max}$ and $T_{av}$ increased by an absolute value of respective manufacturing tolerances $\Delta T_{0m}$, to manufacture a material with the zero cross temperature $T_{0m}$, expressed as $T_{0m} > T_{m\ max} + \Delta T_{0m}$ or $T_{0m} > \max(T_{Ref}, T_{mmax}) + |\Delta T_{0m}|$. With this material selection also variations of the zero cross temperatures $T_{0m}$ are considered, since they vary regarding its real value due to manufacturing process parameters, as e.g. described in US 2003/0125184 A1. The real values of the zero cross temperatures $T_{0m}$ are within the intervals $T_{0m} \pm \Delta T_{0m}$.

The configuration method may comprise that the one material with the zero cross temperature $T_{0m}$ is selected such that it comprises a second zero cross temperature $T^2_{0m}$ such that the absolute value of the difference between the zero cross temperature and the second zero cross temperature is less than 40 K, expressed as abs $(T_{0m} - T^2_{0m}) < 40$ K. This has the advantage that such a material is applicable for two mirrors of the EUV projection lens, whereas the two mirrors have different thermal load which result in very different zero cross temperatures to minimize optical aberration, as described in connection with FIG. 9.

Further, the configuration method may comprise that the material with the second zero cross temperature is used as substrate material for at least one additional reflective optical element, as it was just explained.

The configuration method may comprise a step in which a heater 300 and a temperature control system 200 is selected such that the at least one material with the zero cross temperature is heatable to its zero cross temperature.

In the following various embodiments of the heater 300 are described. Further, also heating methods and special bodies for the reflective optical element $M_k$ are shown, which allow the heating of the reflective element or mirror in such a way that the thermal induced optical aberrations become minimal. These further aspects are also treated a parts of the present invention.

Figure 10:
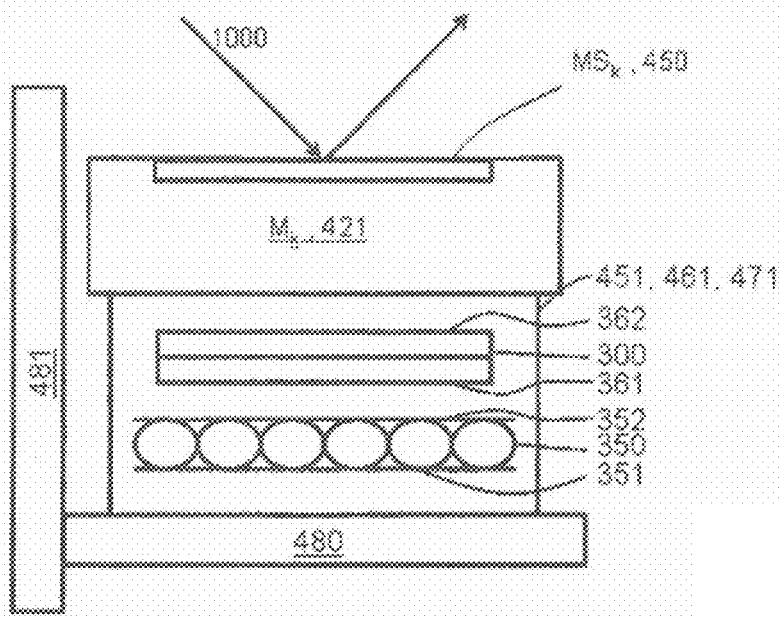
FIG. 10 schematically shows a side view of a reflective optical element $M_k$ like a mirror of an EUV projection lens as shown in FIG. 4 and FIG. 6. Further, a heater and a cooler are arranged nearby the mirror which is supported by supporting elements.

FIG. 10 schematically shows a side view a reflective optical element $M_k$ like a mirror 421 of an EUV projection lens, as e.g. shown in FIG. 4 and FIG. 5. The optical element comprises a reflective surface $MS_k$ which could be a mirror surface 450 or also a diffractive surface. In general, also on all the reflective optical elements, in accordance to this invention, the reflective surface can comprise diffractive structures to form a diffractive optical element for the incident radiation. The incident radiation 1000 can be a EUV light projection beam 4 (see FIG. 1), or it can be light of another wavelength like e.g. infrared light. In FIG. 10 in addition, support means are schematically shown like such ones which are described in connection with FIG. 4 and FIG. 5 why the same reference numerals are used. These support means are e.g. linking points 451, linking elements 471 or a bipod structure 461 as described in FIG. 4. Also a support element 480 and a part of the housing structure 481 is shown. Further, a heater or in general a first tempering element 300 is shown. Parts and some embodiments of such a heater or first tempering element 300 are already described together with FIG. 5. The difference between a heater and a tempering element is that the heater only can heat in a controlled way, whereas the tempering element is able to heat and cool in a controlled way. Heating in this context means that thermal energy is transferred from the heater or tempering element to is surrounding. Cooling means that thermal energy is transferred from the surrounding of the heater or tempering element to the heater or tempering element, and the heater or the tempering element is controllable in such a way that its temperature is lower than the temperature of the surrounding. Further, the embodiment as shown in FIG. 10 comprises a cooler or second tempering element 350. The cooler 350 or second tempering element is preferably arranged between the heater or first tempering element 300 and the support element 480 and/or the housing structure 481 (not shown) and/or the support means 451, 461, 471 (not shown, see FIG. 5). If the heater or first tempering element 300 is used to influence the temperature distribution of the reflective optical element $M_k$ then there is a risk that also the temperature of other elements in the surrounding of the reflective element $M_k$ is changed. Such an element can be e.g. the support element 480, the housing structure 481 or the support means 451, 461, 471. However, some of these elements have to be at a well controlled constant temperature to keep the reflective optical element or the mirror $M_k$, 421 in its position. As mentioned above, this position has to be constant within a nanometer or even sub-nanometer range. For this reason these elements are designated as temperature sensitive elements. Any heating and/or cooling of the surrounding of the reflective optical element or the mirror $M_k$, 421 to influence its temperature or temperature distribution, e.g. with the heater or first tempering element 300, may change this position. For this reason the cooler or second tempering element 350 is made such that it absorbs any thermal effects which are caused by the heater or first tempering element 300. This means that on the side 351 of the cooler 350 or of the second tempering element, which is oriented to the direction of the temperature sensitive elements like the support element 480 and/or the housing structure 481 and/or the support means 451, 461, 471, the temperature of the cooler or second tempering element is kept constant, resulting in a constant temperature of the temperature sensitive element such that the position of the respective optical element $M_k$ is constant on the nanometer or even sub-nanometer level. With this measure the temperature variation of these temperature sensitive elements can be reduced even if e.g. the heater or first tempering element changes its temperature to influence the temperature or the temperature distribution of the reflective optical element or mirror $M_k$, 421, to achieve the advantages as described in connection with the above described projection lenses of the present invention.

Due to the advantages of the embodiment shown in FIG. 10 the present invention also relates to a fourth projection lens of an EUV-lithographic projection exposure system which comprises a plurality of reflective optical elements $M_i$. Each reflective element $M_i$ comprises a body $MB_i$ and a reflective surface $MS_i$ to project an object field on a reticle onto an image field on a substrate if the projection lens is exposed with an exposure power of EUV light with a wavelength in a wavelength range of less than 50 nm which is reflected from the reticle while the reticle is illuminated by an illumination system of the EUV-lithographic projection exposure system. The lens further comprises support means which comprises a temperature sensitive element selected from the group consisting of linking points 451, bipod structures 461, linking elements 471, a support element 480 and a housing structure 481, for passively or actively supporting at least one optical element $M_k$. Further, the temperature sensitive element is controlled to a constant temperature or to a predefined temperature. The lens further comprises a first tempering element 300 for heating and/or cooling the at least one optical element $M_k$ to a temperature $T_k$, and a second tempering element 350 for tempering the temperature sensitive element to the constant temperature or to the predefined temperature. Further, the second tempering element 350 is spatially arranged between the temperature sensitive element and the first tempering element 300.

In a further second embodiment of the fourth projection lens the heated or cooled reflective optical element $M_k$ comprises a material with a temperature dependent coefficient of thermal expansion which is zero at a zero cross temperature $T_{0k}$ which is different from the constant or predefined temperature of the temperature sensitive element. Preferably in a further third embodiment of the fourth projection lens the temperature of the temperature sensitive element in the fourth projection lens is at a reference temperature $T_{Ref}$. The reference temperature $T_{Ref}$ has the same meaning as for the other projection lenses of this invention or as are described herein. Preferably but not necessarily the reference temperature $T_{Ref}=22°$ C., or at the temperature of the clean room in which the lithographic projection exposure apparatus is operated for mass production.

A further fourth embodiment of the fourth projection lens comprising the features of the above second and third embodiments, and in addition the feature that without tempering the body $MB_k$ with the first tempering element 300, the exposure of the reflective surface $MS_k$ with EUV light, being reflected by the illuminated reticle and comprising a spatial distribution of angular, polarization and intensity in accordance with an illumination setting, results in a temperature distribution $\Delta T_k(x,y,z)=(T_k(x,y,z)-T_{Ref})$ of the body $MB_k$ relative to the reference temperature $T_{Ref}$ with an average and maximum temperature $\Delta T_{kav}$ and $\Delta T_{kmax}$. Further, the zero cross temperatures $T_{0k}$ in this embodiment is higher than the maximum of the reference temperature $T_{Ref}$ and the respective average or maximum temperature added by the reference temperature, resulting in $\Delta T_{kav}+T_{ref}$ or $\Delta T_{kmax}+T_{Ref}$ based on the spatial temperature distribution $\Delta T_k(x,y,z)$, which is expressed as $T_{0k}>\max(T_{Ref}, \Delta T_{kav}+T_{Ref})$ or $T_{0k}>\max(T_{Ref}, \Delta T_{kmax}+T_{Ref})$.

In a further fifth embodiment of the fourth projection lens the material with the zero cross temperature $T_{0k}$ varies regarding its real value of the zero cross temperature due to manufacturing processes. This results in a manufacturing tolerance $\Delta T_{0k}$ such that the real value is within the interval $T_{0k}\pm\Delta T_{0k}$. In this embodiment the zero cross temperatures $T_{0k}$ is selected higher than the maximum of the reference temperature $T_{Ref}$ and the respective average or maximum temperature (based on the spatial temperature distribution $\Delta T_k(x,y,z)$) added by the reference temperature, resulting in $\Delta T_{kav}+T_{Ref}$ or $\Delta T_{kmax}+T_{Ref}$, the maximum is increased by the absolute value of the manufacturing tolerance $\Delta T_{0k}$, expressed as $T_{0k}>\max(T_{Ref}, \Delta T_{kav}+T_{Ref})+|\Delta T_{0k}|$, $T_{0k}>\max(T_{Ref}, \Delta T_{kmax}+T_{Ref})+|\Delta T_{0k}|$.

In a further sixth embodiment of the fourth projection lens (and its embodiments) the zero cross temperature $T_{0k}$ of the reflective optical element $M_k$ is lower than the reference temperature $T_{Ref}$ or is at least 6 K higher than the reference temperature. In the case that the zero cross temperature is lower than the reference temperature the reflective optical element $M_k$ is cooled by the first tempering mans to a temperature close to this zero cross temperature. This feature of the fourth projection lens can be used in the third projection lens of the present invention for the cooling of the mirror with the lowest zero cross temperature as it was described above. If the zero cross temperature $T_{0k}$ is at least 6 K above the mentioned reference temperature this feature of the fourth projection lens can be used in a projection lens in accordance with the first projection lens in which the zero cross temperatures of two reflective elements differ at least by 6 K and one of the two reflective elements has a zero cross temperature close to or at the reference temperature. As mentioned in the description of the first projection lens of the present invention such a projection lens is designed for an EUV exposure power of more than 8 W (see also FIG. 9 with description).

In an additional seventh embodiment of the fourth projection lens (and its embodiments) the reflective optical element $M_k$ is (in at least one spatial dimension) homogeneously subjected to a heat transfer caused by the first tempering element 300. Such a homogeneous heat transfer homogeneously heats or cools the optical element $M_k$ which results in a constant temperature distribution of the reflective optical element $M_k$ along the at least one dimension, if only the influence of the first tempering element 300 is considered. This variant of the fourth projection lens can be used in the first, second and third projection lens to e.g. homogeneously heat up the reflective optical element to or close to its zero cross temperature, as it was described in connection with these projection lenses, and as it was schematically described with FIGS. 3A to 3L and FIG. 5. Advantageously, in a further embodiment of the fourth projection lens and its various embodiments the optical element $M_k$ is connected to an actuator for its translational movement. This is to minimize optical aberration of the projection lens or the optical element $M_k$ for the case that the optical element is homogeneously heated or cooled to a temperature different from the reference temperature $T_{Ref}$, as is was described e.g. in connection with FIG. 3A and FIG. 3B.

As shown in FIG. 10 in a preferred eighth embodiment of the fourth projection lens and its embodiments the first tempering element 300 is located on a side of the body $MB_k$ of the at least one optical element $M_k$ which is opposite to its reflective surface $MS_k$. This is a similar arrangement of the first tempering element 300 as it is described in FIG. 5 for the heater 300. In the fourth projection lens and its embodiments preferably the first tempering element 300 comprises a Peltier element or a radiation source, emitting a radiation comprising a wavelength to which the body $MB_k$ of the at least one optical element $M_k$ is semitransparent. As shown in FIG. 10, in a further embodiment of the fourth projection lens the second tempering element 350 is located on a side of the first tempering element 300 which is opposite to the body $MB_k$ of the at least one optical element $M_k$.

In one embodiment in accordance with FIG. 10 the tempering element 300 may be a Peltier element or may comprise a Peltier element as already mentioned. The Peltier element may heat or cool the surrounding around its surface side 362 which is oriented into the direction of the reflective element or mirror $M_k$, 421. Preferably the Peltier element extends parallel or approximately parallel to the surface of the reflective element $M_k$, 421 which is opposite of the reflective surface $MS_k$, 450. If the Peltier element has at least such a size so that the reflective surface or even the reflective element can be covered from one side then a homogenous heating and/or cooling of the reflective element can be done which results in all the advantages as described herein (e.g. in connection with FIG. 3A). To make the Peltier element more efficient it is preferably coupled to the cooler 350, or in general to the second tempering element by e.g. coupling one of its surfaces 361 to one of the surfaces 352 of the cooler 350 or the second tempering element. The cooler 350 or in general the second tempering element may have a kind of a sandwich structure such that the surface 352 which is in contact with the first tempering or Peltier element 300 is separated from the surface 351 which is oriented into the direction of the temperature sensitive elements, like the support element 480, the housing structure 481 or the support means 451, 461, 471. In a further embodiment the first tempering element 300 may comprise several Peltier elements. Preferably the Peltier elements are arranges side by side in at least one dimension, to form an array-like arrangement. Arrangements of the Peltier elements in two or even three dimensions are also of advantage. Preferably each Peltier element of such an arrangement is controllable by a control system like e.g. the temperature control system as described in FIG. 5. In this case a controllable temperature profile on the side which is directed to the reflective element or mirror can be adjusted. This will influence the temperature distribution within the reflective element or mirror $M_k$, 421 in a controlled way. Such a heater or tempering element can be used for the temperature control of the reflective element or mirror $M_k$, 421 in accordance to the teaching of this invention in such a way that the thermal induced optical aberration or the imaging errors are minimized. The usage of the described Peltier element 300 or an arrangement of Peltier elements as a tempering means in the third projection lens according to this invention will have the advantage that the mirror with the low zero cross temperature $T^1_{0mn}$ (according to the third projection lens of this invention) can be cooled down to this temperature or even lower, which is important if the zero cross temperature is below the reference temperature $T_{Ref}$. Further, the mirror with the high zero cross temperature $T^2_{0mn}$ (or a zero cross temperature higher than the reference temperature $T_{Ref}$) can be heated up to this or the respective operation temperatures as described above in connection with one of the projection lenses according to this invention.

In a further embodiment of the fourth projection lens and its embodiments described above, the projection lens comprises a pressure control system for the control of the pressure $\Delta p$ within a surrounding of the at least one reflective optical element $M_k$. Such a pressure control system will be described below in connection with FIG. 11. The pressure control is based on a parameter selected from the group consisting of: The temperature of the reflective optical element $M_k$, the time, a parameter which directly or indirectly influences the temperature of the optical element $M_k$, an illumination setting, a change of the reticle, thermally or mechanically induced optical aberration data of the optical element $M_k$ or the projection lens and an output parameter from a model. The model input comprises data selected from the group consisting of: The temperature of the reflective optical element $M_k$, the time, a parameter which directly or indirectly influences the temperature of the optical element $M_k$, an illumination setting, thermally or mechanically induced optical aberration data of the optical element $M_k$ or the projection lens and a change of the reticle. Further, the pressure control system preferably comprises a gas inlet and/or a gas outlet nearby the at least one optical element $M_k$.

The fourth projection lens according to this invention preferably is operated such that the temperature $T_k$ of the optical element $M_k$ is controlled to its value by heating the first tempering element with a first heating power at a time before the projection lens is subjected to the exposure power of the EUV light. Then, during the time when the projection lens is subjected to the exposure power of the EUV light, the heating power of the first tempering element is less than the first heating power. Further, in a preferred embodiment of the fourth projection lens and its various embodiments the temperature $T_k$ of the at least one optical element $M_k$ which is heated and/or cooled by the first tempering element 300 is the zero cross temperature $T_{0k}$.

Figure 11:
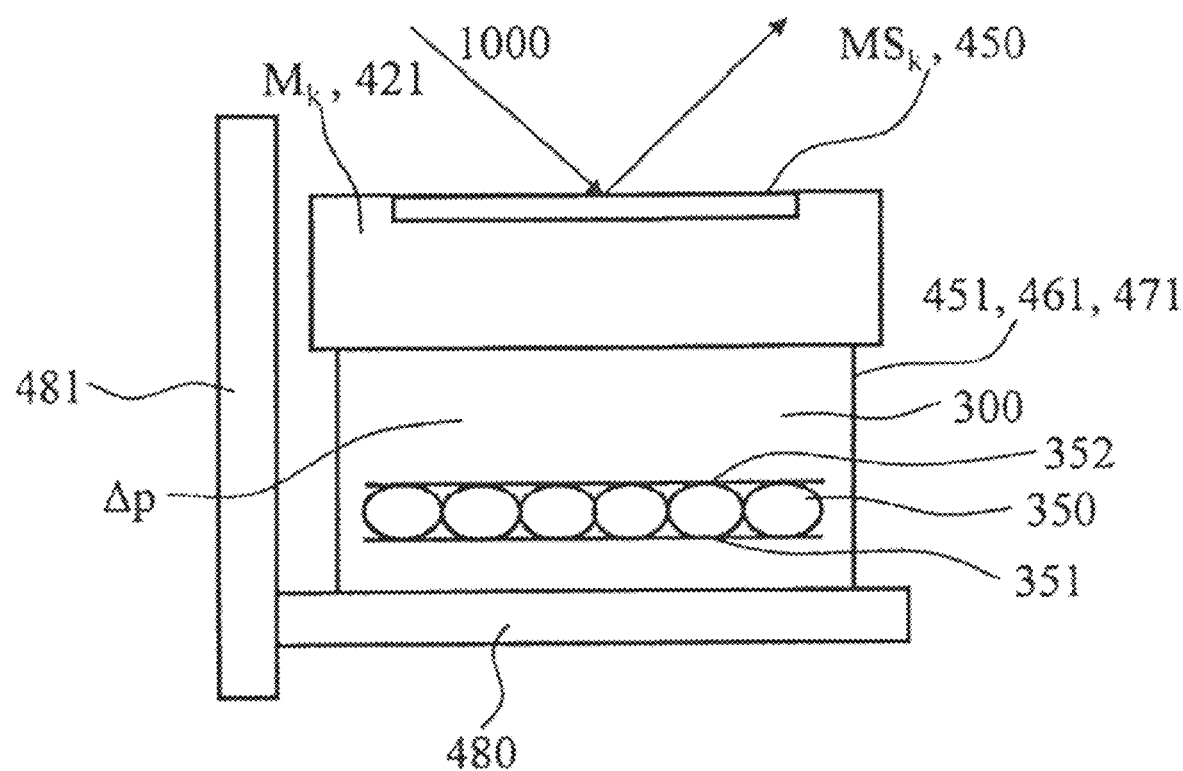
FIG. 11 schematically shows a side view of a reflective optical element as shown in FIG. 10 but without the heater. The temperature of the reflective optical element or mirror $M_k$, 421 is controlled by a pressure control of the pressure within the direct surrounding area or volume of the reflective element or mirror.

FIG. 11 schematically shows a further embodiment of the present invention similar as shown in FIG. 10 why like elements are designated with the same reference numerals. In the following the description focuses only to the differences to the embodiment of FIG. 10. The elements not described and its functions are as the ones described in FIG. 10. In the embodiment of FIG. 11 there is no heater or tempering means. The temperature of the reflective optical element or mirror $M_k$, 421 is controlled by pressure control of the pressure within the surrounding of the reflective element or mirror $M_k$, 421, designated as $\Delta p$. In this case the pressure can be controlled e.g. as a function of the temperature of the reflective element or mirror $M_k$, 421, as a function of time or a function of other parameters which directly or indirectly influence the temperature of the reflective element or mirror $M_k$, 421. Further, the control system which controls the pressure may comprise a model which uses input data like the mentioned function variables to optionally adjust the model and to provide output parameters like the pressure or any parameter which directly or indirectly influence the pressure in the mentioned surrounding. From the above, the present invention also relates to a fifth projection lens. The fifth projection lens is a projection lens of an EUV-lithographic projection exposure system. The lens comprises a plurality of reflective optical elements $M_i$, each comprises a body $MB_i$ and a reflective surface $MS_i$ for projecting an object field on a reticle onto an image field on a substrate if the projection lens is exposed with an exposure power of EUV light with a wavelength in a wavelength range of less than 50 nm, when the light is reflected from the reticle while illuminated by an illumination system of the EUV-lithographic projection exposure system. The lens further comprises support means for passively or actively supporting at least one optical element $M_k$, a pressure control system (as described in connection with the embodiment of FIG. 11) for the control of the pressure $\Delta p$ within a surrounding of the at least one reflective optical element $M_k$, wherein the control is based on a parameter selected from the group consisting of: The temperature of the reflective optical element $M_k$, the time, a parameter which directly or indirectly influence the temperature of the optical element $M_k$, an illumination setting, a change of the reticle, thermally or mechanically induced optical aberration data of the optical element $M_k$ or the projection lens and an output parameter from a model. Further, the model is using input data selected from the group consisting: The temperature of the reflective optical element $M_k$, the time, a parameter which directly or indirectly influence the temperature of the optical element $M_k$, an illumination setting, thermally or mechanically induced optical aberration data of the optical element $M_k$ or the projection lens and a change of the reticle.

The following describes the fifth projection lens in more detail with various modified embodiments also referring to FIG. 11.

In a second embodiment of the fifth projection lens the support means comprising a temperature sensitive element (as described in connection with FIG. 10) selected from the group consisting of linking points 451, bipod structures 461, linking elements 471, support element 480 and housing structure 481, for passively or actively supporting the at least one optical element $M_k$, wherein the temperature sensitive element is controlled to a constant or predefined temperature by a cooler 350. Preferably the cooler 350 is spatially arranged between the temperature sensitive element and the at least one optical element $M_k$. In the fifth projection lens and its various embodiments the pressure $\Delta p$ within the surrounding of the at least one optical element $M_k$ is in the range of 0.1 Pa to 10 Pa, more preferably in the range between 1 Pa and 5 Pa. The distance between the at least one optical element $M_k$ and the cooler 350 preferably is in the range of 1 mm to 10 mm, more preferably in the range between 3 mm and 5 mm. Further, the pressure control system comprises a gas inlet and/or a gas outlet nearby the at least one reflective optical element $M_k$. With the gas inlet and/or gas outlet (not shown in FIG. 11) the pressure within the surrounding of the at least one optical element $M_k$ can be adjusted. In a further preferred embodiment of the fifth projection lens the distance of the cooler 350 between the at least one reflective optical element $M_k$ and the cooler 350 is adjustable to control a heat transfer between these elements.

Further, similar as for the fourth projection lens and its embodiments as described with FIG. 10, in the fifth projection lens the at least one reflective optical element $M_k$ also comprises a material with a temperature dependent coefficient of thermal expansion which is zero at a zero cross temperature $T_{0k}$. Generally this zero cross temperature is different from the constant or predefined temperature of the temperature sensitive element, whose temperature is preferably but not necessarily at a reference temperature $T_{Ref}$, as it was already mentioned in connection with the fourth projection lens of this invention which was described in connection with FIG. 10.

The fifth projection lens advantageously offers the possibility that the pressure $\Delta p$ (which is controlled by the control system) is such that the temperature of the at least one reflective optical element $M_k$ is at its zero cross temperature.

Usually the surrounding of the reflective element or mirror $M_k$, 421 comprise a gas with a pressure in the range of about 1 to 5 Pa (Pascal), preferably about 3.5 Pa. The cooler 350 is usually shielding the temperature sensitive element such that any temperature change of the mirror 421 will have no influence on them, as already described with FIG. 10. For this preferably the cooler 350 is spatially arranged between the temperature sensitive element and the at least one optical element $M_k$.

The distance between the at least one optical element supported by the support means or the mirror 421 and the cooler 350 is about 3 to 5 mm. Within this space there is the gas pressure as mentioned. As a gas usually hydrogen is used. If, in the case of a hydrogen gas, the pressure is changes by about ±1 Pa then the thermal resistance of the gas will change by about ±25%. By the usage of a pressure control system to control the pressure in the direct surrounding of the mirror 421, the mirror can be controlled regarding its absolute temperature and regarding its temperature distribution as a function of time. As an example, at the start of the EUV projection process the mirror 421 is at a lower temperature as it is in a steady state. In this case the pressure is reduced so that the mirror heats up faster to its steady state temperature. As another example, if the illumination setting and/or the reticle is changed, most probable also the power will change to which the EUV projection lens is subjected as it was described above. In such a case the mirror 421 will heat up to a higher or to a lower steady state temperature. In the first case the pressure is increased to reduce the thermal resistance between the cooler 350 and the mirror 421. In the second case the pressure will be reduced to increase the thermal resistance of the gas surrounding to bring the mirror to its best steady state temperature which is closest to the zero cross temperature (this was explained with FIG. 7). Applying the regulation of the gas pressure in the surrounding of the mirror 421 will influence the steady stated temperature. Ideally the steady state temperature should be the zero cross temperature to minimize the optical aberration. As a further application, also small variations in the zero cross temperature of a certain mirror $M_k$, e.g. due to manufacturing tolerances, may be compensated in a way that the pressure in the direct surrounding of this mirror is adjusted such that in the steady state the average temperature $T_{avk}$ of this mirror fits best to the zero cross temperature. Such a pressure control requires that the pressure in the direct surrounding of the individual mirrors or reflective optical elements of an EUV lens can be changed independently. Practically this is done by gas inlets and gas outlets nearby the mirrors. From this in a further embodiment of the fifth projection lens the pressure control system comprises a gas inlet and a gas outlet nearby the at least one reflective optical element $M_k$ which is supported by the support means.

In further embodiments of the fifth projection lens also the distance of the cooler surface 352, or in general the distance between the cooler 350 and the mirror 421 or the reflective optical element $M_k$ may be adjusted to control the heat transfer between these elements.

Figure 12A:
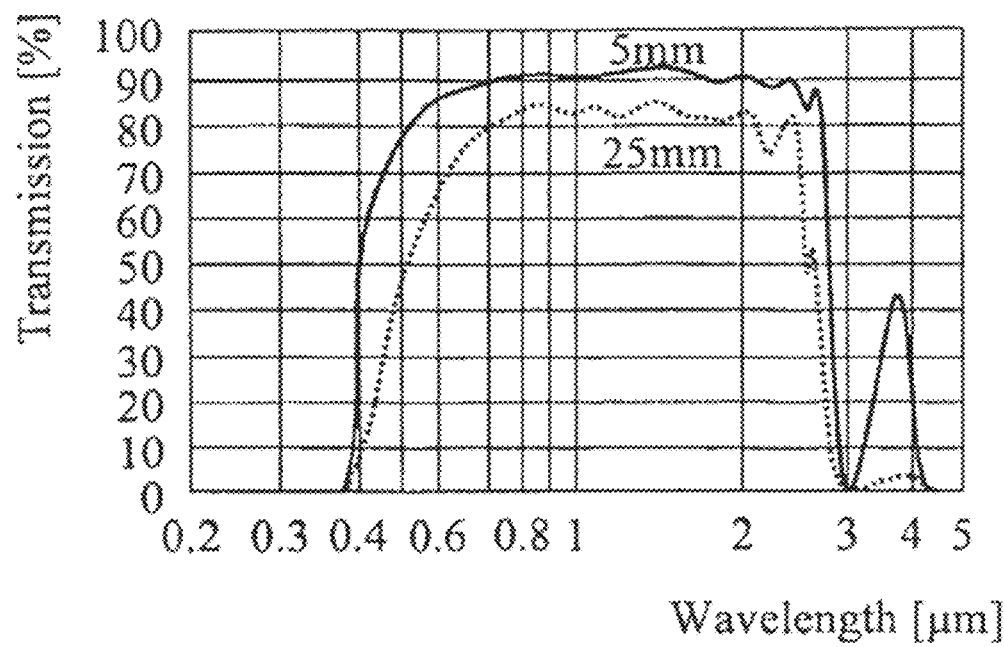
FIG. 12A shows the transmission of Zerodur® for a transmission path of 5 mm and of 25 mm.
Figure 12B:
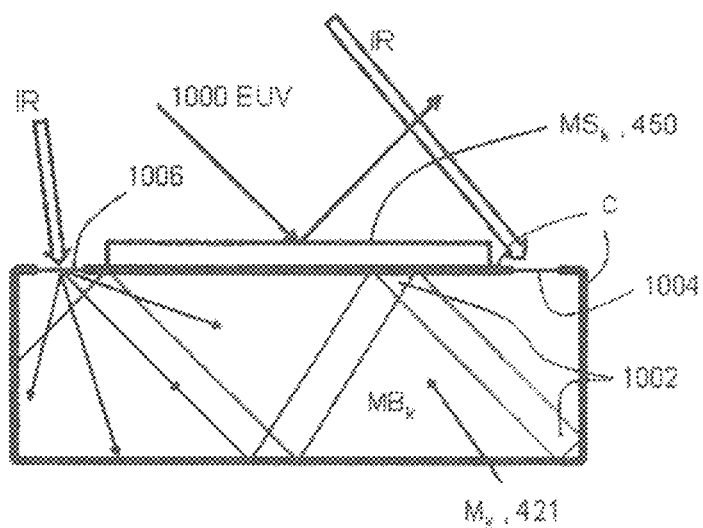
FIG. 12B schematically shows a reflective optical element or a mirror $M_k$, 421 which is coated with a coating C on almost its entire surface to make the mirror heatable with IR radiation.

FIG. 12A shows the transmission of Zerodur® for a transmission path of 5 mm and 25 mm. It shows that Zerodur® has an about constant absorption coefficient for light with a wavelength in the range of 700 nm up to about 2 µm (herein further designated as infrared or IR radiation or IR light). The attenuation length in Zerodur® for IR light with a wavelength in this range is about 50 mm to about 100 mm. This results from FIG. 12A. FIG. 3D and FIG. 3H also show typical mirror sizes of mirrors used in an EUV projection lens. The diameters are typically in the range of 200 mm to 600 mm, and the thickness is up to 100 mm. This means that if IR light passes a distance of 50 mm to about 100 mm in Zerodur® material then 63% of its energy is absorbed along its path. So the attenuation length fits well to the size of the mirrors of an EUV lens such that the mirror, if made of Zerodur® or if comprising Zerodur®, can be heated by the mentioned IR light. This is because the IR light deposits its energy over a distance of about 50 mm up to even 100 mm and more. Such a distance can be warmed up simultaneously in a more or less homogenous way. This means that a mirror body $MB_k$ of a mirror $M_k$, as e.g. shown in FIG. 5, FIG. 10 or FIG. 11, is semitransparent for a radiation which comprises a wavelength in the infrared range, as shown in FIG. 12A. To make use of this effect FIG. 12B schematically shows a further embodiment of the present invention in which a reflective optical element or a mirror $M_k$, 421 is coated with a coating C on or on almost its entire surface to make the mirror heatable with IR radiation. The coating C differs from the reflective surface $MS_k$, 450 which may comprise also a coating in the form of a multilayer to reflect the EUV light.

The coating C is selected such that the infrared radiation IR is reflected. As a coating material a very thin metal layer can be used. Other coatings which reflect IR radiation can also be used. Further, the coating and the wavelength of the IR radiation can be adapted such that its reflection is optimized. The coating C has the function that the IR radiation cannot leave the mirror body $MB_k$ and that mirror is heated more homogenous due to the various reflections which are shown in FIG. 12B as 1002. With this method the IR radiation almost instantaneously and totally deposits its energy within the mirror body $MB_k$. To get the IR radiation into the mirror body $MB_k$ at least one surface area of it is not coated or the coating is partly transparent for the IR radiation. Such surface areas are designated by 1004 and 1006 and are called IR windows. The IR window or a plurality of IR windows 1004, 1006 are positioned on a suitable position on the mirror which considers the attenuation length of the IR radiation within the mirror body material, the geometrical form and the size of the mirror. Also any limitations regarding construction space is considered. However, since the attenuation length is comparatively large, or in other words in the range of the size of the mirror, the position of the IR window is not so critical. Especially, the position can be on the side of the mirror body $MB_k$ on which the reflective surface $MS_k$, 450 of the reflective element or mirror is arranged, as shown in the example of FIG. 12B. This has the advantage that also the construction space in front of the mirror can be used to couple the IR radiation into the reflective element or mirror. Most other heater or tempering means cannot be used in this space since they will block or shadow the EUV projection beam 1000. Preferably the IR window surrounds the reflective surface $MS_k$, 450, as schematically shown in FIG. 12B. As a further option the IR window comprises a certain surface roughness or a diffractive structure to scatter or distribute the IR radiation within the mirror body. Further, the IR radiation may at least partly share the same construction space as the EUV projection beam 1000, as is shown in FIG. 12B for the right IR beam. As IR radiation source any source like Lasers, IR-diodes, filaments or lamps etc. can be used. Depending on the IR source a suitable optical arrangement can be used to configure the IR radiation such that it can be coupled into the reflective element or into the mirror $M_k$, 421 through the IR windows. Such an optical arrangement may comprise lenses and mirrors or in general refractive, diffractive and/or reflective optical elements. In addition or alternative, such an optical arrangement may also comprise quartz fibers or optical fibers (in general light guides) e.g. to transport the IR radiation from the IR source to the IR windows 1004, 1006. In this case then the IR source can be positioned even outside the EUV projection lens or outside the EUV lithographic projection system. A reflective optical element or a mirror $M_k$, 421 as described with FIG. 12B has the advantage that there is no mechanical contact of the heater or tempering element or tempering means (which comprises the IR source and an optional optical arrangement to configure the IR light) with the reflective element or the mirror $M_k$.

In further embodiments of the present invention the reflective element or mirror of FIG. 12B can be used together with the tempering elements or tempering means e.g. the heater 300 of the embodiment of FIG. 10 and/or with the cooler 350 as described there, or as described in the embodiment of FIG. 11. In addition, or as an alternative, also the pressure control as described in FIG. 11 can be used together with the embodiments of FIG. 12B. All these embodiments can advantageously be used in an EUV projection lens, especially in one as described above in accordance to this invention, preferably in the first, second and third projection lens according to this invention, having the advantage that the thermal induced optical aberration is minimized.

The above discussion of FIG. 12A and FIG. 12B result in a sixth projection lens according to this invention, and which is illustrated in FIG. 12B. The first embodiment of the sixth projection lens for an EUV-lithographic projection exposure system comprises a plurality of reflective optical elements $M_i$. Each reflective optical element $M_k$ comprises a body $MB_i$ and a reflective surface $MS_i$ for projecting an object field on a reticle onto an image field on a substrate, if the projection lens is exposed with an exposure power of EUV light with a wavelength in a wavelength range of less than 50 nm, which is reflected from the reticle while the reticle is illuminated by an illumination system of the EUV-lithographic projection exposure system. Further, the at least one reflective optical element $M_k$ comprises a material with a temperature dependent coefficient of thermal expansion which is zero at a zero cross temperature $T_{0k}$. In addition, the body $MB_k$ of the optical element $M_k$ is semitransparent to an IR radiation, and the at least one reflective optical element $M_k$ with its body $MB_k$ comprises a coating C on or on almost its entire surface of the body $MB_k$. The coating C reflects IR radiation inside the body $MB_k$.

A second embodiment of the sixth projection lens comprises an IR light source or comprises an optical arrangement to form an IR light path. The IR light source or the IR light path couples IR radiation into the body $MB_k$ which comprises the coating C. In a preferred embodiment the IR light source or the optical arrangement comprises an element selected from the group consisting of: Laser, IR-diode, filament, lens, mirror, refractive element, diffractive element, reflective element, light guide and optical fiber. Further, the body $MB_k$ preferably comprises a surface area 1004, 1006 not coated with the coating C, or comprises a surface area 1004, 1006 with a coating being semitransparent to the IR radiation, for coupling in the IR radiation into the body $MB_k$. Preferably the coating C comprises a metal.

In a further embodiment of the sixth projection lens the surface area 1004, 1006 is arranged on the side of the body $MB_k$ which comprises the reflective surface $MS_k$. Alternative or in addition, the surface area 1004, 1006 surrounds the reflective surface $MS_k$. Further, the surface area 1004, 1006 may comprise a surface roughness to scatter the IR radiation into the body, or the surface area may comprise a diffractive structure to distribute the IR radiation within the body $MB_k$ by diffraction.

In a further embodiment of the sixth projection lens the construction space nearby the reflective surface $MS_k$ is illuminated by the IR radiation and the EUV light. Preferably the IR source is arranged outside the projection lens or outside the EUV-lithographic projection exposure system.

Further, as in the first to fifth projection lenses described above, also in the sixth projection lens the optical element $M_k$ optionally is connected to an actuator for its translational movement.

Similar as the first to fifth projection lens also the sixth projection lens may comprise embodiments which comprises a cooler 350 located on a side of the body $MB_k$ of the at least one optical element $M_k$ which is opposite to its reflective surface $MS_k$. Further, the distance of the cooler 350 to the at least one reflective optical element $M_k$ preferably is adjustable for the control of the heat transfer between these elements. Alternative or in addition, the sixth projection lens (and its embodiments) comprises a pressure control system for the control of the pressure $\Delta p$ within a surrounding of the at least one reflective optical element $M_k$. Further, the mentioned pressure control system may comprise a gas inlet and/or a gas outlet nearby the at least one optical element $M_k$.

Without radiating the body $MB_k$ of the sixth projection lens with IR radiation, the exposure of the reflective surface $MS_k$ with EUV light (which is reflected by the illuminated reticle, and which comprises a spatial distribution of angular, polarization and intensity in accordance with an illumination setting) results in a temperature distribution $\Delta T_k(x,y,z)=(T_k(x,y,z)-T_{Ref})$ of the body $MB_k$ with the temperature $T_k(x,y,z)$ relative to a reference temperature $T_{Ref}$. The temperature distribution comprises an average and maximum temperature $\Delta T_{kav}$ and $\Delta T_{kmax}$. Preferably the zero cross temperature $T_{Ok}$ is higher than the maximum of the reference temperature $T_{Ref}$ and the respective average or maximum temperature based on the spatial temperature distribution $\Delta T_k(x,y,z)$ added by the reference temperature $\Delta T_{kav}+T_{ref}$ or $\Delta T_{kmax}+T_{Ref}$, expressed as $T_{Ok}>\max(T_{Ref}, \Delta T_{kav}+T_{Ref})$ or $T_{Ok}>\max(T_{Ref}, \Delta T_{kmax}+T_{Ref})$. Further, if the material with the zero cross temperature $T_{Ok}$ varies regarding its real value of the zero cross temperature due to manufacturing, resulting in a manufacturing tolerance $\Delta T_{Ok}$ such that the real value of the zero cross temperature $T_{Ok}$ is within the interval $T_{Ok}\pm\Delta T_{Ok}$, then the zero cross temperatures $T_{Ok}$ is selected higher than the maximum of the reference temperature $T_{Ref}$ and the respective average or maximum temperature based on the spatial temperature distribution $\Delta T_k(x,y,z)$ added by the reference temperature $\Delta T_{kav}+T_{Ref}$ or $\Delta T_{kmax}+T_{Ref}$, wherein the maximum is increased by the absolute value of the manufacturing tolerance $\Delta T_{Ok}$, expressed as $T_{Ok}>\max(T_{Ref}, \Delta T_{kav}+T_{Ref})+|\Delta T_{Ok}|$, $T_{Ok}>\max(T_{Ref}, \Delta T_{kmax}+T_{Ref})+|\Delta T_{Ok}|$.

In a further embodiment of the sixth projection lens (and its various embodiments) the temperature $T_k$ of the optical element $M_k$ is controlled to its value by irradiating the optical element $MB_k$ with a first IR radiation power at a time before the projection lens is subjected to the exposure power of the EUV light. Optionally the IR radiation power is less than the first IR radiation power during the time when the projection lens is subjected to the exposure power of the EUV light.

Further, the present invention relates to a mirror (as shown in FIGS. 12A to 12D) which comprises a body $MB_k$ and a reflective surface $MS_k$, and material with a temperature dependent coefficient of thermal expansion which is zero at a zero cross temperature $T_{Ok}$. Further, the body $MB_k$ of the optical element $M_k$ is semitransparent to an IR radiation, and the body $MB_k$ comprises a coating C on or on almost its entire surface of the body $MB_k$, wherein the coating C reflects IR radiation inside the body $MB_k$, and wherein the mirror is adapted for a projection lens of an EUV-lithographic projection exposure system for projecting an object field on a reticle onto an image field on a substrate if the projection lens is exposed with an exposure power of EUV light with a wavelength in a wavelength range of less than 50 nm. Optionally the mirror body $MB_k$ comprises a surface area 1004, 1006 which is not coated with the coating C, or it comprises a surface area 1004, 1006 with a coating which is semitransparent to the IR radiation, both for coupling in an IR radiation into the body $MB_k$. Preferably the coating comprises a metal. In a further embodiment of the mirror the surface area 1004, 1006 is arranged on the side of the mirror body $MB_k$ on which the reflective surface $MS_k$ is arranged. Alternative or in addition the surface area 1004, 1006 surrounds the reflective surface $MS_k$. In a further embodiment of the mirror according to the invention the surface area 1004, 1006 comprises a surface roughness to scatter an IR radiation into the body, or the surface area comprises a diffractive structure to distribute an IR radiation within the body $MB_k$ by diffraction.

Figure 12C:
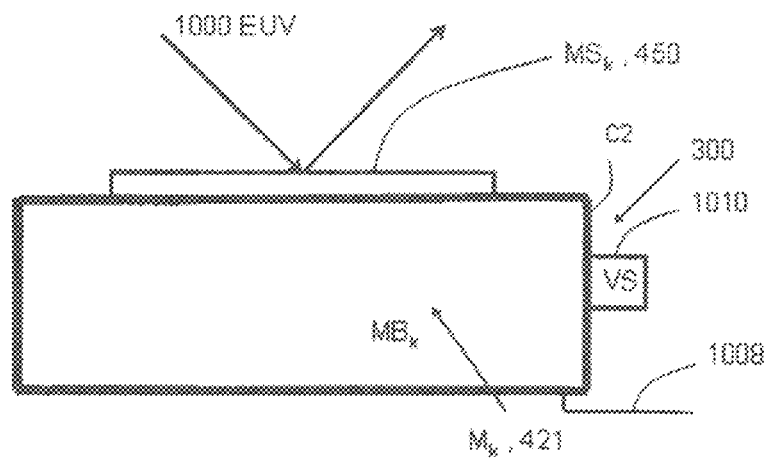
FIG. 12C schematically shows a reflective optical element or a mirror $M_k$, 421 which is at least partly coated with a coating C2 on its surface to make the mirror heatable. The coating C2 is selected such that it will have a certain electrical resistance.

FIG. 12C schematically shows a further embodiment of the present invention in which a reflective optical element or a mirror $M_k$, 421 is at least partly coated with a coating C2 on its surface to make the mirror heatable. In accordance with this embodiment the coating C2 differ from the reflective surface $MS_k$, 450 which may comprise also a coating in the form of a multilayer coating to reflect the EUV light 1000. The coating C2 is selected such that it will have a certain electrical resistance why it is called resistive coating C2. If in the resistive coating C2 an electrical current is generated then energy is produced which is transferred as a thermal energy to the reflective element or mirror $M_k$ which heats up. In this way the temperature of the reflective element or mirror $M_k$, 421 can be controlled. In this embodiment the heater or tempering means 300 comprises the resistive coating C2 and a voltage source VS which is connected to the coating C2. According to this embodiment of the invention the resistive coating C2 may cover the surface of the body $M_k$. Preferably there is no resistive coating C2 between the reflective surface $MS_k$, 450 and the body $MB_k$. Alternative, only a part or several parts of the surface of the body are coated with the resistive coating C2. These parts are selected such that a homogenous temperature distribution in the body and/or on the reflective surface can be achieved. This will minimize the aberration of the reflective element or of the mirror as in the embodiments described above. The electrical current in the resistive coating C2 can be generated by an electrical voltage. For this reason a voltage source VS is connected to the resistive coating C2 of the optical element $M_k$, 421. This can be done by cable 1008. Alternative or in addition the voltage source VS is mounted on the body as shown by numeral 1010. If the voltage source is mounted on the body $MB_k$ there is also no mechanical connection of the heater or tempering means 300, which is formed by the coating C2, to a support structure as it is if a cable or wires 1008 are used. Advantageously then there will be no forces or moments transferred from the cable or the wires to the mirror or reflective optical element $M_k$, 421.

In further embodiments of the present invention in accordance to an embodiment as described in FIG. 12C the reflective element or mirror of FIG. 12C can be used together with the tempering means or heater 300 of the embodiment of FIG. 10 and/or with the cooler 350 as described. In addition or as an alternative, also the pressure control as described in connection with FIG. 11 can be used together with the embodiments of FIG. 12C. In addition the embodiments of FIGS. 12B and 12C may be combined, e.g. by using the coating C for the reflection of IR light and as a resistive coating C2. As an alternative the IR reflection coating C (of FIG. 12B) may be covered with a resistive coating C2 which is heated by a voltage source VR as described in FIG. 12C. Again, all these embodiments advantageously can be used in an EUV projection lens, especially in one as described above in accordance to this invention, preferably in the first, second and third to sixth projection lens according to this invention to reduce thermal induced optical aberration.

Due to the advantages which are described in connection with the embodiments of a projection lens with a mirror or reflective optical element as described in connection with FIG. 12C, the present invention also relates to a seventh projection lens and to a mirror used therein.

The mirror according to the present invention in connection with FIG. 12C comprises a body $MB_k$ and a reflective surface $MS_k$. Further, the mirror comprises a material with a temperature dependent coefficient of thermal expansion which is zero at a zero cross temperature $T_{0k}$, and the body $MB_k$ is at least partly coated with a resistive coating C2, wherein the resistive coating C2 has an electrical resistance suitable to heat the body by electrical resistive heating. Further, the mirror is adapted for a projection lens of an EUV-lithographic projection exposure system for projecting an object field on a reticle onto an image field on a substrate if the projection lens is exposed with an exposure power of EUV light with a wavelength in a wavelength range of less than 50 nm. Preferably the resistive heating is between 0.01 W and 1 W. Further, the coating C2 is connected to a voltage source VS. The voltage source preferably is attached to the mirror body $MB_k$, or the voltage source is electrically connected to the mirror body $MB_k$ by a wire 1008.

In a further embodiment of the mirror as described in connection with FIG. 12C the coating C2 of the mirror covers the mirror body $MB_k$ except in the area of the reflective surface $MS_k$. Further, advantageously the body $MB_k$ of the optical element $M_k$ is semitransparent to an IR radiation and the resistive coating C2 is coated on a reflective coating C coated on or on almost the entire surface of the body $MB_k$. Thus a mirror with the features as described in connection with FIG. 12B can be achieved. For this reason, preferably the reflective coating C reflects IR radiation inside the body $MB_k$. In a further preferred embodiment of the mirror the mirror body $MB_k$ comprises a surface area 1004, 1006 which is not coated with the coatings C and C2, or it comprises a surface area 1004, 1006 with a coating which is semitransparent to the IR radiation. These embodiments of the mirror have the advantage that an IR radiation can be coupled into the mirror body $MB_k$ at these surface areas 1004, 1006. The surface area 1004, 1006 is preferably arranged on the side of the body $MB_k$ with the reflective surface $MS_k$ and optionally the surface area 1004, 1006 surrounds the reflective surface $MS_k$.

In a further preferred embodiment of the mirror as described in connection with FIG. 12C the surface area 1004, 1006 comprises a surface roughness to scatter an IR radiation into the body, or the surface area comprises a diffractive structure to distribute an IR radiation within the body $MB_k$ by diffraction. Further, the resistive coating C2 preferably comprises a metal and also preferably the reflective and the resistive coating C, C2 comprise the same metal.

As mentioned above the present invention also relates to a seventh projection lens to make use of the advantages as described in connection with FIG. 12C. The seventh projection lens of an EUV-lithographic projection exposure system comprises a plurality of reflective optical elements $M_i$ which comprises a body $MB_i$ and a reflective surface $MS_i$ for projecting an object field on a reticle onto an image field on a substrate if the projection lens is exposed with an exposure power of EUV light with a wavelength in a wavelength range of less than 50 nm. The EUV light is reflected from the reticle while the reticle is illuminated by an illumination system of the EUV-lithographic projection exposure system. In addition at least one reflective optical element $M_k$ comprises the features of the above described embodiments of the mirror of the present invention in connection with FIG. 12C. Further, the optical element $M_k$ is optionally connected to an actuator for its translational movement. In a further embodiment the seventh projection lens comprises a cooler 350 which is located on a side of the body $MB_k$ of the at least one optical element $M_k$, wherein the side is opposite to its reflective surface $MS_k$. Optionally a distance of the cooler 350 to the at least one reflective optical element $M_k$ is adjustable for the control of the heat transfer between these elements.

A further embodiment of the seventh projection lens according to this invention comprises a pressure control system for the control of the pressure $\Delta p$ within a surrounding of the at least one reflective optical element $M_k$, which comprises the features of the above described embodiments of the mirror of the present invention in connection with FIG. 12C. Further, the pressure control system optionally comprises a gas inlet and/or a gas outlet nearby the at least one optical element $M_k$.

In a further embodiment of the seventh projection lens, the projection lens heats up without heating the resistive coating C2 which is on the body $MB_k$, if the reflective surface $MS_k$ is exposed with EUV light. The EUV light is reflected by the illuminated reticle and comprises a spatial distribution of angular, polarization and intensity in accordance with an illumination setting, resulting in a temperature distribution $\Delta T_k(x,y,z)=(T_k(x,y,z)-T_{Ref})$ of the body $MB_k$ relative to a reference temperature $T_{Ref}$. The temperature distribution $\Delta T_k(x,y,z)=(T_k(x,y,z)-T_{Ref})$ comprises an average and maximum temperature $\Delta T_{kav}$ and $\Delta T_{kmax}$. Further, the zero cross temperature $T_{0k}$ of the mirror body $MB_k$ is selected higher than the maximum of the reference temperature $T_{Ref}$ and the respective average or maximum temperature based on the spatial temperature distribution $\Delta T_k(x,y,z)$ added by the reference temperature $\Delta T_{kav}+T_{ref}$ or $\Delta T_{kmax}+T_{Ref}$, expressed as $T_{0k}>\max(T_{Ref}, \Delta T_{kav}+T_{Ref})$ or $T_{0k}>\max(T_{Ref}, \Delta T_{kmax}+T_{Ref})$. Further also in the seventh projection lens any manufacturing tolerances of the zero cross temperature may be considered. In such an embodiment of the seventh projection lens the material with the zero cross temperature $T_{0k}$ varies regarding its real value of the zero cross temperature due to manufacturing, which results in a manufacturing tolerance $\Delta T_{0k}$ such that the real value is within the interval $T_{0k} \pm \Delta T_{0k}$. In such a case the zero cross temperatures $T_{0k}$ is selected higher than the maximum of the reference temperature $T_{Ref}$ and the respective average or maximum temperature based on the spatial temperature distribution $\Delta T_k(x,y,z)$ added by the reference temperature ($\Delta T_{kav} + T_{Ref}$ or $\Delta T_{kmax} + T_{Ref}$). This maximum is additionally increased by the absolute value of the manufacturing tolerance $\Delta T_{0k}$, expressed as $T_{0k} > \max(T_{Ref}, \Delta T_{kav} + T_{Ref}) + |\Delta T_k|$, $T_{0k} > \max(T_{Ref}, \Delta T_{kmax} + T_{Ref}) + |\Delta T_{0k}|$.

In a preferred embodiment of the seventh projection lens (and its various embodiments) the temperature $T_k$ of the optical element $M_k$ is controlled to its value by heating the resistive coating C2 with a first electrical power of the voltage source at a time before the projection lens is subjected to the exposure power of the EUV light. Further, during the time when subjecting the projection lens to the exposure power of the EUV light the electrical power for heating the resistive coating C2 preferably is less than the first electrical power.

Figure 12D:
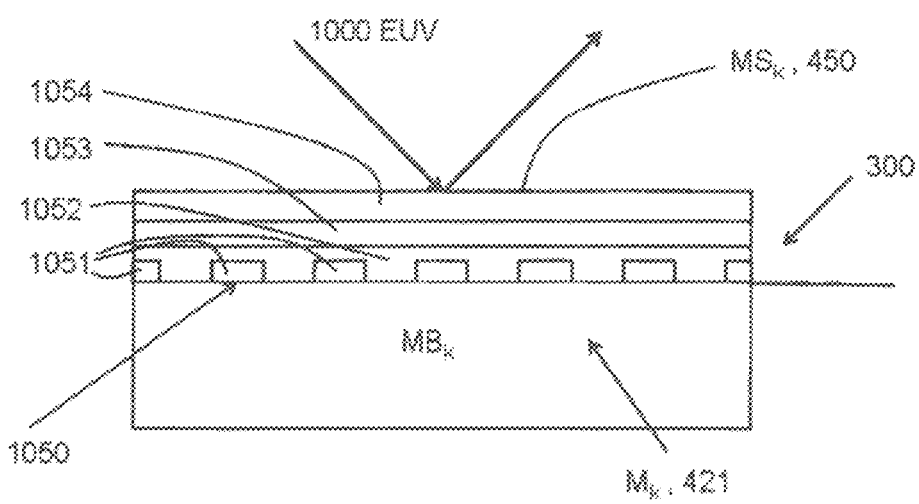
FIG. 12D schematically shows a reflective optical element or a mirror $M_k$, 421 which is at least partly heated by a multi-zone wire grid 1050 which is arranged nearby the reflective surface $MS_k$.

FIG. 12D schematically shows a further embodiment of the present invention in which a reflective optical element or a mirror $M_k$, 421 is at least partly heated by a multi-zone wire grid 1050 which is arranged nearby the reflective surface $MS_k$. Such a reflective element or mirror can be manufactured with a process which comprises the following essential steps:

1. Preferably as a body material $MB_k$ a material with a high zero cross temperature $T_{0k}$ is chosen as used e.g. in at least one of the embodiments described in this description. As an example, at least one zero cross temperature of the body material is 30° C. or above.

2. The wire grid 1050 is produced on the body material, e.g. by forming a thin restive coating on the surface of the body material $MB_k$ by an electro-plating process. The resistive coating may be or may comprise Invar.

3. Various pattern structures 1051 are etched into the resistive coating which forms the structure of the multi-zone wire grid 1050. This is done by application of known lithographic methods.

4. The various pattern structures 1051 are electrically connected to form a multiplexable integrated circuit.

5. The pattern structures 1051 which forms the electrical circuit are covered by an insulating layer 1052 with a low CTE, like quartz, such that the integrated circuit is fully covered.

6. The surface of the insulating layer 1052 is polished to the surface figure accuracy which is required for the reflective element or mirror $M_k$.

7. The polished insulating layer 1052 is covered with a multi-layer reflective coating 1054, whereby an optional compaction layer 1053 can be between the insulating layer 1052 and the reflective coating 1054 which forms the reflective surface $MS_k$.

In a preferred embodiment of the reflective element or mirror the area which is covered by of the multi-zone wire grid is about 50%, even up to 95% of the area of the reflective surface $MS_k$, as schematically shown in FIG. 12D. Even a higher coverage is preferred. This has the advantage that the heat which is generated along the wires of the wire grid is deposited on a large area of the body material.

The reflective optical element with the wire grid has the advantage that it can be heated without any additional heater 300 as mentioned in the various embodiments above. For example, during the start up of the EUV-lithographic projection exposure system the optical element can be heated up to its zero cross temperature before the EUV projection lens is exposed with the EUV projection beam. This results in the advantages as described in connection with the above second projection lens. The main advantage of the wire grid is that it can control the temperature very close at the reflective surface $MS_k$. If the EUV projection beam has a non-uniform intensity distribution on the reflective surface and as a consequence is heating this surface in a non-uniform way than the wire grid will be controlled e.g. by the control system 200 such to reduce the heating power at locations with large EUV intensity or large EUV absorption, and it will increase the heating power at locations with low or zero EUV absorption. With such a regulation an almost constant temperature profile across the reflective surface of the mirror or reflective optical element can be achieved which results in almost no thermal induced aberration.

Further, the wire grid can also be used to measure the temperature with a spatial resolution which is defined by the grid structure. For the temperature measurement the electrical resistance of the wires is measured which is related to the temperature.

Further, the optical element with the wire grid can be used with other heating and tempering concepts as described herein. For example, the optical element with the wire grid can be combined with a heater and cooler as described with FIG. 10. In this case the wire grid can be used to just control very small temperature variations nearby the reflective surface $MS_k$. Further, the heater 300 of the embodiment as shown in FIG. 10 may be controlled or partially controlled by the wire grid resistance values.

An additional advantage of such a combined system is that the temperature control system can be simpler, because no feed-forward control is necessary. This is because the surface temperature of the reflective surface can be adjusted very quick with the wire grid heater if this heater just controls a small temperature range around the zero cross temperature of the mirror material and if other heaters or heating concepts heat the mirror close to this zero cross temperature.

Due to the advantages which are described in connection with the embodiments of a projection lens with a mirror or reflective optical element as described in connection with FIG. 12D, the present invention also relates to an eight projection lens and to a mirror with the described wire grid 1050 used therein.

As mentioned, the present invention relates to a mirror with a wire grid, the mirror comprises a body $MB_k$ and a reflective surface $MS_k$. Further, the body $MB_k$ comprises a material with a temperature dependent coefficient of thermal expansion which is zero at a zero cross temperature $T_{0k}$, wherein at least a part of the surface of the body $MB_k$ comprises a wire grid 1050 for electrically resistive heating of the body $MB_k$. In addition the mirror is preferably adapted for usage in a projection lens of an EUV-lithographic projection exposure system for projecting an object field on a reticle onto an image field on a substrate if the projection lens is exposed with an exposure power of EUV light with a wavelength in a wavelength range of less than 50 nm. Further, the wire grid 1050 of the mirror is formed by a resistive coating with a coating material and the coating material is selected from the group consisting of: metal, semiconductor material, a material comprising carbon and invar.

Preferably the wire grid 1050 of the mirror comprises a pattern structure 1051 with at least N>1 electrical circuits.

Preferably the pattern structure 1051 comprises at least N+1 electrical connectors to connect the N electrical circuits to an electrical power source to subject the N electrical circuits with an electrical power. Preferably the N electrical circuits can be independently controlled from each other regarding its electrical power to which they are subjected. Further, the heating power of the wire grid 1050 is between 0.01 W and 5 W, preferably between 0.01 W and 1 W. The mirror with the wire grid 1050 is connected to at least one electrical power source. The electrical power source may be attached to the mirror body $MB_k$ or the electrical power source is electrically connecting the mirror body $MB_k$ e.g. by a wire or by wires. Further the electrical power source comprises at least two voltage and/or current sources. In addition the electrical power source may comprise a multiplexer circuit. With the multiplexer circuit the N electrical circuits of the wire grid are sequentially subjected with electrical power from the power source. Further, the mirror with the wire grid in accordance with the present invention comprises an insulating layer 1052, wherein the pattern structure 1051 of the wire grid 1050 is covered by the insulating layer 1052. The insulating layer 1052 comprises a low CTE material. Further, the insulating layer 1052 is polished such to having surface figure data within an accuracy of ±3 nm RMS as required for the reflective surface $MS_k$ of the mirror. To improve the reflectivity of the mirror for EUV light, the reflective surface $MS_k$ of the mirror with the wire grid 1050 comprises a multilayer stack 1054 which is arranged above the insulating layer 1052, or which is arranged above a compaction layer 1053. The compaction layer 1053 is arranged above the insulating layer 1052. Preferably the wire grid 1050 of the mirror covers more than 50% of the area of the reflective surface $MS_k$.

Further, the above described mirror with the wire grid 1050 can be modified such that the mirror comprises also features of the mirrors as described in connection with FIG. 12B and FIG. 12C. As an example, the body $MB_k$ of the mirror is at least partly coated with a resistive coating C2 except in the area of the reflective surface $MS_k$. The resistive coating C2 has an electrical resistance suitable to heat the mirror body $MB_k$ by electrical resistive heating. Alternative or in addition the body $MB_k$ of the optical element $M_k$ is semitransparent to an IR radiation. If so, advantageously the body $MB_k$ of the mirror comprising a reflective coating C coated on or on almost the entire surface of the body $MB_k$, wherein the reflective coating C reflects IR radiation inside the body $MB_k$. In a further embodiment of the mirror with the wire grid in accordance to this invention a resistive coating C2 is on the reflective coating C. In this case the mirror can be heated by IR radiation (due to the coating C) and/or by resistive heating due to the coating C2, wherein the area close to the reflective surface $MS_k$ is headed with the wire grid 1051. For the heating of the mirror with IR radiation the mirror advantageously comprises a surface area 1004, 1006 which is not coated with the reflective coating C and the resistive coating C2, or it comprises a surface area 1004, 1006 with a coating which is semitransparent to the IR radiation. This surface area 1004, 1006 advantageously can be used for the coupling in of an IR radiation into the body $MB_k$, wherein the IR radiation contributes to the heating of the mirror. Preferably the mirror with the reflective coating C or the resistive coating C2 comprises a metal in the coating layer, preferably the metal is the same for the reflective and the resistive coating C, C2, if both coatings are applied. Further, the surface area 1004, 1006, for coupling in an IR radiation into the body $MB_k$, is arranged on the side of the body $MB_k$ with the reflective surface $MS_k$, or on a the surface area 1004, 1006 which surrounds the reflective surface $MS_k$. Such a surface area 1004, 1006 advantageously may comprise a surface roughness to scatter the IR radiation into the body, or the surface area 1004, 1006 may comprises a diffractive structure to distribute the IR radiation within the body $MB_k$ by diffraction.

As mentioned above the present invention also relates to a eighth projection lens to make use of the advantages as described in connection with FIG. 12D and the advantages of the mirror which comprises a wire grid 1050 and its various embodiments as discussed above.

In a first embodiment of the eighth projection lens of an EUV-lithographic projection exposure system, comprises a plurality of reflective optical elements M. Each reflective optical elements $M_i$ comprises a body $MB_i$ and a reflective surface $MS_i$ for projecting an object field on a reticle onto an image field on a substrate if the projection lens is exposed with an exposure power of EUV light with a wavelength in a wavelength range of less than 50 nm. The EUV light is reflected from the reticle while the reticle is illuminated by an illumination system of the EUV-lithographic projection exposure system. Further, the eighth projection lens comprises at least one reflective optical element $M_k$ which comprises the features of the mirror comprising the wire grid 1050 in accordance to one of the above described embodiments of this mirror. Further, since one reflective optical element $M_k$ with the features of the mirror with the wire grid 1050 is heatable, it is advantageous to connect the optical element $M_k$ to an actuator for its translational movement. Further, in an embodiment of the eighth projection lens the lens comprises a cooler 350 or a first tempering element 300 which is located on a side of the body $MB_k$ of the at least one optical element $M_k$ which is opposite to its reflective surface $MS_k$. Optionally a distance of the cooler 350 or the first tempering element 300 to the at least one reflective optical element $M_k$ is adjustable for the control of the heat transfer between these elements. In a further embodiment of the eighth projection lens the lens comprises a pressure control system for the control of the pressure Δp within a surrounding of the at least one reflective optical element $M_k$. Preferably the pressure control system comprises a gas inlet and/or a gas outlet nearby the at least one optical element $M_k$.

In a further embodiment the eighth projection lens comprises a material selection such that without heating the wire grid 1050 on the body $MB_k$, the exposure of the reflective surface $MS_k$ with EUV light, which is reflected by the illuminated reticle and which comprises a spatial distribution of angular, polarization and intensity in accordance with an illumination setting, results in a temperature distribution $\Delta T_k(x,y,z) = (T_k(x,y,z) - T_{Ref})$ of the body $MB_k$ with the temperature $T_k(x,y,z)$ relative to a reference temperature $T_{Ref}$. The temperature distribution $\Delta T_k(x,y,z) = (T_k(x,y,z) - T_{Ref})$ comprises an average and maximum temperature $\Delta T_{kav}$ and $\Delta T_{kmax}$. Further the zero cross temperature $T_{0k}$ of the body $MB_k$ is selected higher than the maximum of the reference temperature $T_{Ref}$ and the respective average or maximum temperature based on the spatial temperature distribution $\Delta T_k(x,y,z)$ added by the reference temperature $(\Delta T_{kav} + T_{ref}$ or $\Delta T_{kmax} + T_{Ref})$, expressed as $T_{0k} > \max(T_{Ref}, \Delta T_{kav} + T_{Ref})$ or $T_{0k} > \max(T_{Ref}, \Delta T_{kmax} + T_{Ref})$.

Usually the material with the zero cross temperature $T_{0k}$ varies regarding its real value of the zero cross temperature due to manufacturing issues. For this reason a further preferred embodiment of the eighth projection lens considers that the material with the zero cross temperature $T_{0k}$ varies regarding its real value of the zero cross temperature due to manufacturing, which result in a manufacturing tolerance $\Delta T_{0k}$ such that the real value is within the interval $T_{0k} \pm \Delta T_{0k}$. In this embodiment the zero cross temperatures $T_{0k}$ is selected higher than the maximum of the reference temperature $T_{Ref}$ and the respective average or maximum temperature based on the spatial temperature distribution $\Delta T_k(x,y,z)$ added by the reference temperature ($\Delta T_{kav} + T_{Ref}$ or $\Delta T_{kmax} + T_{Ref}$), and the maximum is further increased by the absolute value of the manufacturing tolerance $\Delta T_{0k}$, expressed as $T_{0k} > \max(T_{Ref}, \Delta T_{kav} + T_{Ref}) + |\Delta T_{0k}|$, $T_{0k} > \max(T_{Ref}, \Delta T_{kmax} + T_{Ref}) + |\Delta T_{0k}|$.

In a further embodiment of the eighth projection lens the temperature $T_k$ of the optical element $M_k$ is controlled to its value by heating the wire grid 1050 with a first electrical power of the electrical power source at a time before the projection lens is subjected to the exposure power of the EUV light. Optionally, during the time when subjecting the projection lens to the exposure power of the EUV light, the electrical power for heating the wire grid 1050 is selected less than the first electrical power. Further, the eighth projection lens may comprise a controller for controlling the electrical power to which the wire grid 1050 is subjected, or for determining a resistance value of the wire grid 1050, or a resistance value of at least one of the electrical circuits of the pattern structure 1051. Further, optionally the controller controls the temperature of the first tempering element 300 or the cooler 350. Further optionally the controller controls a distance of the first tempering element 350 or the cooler 300 to the at least one reflective optical element $M_k$, or the controller controls the pressure $\Delta p$ within the surrounding of the optical element $M_k$. In general the control is based on a parameter selected from the group consisting of: temperature, resistance value of the wire grid 1050 or the resistance value of at least one electrical circuit of the pattern structure 1051 of the wire grid 1050, time, a parameter which directly or indirectly influence the temperature of the optical element $M_k$, an illumination setting, a change of the exposure power of the EUV light, a change of the reticle, thermally or mechanically induced optical aberration data of the optical element $M_k$ or the projection lens and an output parameter from a model. Further, the controller preferably controls the temperature of the reflective surface $MS_k$, or the body $MB_k$ of the mirror $M_k$ to the zero cross temperature $T_{0k}$. In a further embodiment of the eighth projection lens the zero cross temperature $T_{0k}$ is selected lower than a reference temperature $T_{Ref}$ or it is selected such that it is at least 6 K higher than a reference temperature $T_{Ref}$.

FIG. 13 schematically shows several further embodiments of heaters or tempering means 300 in relation with a reflective element or mirror $M_k$, 421 in accordance with the present invention. Also with these embodiments the temperature of the reflective element or mirror $M_k$, 421 can be controlled to an operation temperature, averaged temperature or zero cross temperature $T_{avk}$, $T_{0k}$ according to the above teachings, especially to reduce any optical aberration caused by thermal effects. The various embodiments of the heater or tempering means 300 which will be described below can be used alone or in any combination to control the mentioned temperatures or the aberration of the reflective optical element or mirror.

The mirror e.g. 421 (like the ones shown in FIG. 4 and FIG. 5) or a reflective element $M_k$ is mounted to a support element 480 which is connected to a housing structure 481. The mounting elements and support means which support or suspend the mirror or the reflective optical element are not shown. These can be made as e.g. described in FIG. 4 with the reference numerals 451, 461, 471. Further, as described in the embodiment of FIG. 10 and FIG. 11 a cooler 350 can be used as an option to protect the support element 480 and/or the housing structure 481 (which can be temperature sensitive elements). As a further option also the pressure $\Delta p$ of the surrounding of the mirror 421 or the reflective optical element may be controlled to adjust the thermal resistance of the gas, as described with FIG. 11. If the body $MB_k$ of the reflective element or mirror $M_k$, 421 comprises a material with a temperature dependent CTE(T) which comprises at least one zero cross temperature $T_0$, like e.g. Zerodur® or ULE®, and if this material is transparent to light of a certain wavelength like IR light, then the body may be heated with such light as it was described in connection with FIG. 12A and FIG. 12B. This kind of heating has the advantage that the heat is not only deposited on the surface of the body $MB_k$ but it is also deposited inside the body.

As sources for IR light, e.g. light emitting diodes (LEDs) 1302 may be used. The usage of LEDs have the advantage that they easily can be arranged about side by side in at least one dimension, to form an array-like arrangement as it was already mention in the context of the Peltier elements of FIG. 10. Further, a suitable optical arrangement can be used to configure the IR radiation which is emitted from the LEDs in such a way that it can be coupled into the reflective element or the mirror $M_k$, 421 under various conditions. As an example the optical arrangement 1304 is such that the IR light from LED is collected and made about parallel. This has the advantage that a defined area of the surface of the body $MB_k$ is illuminated with IR light. Optionally this surface area can be adjusted in diameter, depending on the number of LEDs which are in operation. If such LEDs with such an optical arrangement are forming a grid to illuminate the body $MB_k$ in a grid- or matrix-like form. The grid-like form has the advantage that IR energy is deposited as a function of the grid-coordinates which result in a much defined spatial temperature distribution $T(x,y)$ as a function of x and y. As a further option, the optical arrangement 1306 of the IR source, e.g. the lenses in front of the LEDs, may be adjustable to generate a focus length and/or vary the focus length 1307. With a focused IR light the body can be heated at a very local point inside. With this feature the spatial temperature distribution inside the body can be adjusted in x-, y- and z-direction. If the direction of the IR light can be also adjusted by tilting the IR beam around at least one axis, preferably around the x- and the y-axis, then IR light of several IR beams can be focused in a narrow region within the body $MB_k$. This advantageously can be used to homogenize a temperature distribution $T(x,y,z)$ of the body which results from e.g. a certain reticle or illumination setting. In a preferred embodiment the focus length 1309 is adjusted by the optical arrangement 1308 in such a way that it is very close to the reflective surface $MS_k$. In addition an absorption layer (not shown) may be arranged below the reflective surface which absorbs the IR light. In this case the energy of the IR light is deposited very close to the reflective surface $MS_k$.

As an alternative to the above described optical arrangement arrangements optical fibers 1310 may be used to transfer the IR light from the source (e.g. IR LEDs or an IR Laser) to close to the surface of the body $MB_k$. By the usage of the fibers the IR light of one IR source can be distributed also in a grid-like manner. A further alternative is to use a light guiding rod 1314 to transfer the IR light from the IR source to the body.

As a further alternative an IR light source 1312 (e.g. IR LEDs, IR-Laser) is used with a mirror 1313 which reflects the IR light onto the surface of the body $MB_k$. Preferably the mirror can be tilted around at least one axis, better about two axes like the x- and the y-axis. With such an embodiment the IR light can be distributed over the body. This can be done e.g. by a scanning or by a raster process.

In addition the body $MB_k$ of the reflective element or the mirror itself may comprise recesses 1315 in which the IR light is coupled in. In general the surfaces or surface areas in which the IR light is coupled into the body may be or may comprise prepared surface areas with e.g. a defined surface roughness or a diffractive structure on it. Further, the recesses may comprise surface forms like spheres to improve the incidence of the IR radiation into the body. Instead of recesses also protrusions or projections of the body material can be chosen, which all may comprise a surface curvature, to achieve a determined spatial distribution of the IR radiation within the body $M_k$.

For the embodiments of FIG. 13 also a reflective coating on the mirror body may be used to increase the absorbed IR power. For this reason also the features of the embodiment of FIG. 12B can be applied. Further, the heater 300 of the embodiments in accordance of FIG. 13 can be integrated into the cooler 350. In addition, the wavelength of the IR radiation can be controlled to control the amount of absorption within a defined thickness of the body material. For Zerodur® the wavelength may vary from about 400 nm to about 800 nm. As it can be seen from FIG. 12A, in this wavelength range the absorption strongly depends on the used wavelength.

Due to the instantaneous deposition of the IR power inside the body of the reflective element or mirror in a spatially controlled manner, the heater or tempering means 300, as described in connection with FIG. 13, are suitable to control the operation temperature of the reflective element or mirror inside a projection lens in such a way that the thermal induced aberration is minimized in the steady state of the lens and during the warm-up time of the mirror. This time can be significantly reduced due to the instantaneous heating effect of the IR heating.

Further, with the IR heating of the body $MB_k$ of the k-th reflective optical element or the mirror $M_k$ of an EUV projection lens, as shown in connection with FIG. 12B and FIG. 13 as an example, it is possible to heat this body to the at least one of its zero cross temperatures very fast. Further, with such a heating the spatial temperature distribution within the body and such along its reflective surface $MS_k$ can be controlled in at least two dimensions, preferably in all three spatial dimensions. This means that the temperature is controllable as a function of the x-, y- and z-coordinate of the body $MB_k$. Regarding the control now reference is made again to FIG. 6. With such heaters as designated with 630 in FIG. 6 an EUV projection lens 20 can comprise at least one reflective element or mirror $M_k$, like mirror 26, which comprises a body $MB_k$ with comprises a material with a temperature dependent CTE(T) which has at least one zero cross temperature $T_{0k}$. This zero cross temperature $T_{0k}$ is selected such that it is higher than the expected average temperature $\Delta T_{avk}+T_{Ref}$ of the element or mirror $M_k$ if the projection lens 20 is exposed with the maximum EUV exposure power, coming from the reticle M. The zero cross temperature is even selected higher that the respective maximum temperature of all the expected temperature distributions T(x,y,z) which may occur during the exposure with the EUV exposure power (see for example FIG. 7). These average and maximum temperatures $\Delta T_{avk}$, $\Delta T_{kmax}$ also consider potential variations regarding the reticle and regarding the illumination setting. Further, also any variations of the zero cross temperatures, caused by the manufacturing like manufacturing tolerances $\Delta T_{0k}$, may be considered in a way that such tolerances are added to the these average or maximum temperatures $\Delta T_{avk}$, $\Delta T_{kmax}$ before the material selection. Then a material is selected such that its zero cross temperature is even higher than this temperature, expressed as $T_{0k}>\Delta T_{kmax}+T_{Ref}+|\Delta T_{0k}|$ or $T_{0k}>\Delta T_{avk}+T_{Ref}+|\Delta T_{0k}|$. With the application of the mentioned IR heaters (or the other heaters described in this specification) it is always possible to heat the element or mirror $M_k$ to the real zero cross temperature. A control unit 620 (FIG. 6) controls the temperature of this element $M_k$ (like mirror 26) preferably such that the thermal induced aberration or imaging errors 622 of the projection lens (or the element or mirror $M_k$) becomes to a minimum during the exposure of the lens 20 with the EUV exposure beam 4 which propagates from the reticle M to the wafer W. As an alternative the control unit 620 controls the temperature such that the spatial temperature distribution 621 on the reflective element or mirror $M_k$, 26 becomes homogenous, preferably that this temperature achieves the zero cross temperature $T_{0k}$.

Further, if the zero cross temperature is selected as described above like $T_{0k}>\Delta T_{kmax}+T_{Ref}+|\Delta T_{0k}|$ or $T_{0k}>\Delta T_{avk}+T_{Ref}+|\Delta T_{0k}|$ then preferably the body $MB_k$ and the reflective surface for the EUV light $MS_k$ is manufactured such that the surface shape or figure achieves the specified accuracy at the zero cross temperature $T_{0k}$. In this case the reflective element or mirror $M_k$ is heated with the mentioned IR heaters 630, or other heaters as already have been described herein, to the zero cross temperature. Preferably this heating is done before the projection lens 20 is subjected to the EUV exposure power. During the exposure of the projection lens 20 with EUV light then the reflective optical element or mirror $M_k$ is heated in addition by the absorbed EUV light. The heater 630 then is controlled by the control unit 620 such that the spatial temperature distribution of the reflective element or mirror $M_k$ remains almost in the same condition as before the EUV light is switched on. Preferably this condition is a constant temperature of the element or mirror $M_k$, 26. As already mentioned, it is not necessary to control the temperature distribution 621 of the element $M_k$, 26 itself, alternative or in addition the aberration 622 can be used as a control parameter, and then the heater 630 is controlled such that the aberration 622 is minimized. To measure the temperature of the element $M_k$ or mirror 26, especially the spatial temperature distribution, or a parameter or parameters which are representative for it, an infrared camera can be used, since the temperature differences due to the absorption of EUV light are in the range of about 1 K up to about 20 K, depending on the mirror 21, 22, 23, 24, 25, 26 of the lens 20 (see. e.g. FIGS. 3A to 3L), the used reticle or mask, the power of the EUV light and the illumination setting. Due to this relatively high temperature difference the sensitivity requirements of the IR camera are not too high.

Alternative or in addition to the measurement of the temperature or the temperature distribution of the optical element $M_k$ or mirror 26, or its aberration 622, as a control parameter also the deformation of the optical element $M_k$ or the mirror 26 (anyone of the mirrors 21, 22, 23, 24, 25, 26 within the lens 20) or a parameter related to the deformation may be used, to control the heater 630, especially a heater 630, 300 as described herein. For a deformation measurement, as an example, an interferometer and/or an encoder system can be used to determine any deformation of the optical element or mirror.

In a further embodiment of the invention, the temperature data (especially the temperature distribution data) and/or the deformation data which result from measurements as described above are used for the calculation of an expected aberration of the optical element or mirror or the lens 20. Then the lens 20 and/or the optical element $M_k$ or the mirror 21, 22, 23, 24, 25, 26 is controlled by at least one heater 630, 300 in such a way that the aberration will be reduced. For such calculations a model is applied why the aberration of the lens 20 is minimized by model based control. The model for the control of the lens 20 may use additional input parameters which are measured in addition to the temperature and/or deformation data of a given preselected mirror or optical element. Such input parameters are e.g. the used reticle or mask, the power of the EUV light, the illumination setting, a gas pressure nearby the optical element or mirror or inside the lens 20, the time for which the lens 20 is exposed by EUV light or any change in position (like e.g. z-position) of a reflective optical element like a mirror 21, 22, 23, 24, 25, or 26 of lens 20. As an output parameter the model may control any heater 630, 300, any position of a reflective optical element like a mirror 21, 22, 23, 24, 25, or 26, the power of the EUV projection light, the illumination setting with which the reticle is illuminated, the gas pressure nearby the optical element or mirror or the gas pressure inside the lens 20 or any actuator which deforms the reflective surface of a mirror 21, 22, 23, 24, 25 or 26 of the lens 20 in a controlled way to reduce the optical aberration. The output parameter or the output parameters are correlated to the input parameter or the input parameters by the model transfer-function. Further, the input parameters of the model may be used for model calibration such that the model is adjusted regarding its transfer-function, meaning that the transfer-function itself depend on the values of the input parameters and/or the output parameters.

Further, in an embodiment of the present invention the temperature data of at least one optical element $M_k$, like a mirror 21, 22, 23, 24, 25, 26 of the lens 20 are accumulated in time. This results in a parameter which represents a measure of the thermal load of the optical element or mirror, which could be even with spatial resolution. Such a thermal load parameter can be used for maintenance control of the lens 20 or the EUV lithographic exposure system. As an example, any degradation of the mirror due to EUV light, like a degradation of the reflective multilayer stack or any compaction effects of the used substrate material, forming the mirror body, may be estimated. Further, the illuminated masks or the used illumination settings may be selected such that the spatially resolved thermal load of the mirror 21, 22, 23, 24, 25, 26 results in a long life time of the projection lens 20, to reduce maintenance costs.

It is understood that the foregoing description is that of the preferred embodiments of the invention and that various changes and modifications may be made thereto without departing from the spirit and scope of the invention as defined in the appended claims.

What is claimed is:

1. A projection lens of an EUV-lithographic projection exposure system, comprising:
    a plurality of reflective optical elements $M_i$, each comprising
    a body $MB_i$ and a reflective surface $MS_i$ for projecting an object field on a reticle onto an image field on a substrate if the projection lens is exposed with an exposure power of EUV light with a wavelength in a wavelength range of less than 50 nm being reflected from the reticle while illuminated by an illumination system of the EUV-lithographic projection exposure system, wherein the lens comprises
    support means for passively or actively supporting at least one optical element $M_k$,
    a pressure control system for the control of the pressure $\Delta p$ within a surrounding of the at least one reflective optical element $M_k$,
    wherein the control is based on a parameter selected from a group consisting of the temperature of the optical element $M_k$, the time, a parameter which directly or indirectly influences the temperature of the optical element $M_k$, an illumination setting, a change of the reticle, thermally or mechanically induced optical aberration data of the optical element $M_k$ or the projection lens and an output parameter from a model,
    the model input comprising data selected from the group consisting of the temperature of the reflective optical element $M_k$, the time, a parameter which directly or indirectly influences the temperature of the optical element $M_k$, an illumination setting, thermally or mechanically induced optical aberration data of the optical element $M_k$ or the projection lens and a change of the reticle,
    the support means comprising a temperature sensitive element selected from a group consisting of linking points, bipod structures, linking elements, support element and housing structure, for passively or actively supporting the at least one optical element $M_k$, wherein the temperature sensitive element is controlled to a predefined temperature by a cooler, and,
    the cooler being spatially arranged between the temperature sensitive element and the at least one optical element Mk.

2. The projection lens according to claim 1, wherein the pressure $\Delta p$ within the surrounding of the at least one optical element $M_k$ is in a range of 0.1 Pa to 10 Pa.

3. The projection lens according to claim 1, wherein the distance between the at least one optical element $M_k$ and the cooler is in a range of 1 mm to 10 mm.

4. The projection lens according to claim 1, wherein the pressure control system comprises at least one of a gas inlet and a gas outlet nearby the at least one reflective optical element $M_k$.

5. The projection lens according to claim 1, wherein the distance of the cooler to the at least one reflective optical element $M_k$ is adjustable to control a heat transfer between these elements.

6. The projection lens according to claim 1, wherein the at least one reflective optical element $M_k$ comprises a material with a temperature dependent coefficient of thermal expansion which is zero at a zero cross temperature $T_{0k}$.

7. The project lens according to claim 6, wherein the zero cross temperature is different from the predefined temperature of the temperature sensitive element.

8. The projection lens according to claim 6, wherein the pressure $\Delta p$, controlled by the control system, is such that the temperature of the at least one optical element $M_k$ is at the zero cross temperature.

9. A projection lens of an EUV-lithographic projection exposure system, comprising
    a plurality of reflective optical elements $M_i$, each comprising
    a body $MB_i$ and a reflective surface $MS_i$ for projecting an object field on a reticle onto an image field on a substrate if the projection lens is exposed with an exposure power of EUV light with a wavelength in a wavelength range of less than 50 nm being reflected from the reticle while illuminated by an illumination system of the EUV-lithographic projection exposure system, wherein the lens comprises support means for passively or actively supporting at least one optical element $M_k$, and, a pressure control system for the control of the pressure $\Delta p$ within a surrounding of the at least one reflective optical element $M_k$, wherein the control is based on a parameter selected from a group including the temperature of the optical element $M_k$, the time, a parameter which directly or indirectly influences the temperature of the optical element $M_k$, an illumination setting, a change of the reticle, thermally or mechanically induced optical aberration data of the optical element $M_k$ or the projection lens and an output parameter from a model, the model input comprising data selected from the group including the temperature of the reflective optical element $M_k$, the time, a parameter which directly or indirectly influences the temperature of the optical element $M_k$, an illumination setting, thermally or mechanically induced optical aberration data of the optical element $M_k$ or the projection lens and a change of the reticle, wherein the support means includes a temperature sensitive element selected from a group including linking points, bipod structures, linking elements, support element and housing structure, for passively or actively supporting the at least one optical element $M_k$, wherein the temperature sensitive element is controlled to a predefined temperature by a cooler, and, wherein the cooler is spatially arranged between the temperature sensitive element and the at least one optical element $M_k$.

* * * * *

UNITED STATES PATENT AND TRADEMARK OFFICE
CERTIFICATE OF CORRECTION

PATENT NO. : 10,684,551 B2
APPLICATION NO. : 16/392220
DATED : June 16, 2020
INVENTOR(S) : N. Baer et al.

Page 1 of 1

It is certified that error appears in the above-identified patent and that said Letters Patent is hereby corrected as shown below:

In Column 2:
Line 40: delete "4 nm" and insert -- $4\pi$ -- therefor.

In Column 9:
Line 30: delete "$M_t$" and insert -- $M_i$ -- therefor.

In Column 16:
Line 7: delete "$T_k = T_{Ref} + 3*(T_{0k}-T_{Ref})/2 - \Delta_{av}$;" and insert -- $T_k = T_{Ref} + 3*(T_{0k} - T_{Ref})/2 - \Delta T_{av}$; -- therefor.

In Column 24:
Line 18: delete "$\Delta_{nav}+T_{Ref}$" and insert -- $\Delta T_{nav}+T_{Ref}$ -- therefor.

In Column 27:
Line 37: delete "$(T_{0n}-T_{0n}) > 6K$." and insert -- $(T_{0m}-T_{0n}) > 6K$. -- therefor.

In Column 31:
Line 3: delete "$(T_{Ref}, \Delta T_{max}+T_{Ref})$." and insert -- $(T_{Ref}, \Delta T_{nmax}+T_{Ref})$. -- therefor.
Line 21: delete "$T^1_{0mn} > \max(T^1_{Ref}, \Delta T_{mav}+T_{Ref})$" and insert -- $T^1_{0mn} > \max(T_{Ref}, \Delta T_{mav}+T_{Ref})$ -- therefor.

In Column 33:
Line 55: delete "$_{max}+\Delta T_{0m}$" and insert -- $_{max}+ |\Delta T_{0m}|$ -- therefor.

Signed and Sealed this
Tenth Day of November, 2020

Andrei Iancu
*Director of the United States Patent and Trademark Office*